United States Patent
Nag et al.

(10) Patent No.: US 11,238,372 B2
(45) Date of Patent: Feb. 1, 2022

(54) SIMULATOR-TRAINING FOR AUTOMATED REINFORCEMENT-LEARNING-BASED APPLICATION-MANAGERS

(71) Applicant: VMware, Inc., Palo Alto, CA (US)

(72) Inventors: Dev Nag, Palo Alto, CA (US); Yanislav Yankov, Palo Alto, CA (US); Dongni Wang, Palo Alto, CA (US); Gregory T. Burk, Colorado Springs, CO (US); Nicholas Mark Grant Stephen, Paris (FR)

(73) Assignee: VMware, Inc., Palo Alto, CA (US)

( * ) Notice: Subject to any disclaimer, the term of this patent is extended or adjusted under 35 U.S.C. 154(b) by 68 days.

(21) Appl. No.: 16/518,845

(22) Filed: Jul. 22, 2019

(65) Prior Publication Data

US 2020/0065704 A1     Feb. 27, 2020

Related U.S. Application Data

(63) Continuation-in-part of application No. 16/261,253, filed on Jan. 29, 2019, now Pat. No. 10,802,864.

(60) Provisional application No. 62/723,388, filed on Aug. 27, 2018.

(51) Int. Cl.
  *G06N 20/00*     (2019.01)
  *G06K 9/62*     (2006.01)
  *G06N 3/02*     (2006.01)
  *G06F 30/20*     (2020.01)

(52) U.S. Cl.
  CPC ............ *G06N 20/00* (2019.01); *G06F 30/20* (2020.01); *G06K 9/6267* (2013.01); *G06N 3/02* (2013.01)

(58) Field of Classification Search
  USPC .......................................................... 718/1
  See application file for complete search history.

(56) References Cited

U.S. PATENT DOCUMENTS

| | | | |
|---|---|---|---|
| 10,327,159 B2 * | 6/2019 | Tan ..................... | H04W 24/02 |
| 10,802,864 B2 * | 10/2020 | Nag ..................... | G06F 9/4843 |
| 2018/0082213 A1 * | 3/2018 | McCord ................ | G06N 7/005 |

(Continued)

FOREIGN PATENT DOCUMENTS

JP     WO2018110305     *    6/2018    ............. G06N 20/00

OTHER PUBLICATIONS

Doya et al., Multiple Model-based reinforcement learning, 2002, MIT Press (Year: 2002).*

*Primary Examiner* — John Q Chavis

(57) ABSTRACT

The current document is directed to methods and systems for simulation-based training of automated reinforcement-learning-based application managers. Simulators are generated from data collected from controlled computing environments controlled and may employ any of a variety of different machine-learning models to learn state-transition and reward models. The current disclosed methods and systems provide facilities for visualizing aspects of the models learned by a simulator and for initializing simulator models using domain information. In addition, the currently disclosed simulators employ weighted differences computed from simulator-generated and training-data state transitions for feedback to the machine-learning models to address various biases and deficiencies of commonly employed difference metrics in the context of training automated reinforcement-learning-based application managers.

20 Claims, 50 Drawing Sheets

(56) References Cited

U.S. PATENT DOCUMENTS

2018/0174038 A1* 6/2018 Jiang .................... G06N 3/08
2019/0138948 A1* 5/2019 Janulewicz ............ G06N 20/00

* cited by examiner

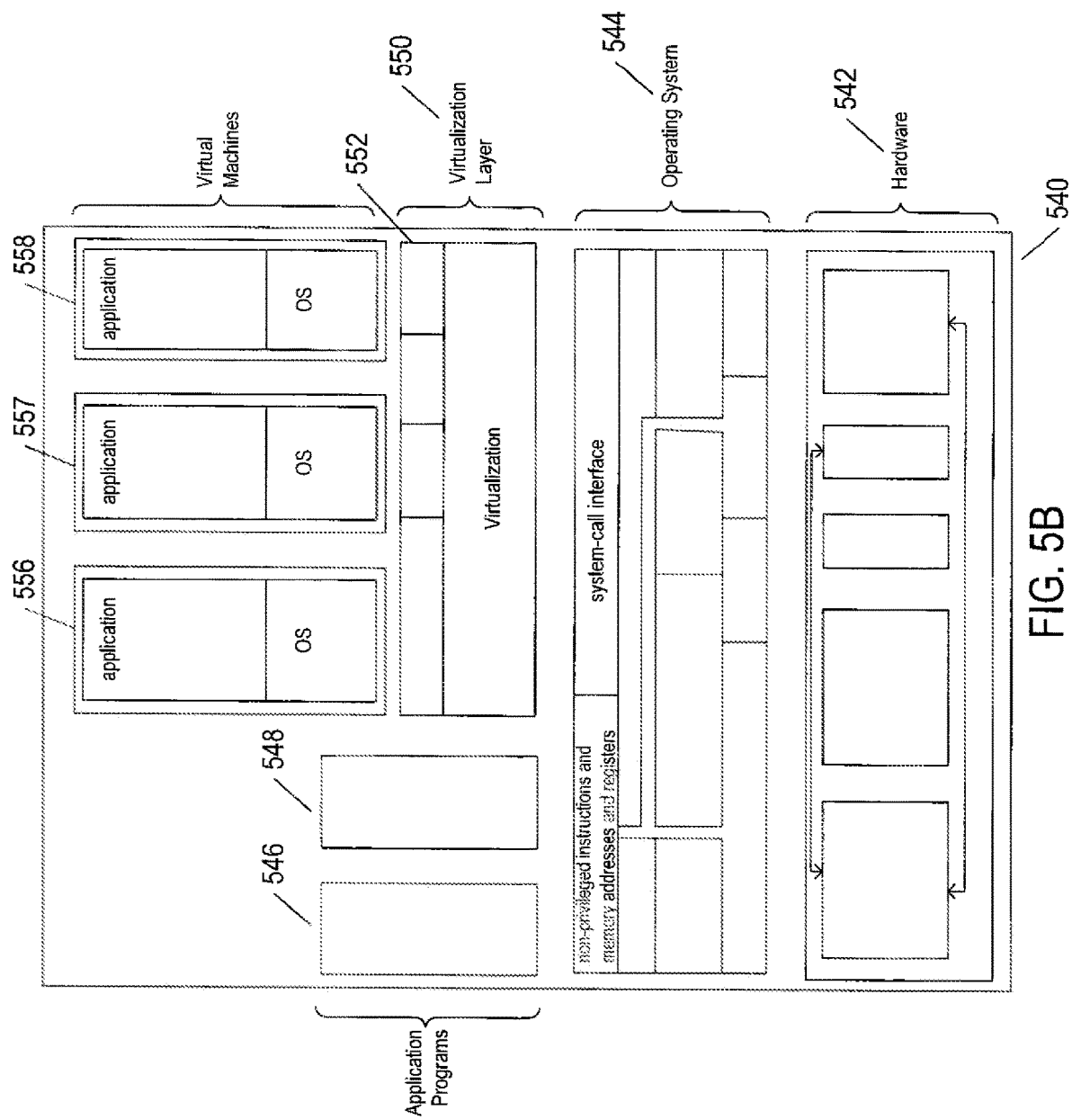

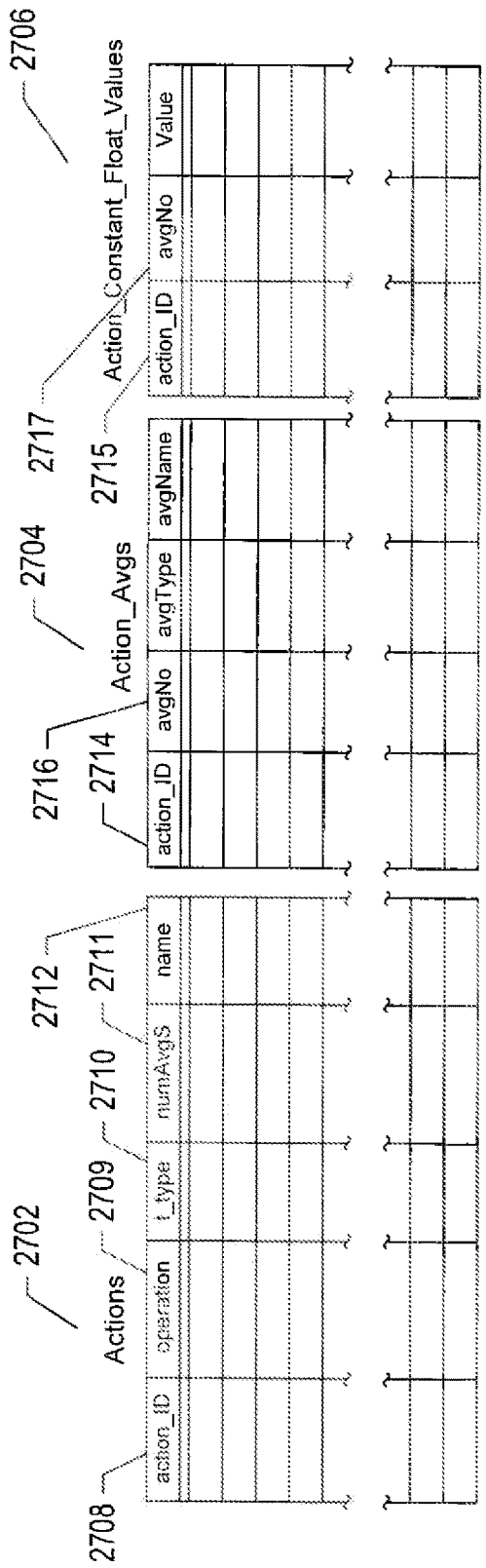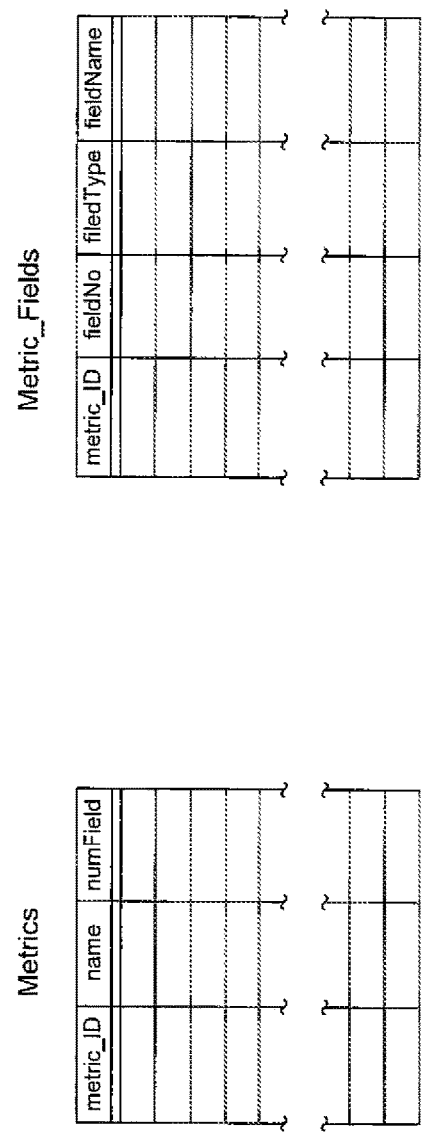
FIG. 27A addVirtualServer ("Rochester", data_center4, , memory:20GB, processors:48, storage:6TB)

— 2730

Actions

| 635 | addServers | DataCenter | 4 | addVirtualServer |

| 635 | 1 | constInteger | number of servers |
| 635 | 1 | constInteger | number of servers |
| 635 | 1 | constInteger | number of servers |
| 635 | 1 | constInteger | number of servers |

| 635 | 1 | 1 |

2732

— 2734

| addServer |
| Rochester |
| 4 |
| 1 |
| 20 |
| 48 |
| 6000 |

→ addServers (1, 20, 48, 6000) sent to "Rochester.4"

— 2736

{635, "Rochester", 4, 20, 48, 6000}

2802 — $V^\pi(s) = E_\pi\{R_t \mid s_t = s\} = E_\pi\{\sum_{k=0}^{\infty} \gamma^k r_{t+k+1} \mid s_t = s\}$ 2804 — $Q^\pi(s,a) = E_\pi\{R_t \mid s_t = s, a_t = a\} = E_\pi\{\sum_{k=0}^{\infty} \gamma^k r_{t+k+1} \mid s_t = s, a_t = a\}$ 2805 — $P_{ss'}^a = \Pr\{s_{t+1} = s' \mid s_t = s, a_t = a\}$ 2806 — $R_{ss'}^a = E\{r_{t+1} \mid s_t = s, a_t = a, s_{t+1} = s'\}$ 2807 — $V^\pi(s) = \sum_a \pi(s,a) \sum_{s'} P_{ss'}[R_{ss'} + \gamma V^\pi(s')]$ 2808 $\begin{cases} V^*(s) = \max_\pi V^\pi(s) \\ Q^*(s,a) = \max_\pi Q^\pi(s,a) \\ Q^*(s,a) = E\{r_{t+1} \gamma V^*(s_{t+1}) \mid s_t = s, a_t = a\} \end{cases}$ 2809 $\begin{cases} \pi(s): r = \text{rand}(); \\ \quad \begin{cases} r < \epsilon, a = \text{avgmax}_{a \in A} Q(s,a) \\ \text{otherwise, randomly select } a \text{ from } A \end{cases} \end{cases}$

FIG. 28

SIMULATOR-TRAINING FOR AUTOMATED REINFORCEMENT-LEARNING-BASED APPLICATION-MANAGERS

CROSS-REFERENCE TO RELATED APPLICATIONS

This application is a continuation-in-part of application Ser. No. 16/261,253, filed Jan. 29, 2019, which claim the benefit of Provisional Application No. 62/723,388, filed Aug. 27, 2018.

TECHNICAL FIELD

The current document is directed to standalone, networked, and distributed computer systems, to system management and, in particular, to methods and systems for simulation-based training of automated reinforcement-learning-based application managers.

BACKGROUND

During the past seven decades, electronic computing has evolved from primitive, vacuum-tube-based computer systems, initially developed during the 1940s, to modern electronic computing systems in which large numbers of multi-processor servers, work stations, and other individual computing systems are networked together with large-capacity data-storage devices and other electronic devices to produce geographically distributed computing systems with hundreds of thousands, millions, or more components that provide enormous computational bandwidths and data-storage capacities. These large, distributed computing systems are made possible by advances in computer networking, distributed operating systems and applications, data-storage appliances, computer hardware, and software technologies. However, despite all of these advances, the rapid increase in the size and complexity of computing systems has been accompanied by numerous scaling issues and technical challenges, including technical challenges associated with communications overheads encountered in parallelizing computational tasks among multiple processors, component failures, and distributed-system management. As new distributed-computing technologies are developed, and as general hardware and software technologies continue to advance, the current trend towards ever-larger and more complex distributed computing systems appears likely to continue well into the future.

As the complexity of distributed computing systems has increased, the management and administration of distributed computing systems has, in turn, become increasingly complex, involving greater computational overheads and significant inefficiencies and deficiencies. In fact, many desired management-and-administration functionalities are becoming sufficiently complex to render traditional approaches to the design and implementation of automated management and administration systems impractical, from a time and cost standpoint, and even from a feasibility standpoint. Therefore, designers and developers of various types of automated management and control systems related to distributed computing systems are seeking alternative design-and-implementation methodologies, including machine-learning-based approaches. The application of machine-learning technologies to the management of complex computational environments is still in early stages, but promises to expand the practically achievable feature sets of automated administration-and-management systems, decrease development costs, and provide a basis for more effective optimization Of course, administration-and-management control systems developed for distributed computer systems can often be applied to administer and manage standalone computer systems and individual, networked computer systems.

SUMMARY

The current document is directed to methods and systems for simulation-based training of automated reinforcement-learning-based application managers. Simulators are generated from data collected from controlled computing environments controlled and may employ any of a variety of different machine-learning models to learn state-transition and reward models. The current disclosed methods and systems provide facilities for visualizing aspects of the models learned by a simulator and for initializing simulator models using domain information. In addition, the currently disclosed simulators employ weighted differences computed from simulator-generated and training-data state transitions for feedback to the machine-learning models to address various biases and deficiencies of commonly employed difference metrics in the context of training automated reinforcement-learning-based application managers.

BRIEF DESCRIPTION OF THE DRAWINGS

FIGS. 5A-B illustrate two types of virtual machine and virtual-machine execution environments.

In FIG. 9, three different physical data centers 902-904 are shown below planes representing the cloud-director layer of abstraction 906-908.

FIGS. 27A-B illustrate one example of a data representation of actions and metrics.

FIG. 28 provides numerous expressions that indicate a generic implementation of several different types of value functions and an $\epsilon$-greedy policy.

DETAILED DESCRIPTION

Figure 1:
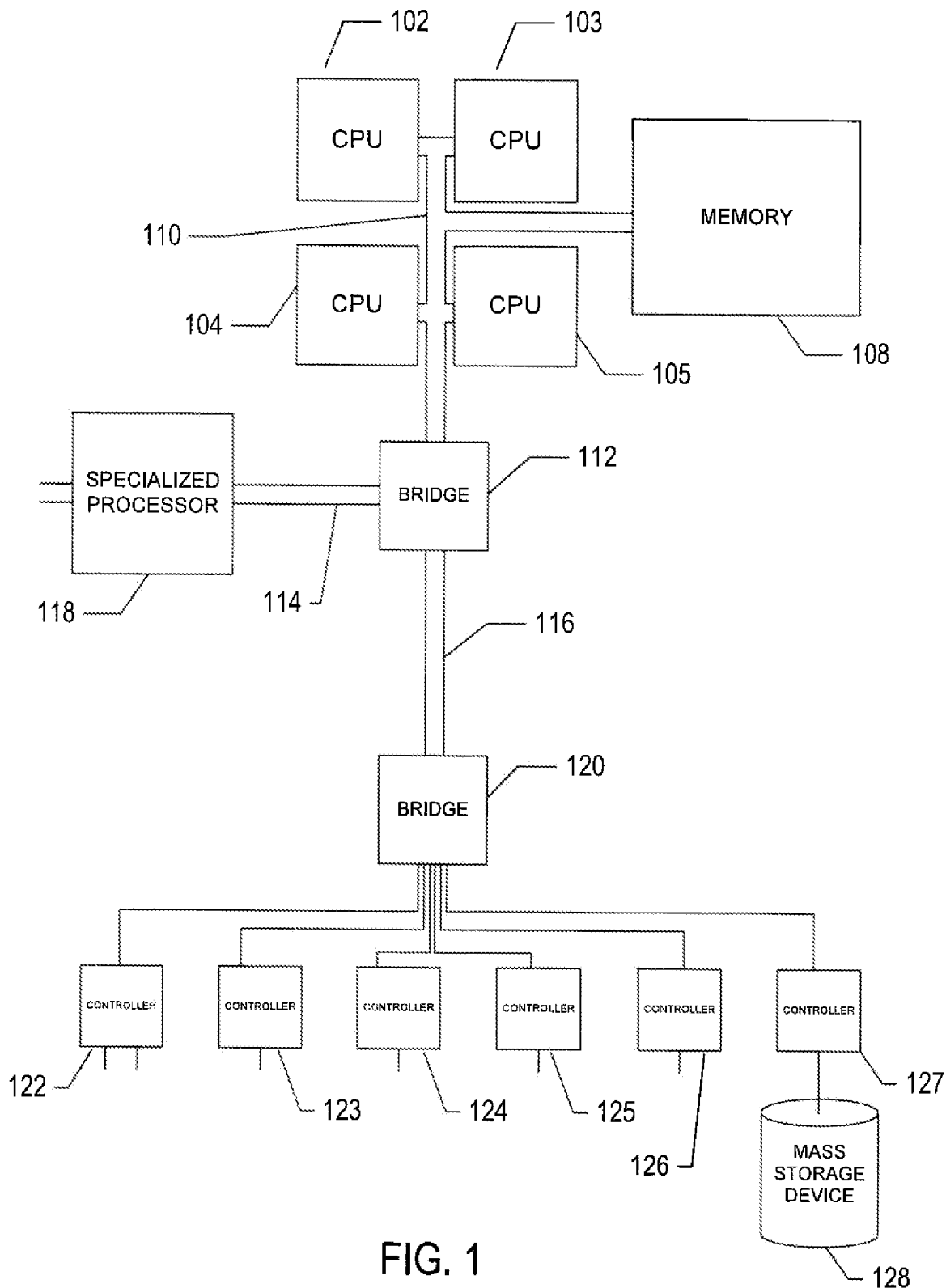
FIG. 1 provides a general architectural diagram for various types of computers.

The current document is directed to simulator-based training of automated reinforcement-learning-based application managers. In a first subsection, below, a detailed description of computer hardware, complex computational systems, and virtualization is provided with reference to FIGS. 1-11. In a second subsection, application management and reinforcement learning are discussed with reference to FIGS. 11-25. In a third subsection, control and learning processes of reinforcement-learning-based application manager are discussed with reference to FIGS. 26-29B. In a fourth subsection, implementations of the currently disclosed simulator-based training of automated reinforcement-learning-based application managers are discussed with reference to FIGS. 30-37E.

Computer Hardware, Complex Computational Systems, Virtualization, and Generation of Status, Informational, and Error Data The term "abstraction" is not, in any way, intended to mean or suggest an abstract idea or concept. Computational abstractions are tangible, physical interfaces that are implemented, ultimately, using physical computer hardware, data-storage devices, and communications systems. Instead, the term "abstraction" refers, in the current discussion, to a logical level of functionality encapsulated within one or more concrete, tangible, physically-implemented computer systems with defined interfaces through which electronically-encoded data is exchanged, process execution launched, and electronic services are provided. Interfaces may include graphical and textual data displayed on physical display devices as well as computer programs and routines that control physical computer processors to carry out various tasks and operations and that are invoked through electronically implemented application programming interfaces ("APIs") and other electronically implemented interfaces. There is a tendency among those unfamiliar with modern technology and science to misinterpret the terms "abstract" and "abstraction," when used to describe certain aspects of modern computing. For example, one frequently encounters assertions that, because a computational system is described in terms of abstractions, functional layers, and interfaces, the computational system is somehow different from a physical machine or device. Such allegations are unfounded. One only needs to disconnect a computer system or group of computer systems from their respective power supplies to appreciate the physical, machine nature of complex computer technologies. One also frequently encounters statements that characterize a computational technology as being "only software," and thus not a machine or device. Software is essentially a sequence of encoded symbols, such as a printout of a computer program or digitally encoded computer instructions sequentially stored in a file on an optical disk or within an electromechanical mass-storage device. Software alone can do nothing. It is only when encoded computer instructions are loaded into an electronic memory within a computer system and executed on a physical processor that so-called "software implemented" functionality is provided. The digitally encoded computer instructions are an essential and physical control component of processor-controlled machines and devices, no less essential and physical than a cam-shaft control system in an internal-combustion engine. Multi-cloud aggregations, cloud-computing services, virtual-machine containers and virtual machines, communications interfaces, and many of the other topics discussed below are tangible, physical components of physical, electro-optical-mechanical computer systems.

FIG. 1 provides a general architectural diagram for various types of computers. Computers that receive, process, and store event messages may be described by the general architectural diagram shown in FIG. 1, for example. The computer system contains one or multiple central processing units ("CPUs") 102-105, one or more electronic memories 108 interconnected with the CPUs by a CPU/memory-subsystem bus 110 or multiple busses, a first bridge 112 that interconnects the CPU/memory-subsystem bus 110 with additional busses 114 and 116, or other types of high-speed interconnection media, including multiple, high-speed serial interconnects. These busses or serial interconnections, in turn, connect the CPUs and memory with specialized processors, such as a graphics processor 118, and with one or more additional bridges 120, which are interconnected with high-speed serial links or with multiple controllers 122-127, such as controller 127, that provide access to various different types of mass-storage devices 128, electronic displays, input devices, and other such components, subcomponents, and computational resources. It should be noted that computer-readable data-storage devices include optical and electromagnetic disks, electronic memories, and other physical data-storage devices. Those familiar with modern science and technology appreciate that electromagnetic radiation and propagating signals do not store data for subsequent retrieval, and can transiently "store" only a byte or less of information per mile, far less information than needed to encode even the simplest of routines.

Of course, there are many different types of computer-system architectures that differ from one another in the number of different memories, including different types of hierarchical cache memories, the number of processors and the connectivity of the processors with other system components, the number of internal communications busses and serial links, and in many other ways. However, computer systems generally execute stored programs by fetching instructions from memory and executing the instructions in one or more processors. Computer systems include general-purpose computer systems, such as personal computers ("PCs"), various types of servers and workstations, and higher-end mainframe computers, but may also include a plethora of various types of special-purpose computing devices, including data-storage systems, communications routers, network nodes, tablet computers, and mobile telephones.

Figure 2:
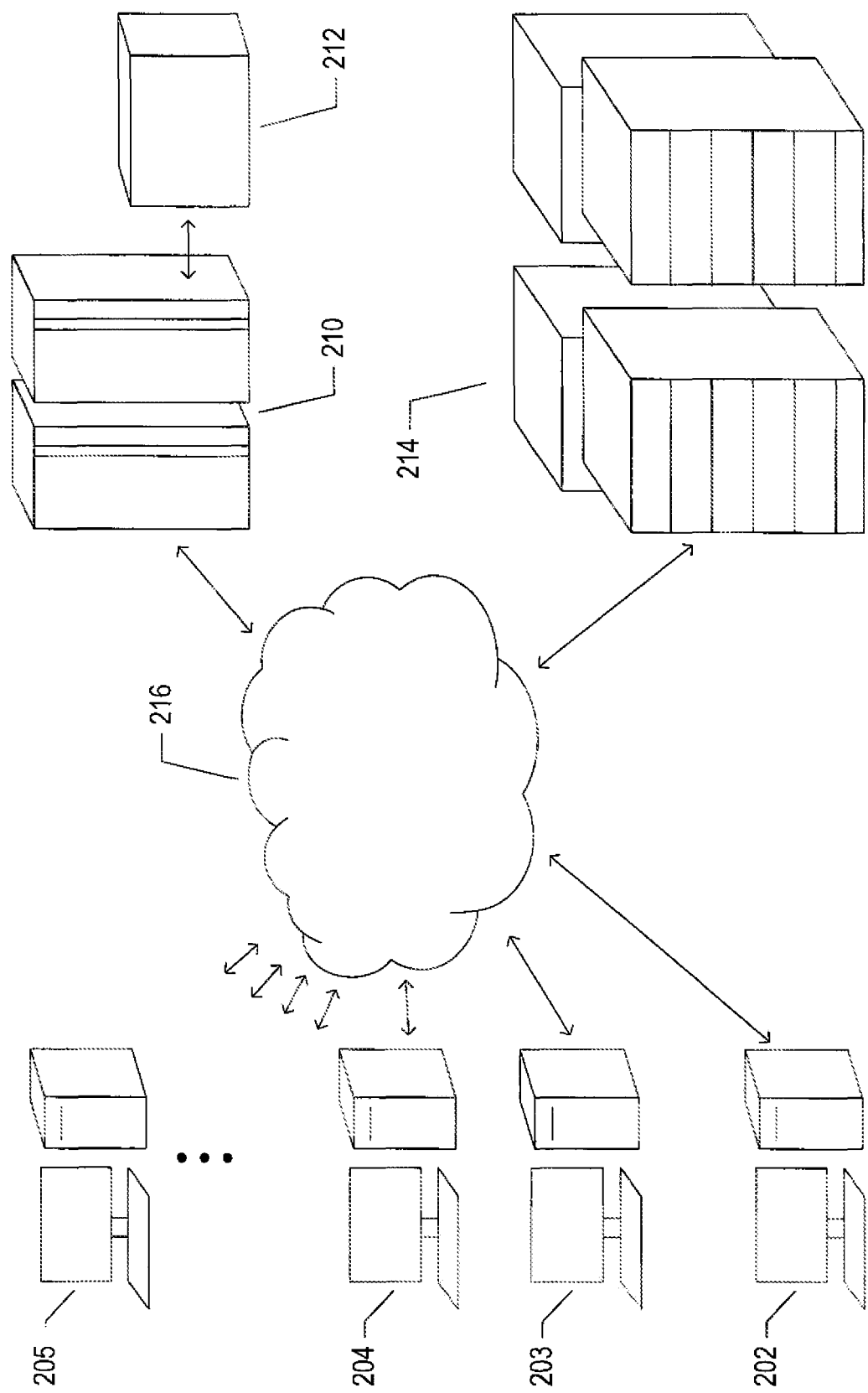
FIG. 2 illustrates an Internet-connected distributed computer system.

FIG. 2 illustrates an Internet-connected distributed computer system. As communications and networking technologies have evolved in capability and accessibility, and as the computational bandwidths, data-storage capacities, and other capabilities and capacities of various types of computer systems have steadily and rapidly increased, much of modern computing now generally involves large distributed systems and computers interconnected by local networks, wide-area networks, wireless communications, and the Internet. FIG. 2 shows a typical distributed system in which a large number of PCs 202-205, a high-end distributed mainframe system 210 with a large data-storage system 212, and a large computer center 214 with large numbers of rack-mounted servers or blade servers all interconnected through various communications and networking systems that together comprise the Internet 216. Such distributed computing systems provide diverse arrays of functionalities. For example, a PC user sitting in a home office may access hundreds of millions of different web sites provided by hundreds of thousands of different web servers throughout the world and may access high-computational-bandwidth computing services from remote computer facilities for running complex computational tasks.

Until recently, computational services were generally provided by computer systems and data centers purchased, configured, managed, and maintained by service-provider organizations. For example, an e-commerce retailer generally purchased, configured, managed, and maintained a data center including numerous web servers, back-end computer systems, and data-storage systems for serving web pages to remote customers, receiving orders through the web-page interface, processing the orders, tracking completed orders, and other myriad different tasks associated with an e-commerce enterprise.

Figure 3:
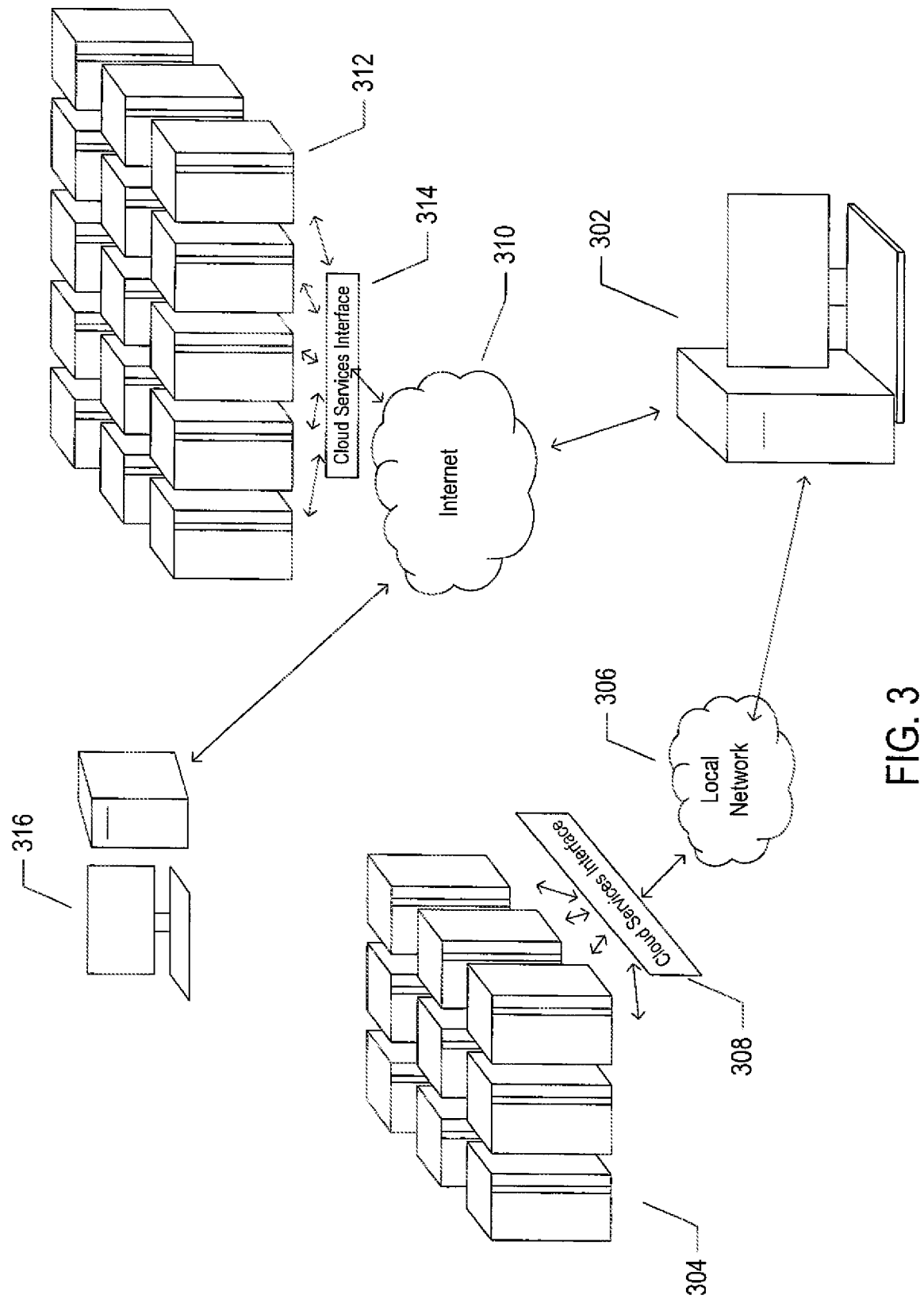
FIG. 3 illustrates cloud computing. In the recently developed cloud-computing paradigm, computing cycles and data-storage facilities are provided to organizations and individuals by cloud-computing providers.

FIG. 3 illustrates cloud computing. In the recently developed cloud-computing paradigm, computing cycles and data-storage facilities are provided to organizations and individuals by cloud-computing providers. In addition, larger organizations may elect to establish private cloud-computing facilities in addition to, or instead of, subscribing to computing services provided by public cloud-computing service providers. In FIG. 3, a system administrator for an organization, using a PC 302, accesses the organization's private cloud 304 through a local network 306 and private-cloud interface 308 and also accesses, through the Internet 310, a public cloud 312 through a public-cloud services interface 314. The administrator can, in either the case of the private cloud 304 or public cloud 312, configure virtual computer systems and even entire virtual data centers and launch execution of application programs on the virtual computer systems and virtual data centers in order to carry out any of many different types of computational tasks. As one example, a small organization may configure and run a virtual data center within a public cloud that executes web servers to provide an e-commerce interface through the public cloud to remote customers of the organization, such as a user viewing the organization's e-commerce web pages on a remote user system 316.

Cloud-computing facilities are intended to provide computational bandwidth and data-storage services much as utility companies provide electrical power and water to consumers. Cloud computing provides enormous advantages to small organizations without the resources to purchase, manage, and maintain in-house data centers. Such organizations can dynamically add and delete virtual computer systems from their virtual data centers within public clouds in order to track computational-bandwidth and data-storage needs, rather than purchasing sufficient computer systems within a physical data center to handle peak computational-bandwidth and data-storage demands. Moreover, small organizations can completely avoid the overhead of maintaining and managing physical computer systems, including hiring and periodically retraining information-technology specialists and continuously paying for operating-system and database-management-system upgrades. Furthermore, cloud-computing interfaces allow for easy and straightforward configuration of virtual computing facilities, flexibility in the types of applications and operating systems that can be configured, and other functionalities that are useful even for owners and administrators of private cloud-computing facilities used by a single organization.

Figure 4:
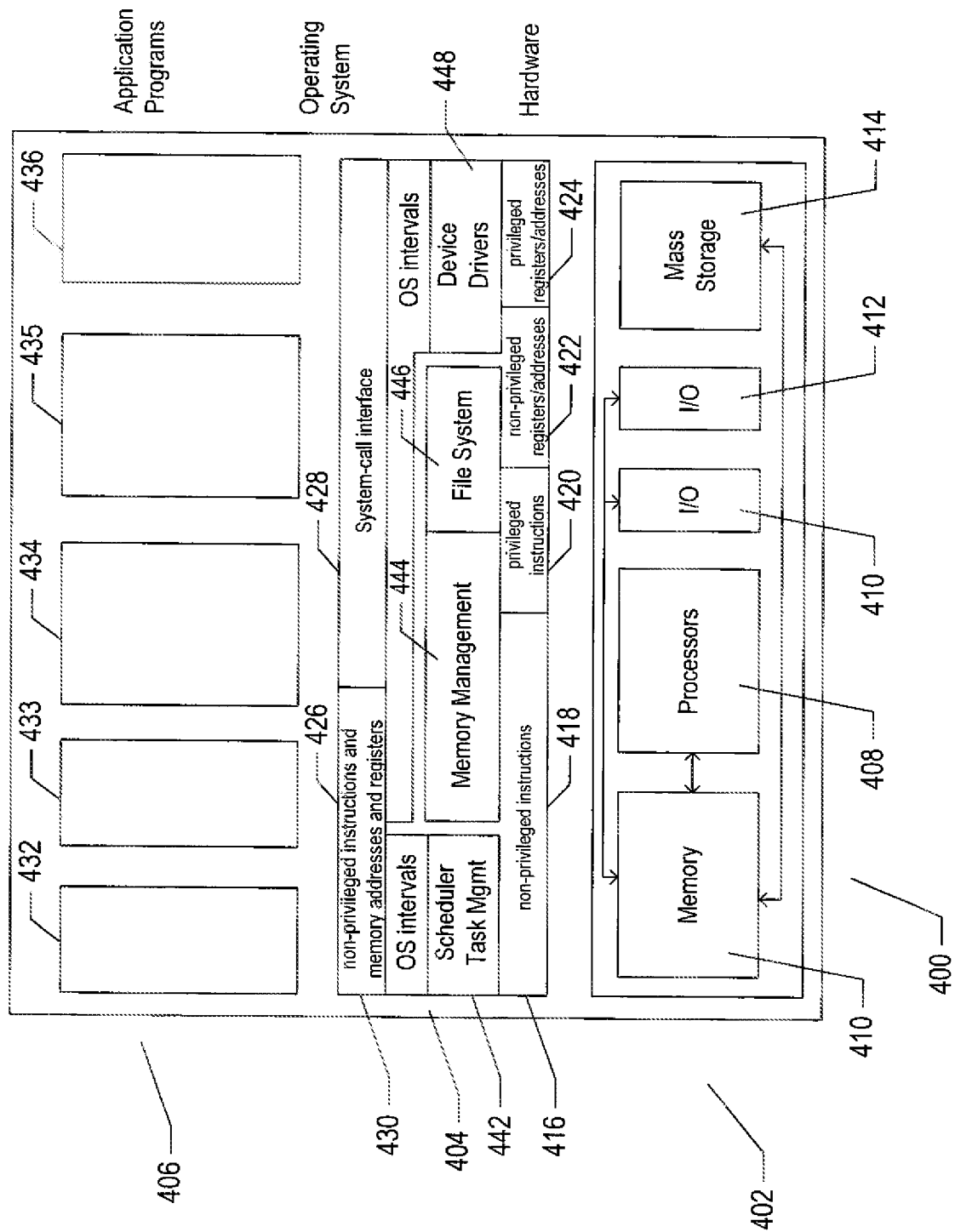
FIG. 4 illustrates generalized hardware and software components of a general-purpose computer system, such as a general-purpose computer system having an architecture similar to that shown in FIG. 1.

FIG. 4 illustrates generalized hardware and software components of a general-purpose computer system, such as a general-purpose computer system having an architecture similar to that shown in FIG. 1. The computer system 400 is often considered to include three fundamental layers: (1) a hardware layer or level 402; (2) an operating-system layer or level 404; and (3) an application-program layer or level 406. The hardware layer 402 includes one or more processors 408, system memory 410, various different types of input-output ("I/O") devices 410 and 412, and mass-storage devices 414. Of course, the hardware level also includes many other components, including power supplies, internal communications links and busses, specialized integrated circuits, many different types of processor-controlled or microprocessor-controlled peripheral devices and controllers, and many other components. The operating system 404 interfaces to the hardware level 402 through a low-level operating system and hardware interface 416 generally comprising a set of non-privileged computer instructions 418, a set of privileged computer instructions 420, a set of non-privileged registers and memory addresses 422, and a set of privileged registers and memory addresses 424. In general, the operating system exposes non-privileged instructions, non-privileged registers, and non-privileged memory addresses 426 and a system-call interface 428 as an operating-system interface 430 to application programs 432-436 that execute within an execution environment provided to the application programs by the operating system. The operating system, alone, accesses the privileged instructions, privileged registers, and privileged memory addresses. By reserving access to privileged instructions, privileged registers, and privileged memory addresses, the operating system can ensure that application programs and other higher-level computational entities cannot interfere with one another's execution and cannot change the overall state of the computer system in ways that could deleteriously impact system operation. The operating system includes many internal components and modules, including a scheduler 442, memory management 444, a file system 446, device drivers 448, and many other components and modules. To a certain degree, modern operating systems provide numerous levels of abstraction above the hardware level, including virtual memory, which provides to each application program and other computational entities a separate, large, linear memory-address space that is mapped by the operating system to various electronic memories and mass-storage devices. The scheduler orchestrates interleaved execution of various different application programs and higher-level computational entities, providing to each application program a virtual, stand-alone system devoted entirely to the application program. From the application program's standpoint, the application program executes continuously without concern for the need to share processor resources and other system resources with other application programs and higher-level computational entities. The device drivers abstract details of hardware-component operation, allowing application programs to employ the system-call interface for transmitting and receiving data to and from communications networks, mass-storage devices, and other I/O devices and subsystems. The file system 436 facilitates abstraction of mass-storage-device and memory resources as a high-level, easy-to-access, file-system interface. Thus, the development and evolution of the operating system has resulted in the generation of a type of multi-faceted virtual execution environment for application programs and other higher-level computational entities.

While the execution environments provided by operating systems have proved to be an enormously successful level of abstraction within computer systems, the operating-system-provided level of abstraction is nonetheless associated with difficulties and challenges for developers and users of application programs and other higher-level computational entities. One difficulty arises from the fact that there are many different operating systems that run within various different types of computer hardware. In many cases, popular application programs and computational systems are developed to run on only a subset of the available operating systems, and can therefore be executed within only a subset of the various different types of computer systems on which the operating systems are designed to run. Often, even when an application program or other computational system is ported to additional operating systems, the application program or other computational system can nonetheless run more efficiently on the operating systems for which the application program or other computational system was originally targeted. Another difficulty arises from the increasingly distributed nature of computer systems. Although distributed operating systems are the subject of considerable research and development efforts, many of the popular operating systems are designed primarily for execution on a single computer system. In many cases, it is difficult to move application programs, in real time, between the different computer systems of a distributed computer system for high-availability, fault-tolerance, and load-balancing purposes. The problems are even greater in heterogeneous distributed computer systems which include different types of hardware and devices running different types of operating systems. Operating systems continue to evolve, as a result of which certain older application programs and other computational entities may be incompatible with more recent versions of operating systems for which they are targeted, creating compatibility issues that are particularly difficult to manage in large distributed systems.

Figure 5A:
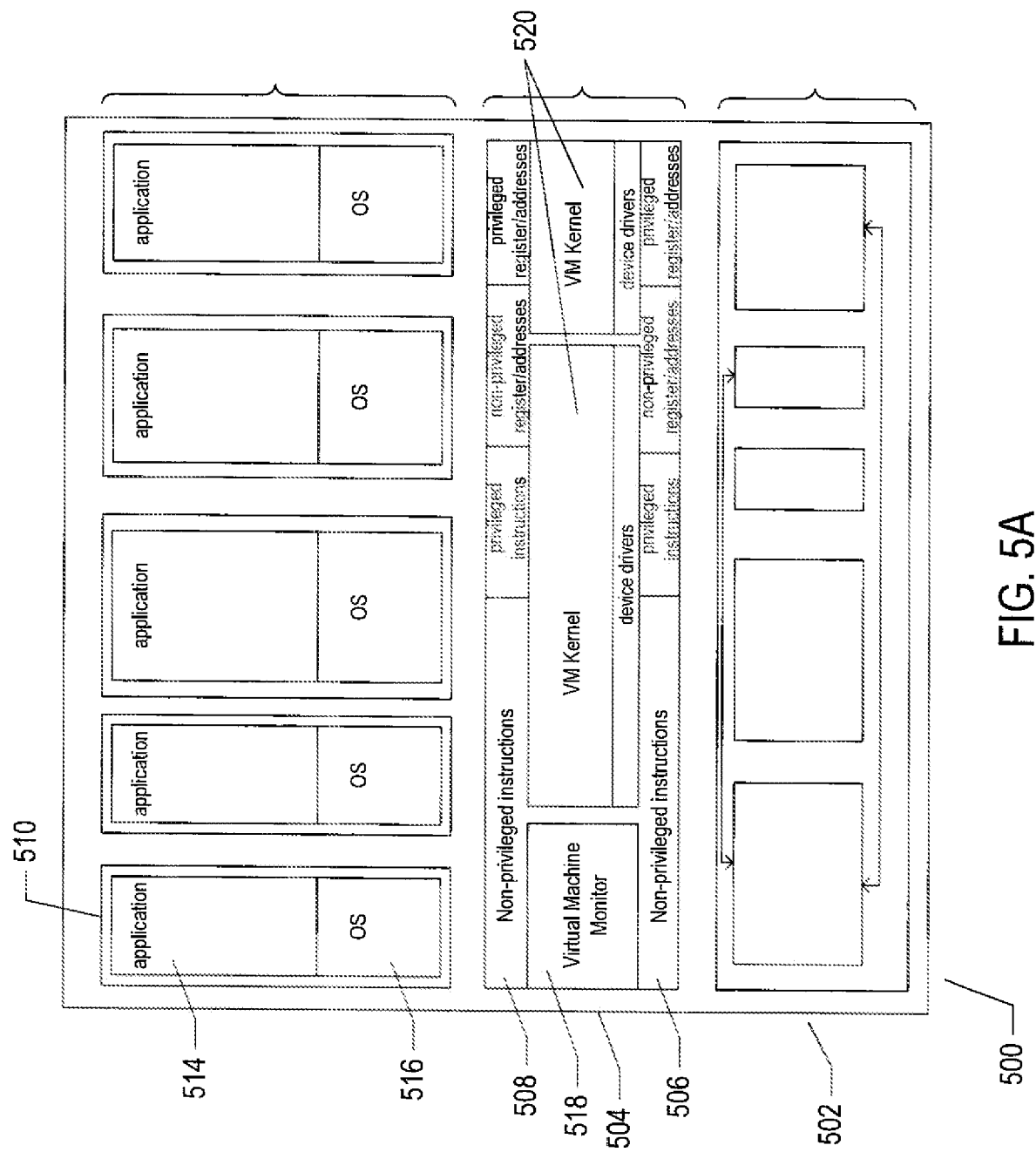

For all of these reasons, a higher level of abstraction, referred to as the "virtual machine," has been developed and evolved to further abstract computer hardware in order to address many difficulties and challenges associated with traditional computing systems, including the compatibility issues discussed above. FIGS. 5A-B illustrate two types of virtual machine and virtual-machine execution environments. FIGS. 5A-B use the same illustration conventions as used in FIG. 4. FIG. 5A shows a first type of virtualization. The computer system 500 in FIG. 5A includes the same hardware layer 502 as the hardware layer 402 shown in FIG. 4. However, rather than providing an operating system layer directly above the hardware layer, as in FIG. 4, the virtualized computing environment illustrated in FIG. 5A features a virtualization layer 504 that interfaces through a virtualization-layer/hardware-layer interface 506, equivalent to interface 416 in FIG. 4, to the hardware. The virtualization layer provides a hardware-like interface 508 to a number of virtual machines, such as virtual machine 510, executing above the virtualization layer in a virtual-machine layer 512. Each virtual machine includes one or more application programs or other higher-level computational entities packaged together with an operating system, referred to as a "guest operating system," such as application 514 and guest operating system 516 packaged together within virtual machine 510. Each virtual machine is thus equivalent to the operating-system layer 404 and application-program layer 406 in the general-purpose computer system shown in FIG. 4. Each guest operating system within a virtual machine interfaces to the virtualization-layer interface 508 rather than to the actual hardware interface 506. The virtualization layer partitions hardware resources into abstract virtual-hardware layers to which each guest operating system within a virtual machine interfaces. The guest operating systems within the virtual machines, in general, are unaware of the virtualization layer and operate as if they were directly accessing a true hardware interface. The virtualization layer ensures that each of the virtual machines currently executing within the virtual environment receive a fair allocation of underlying hardware resources and that all virtual machines receive sufficient resources to progress in execution. The virtualization-layer interface 508 may differ for different guest operating systems. For example, the virtualization layer is generally able to provide virtual hardware interfaces for a variety of different types of computer hardware. This allows, as one example, a virtual machine that includes a guest operating system designed for a particular computer architecture to run on hardware of a different architecture. The number of virtual machines need not be equal to the number of physical processors or even a multiple of the number of processors.

The virtualization layer includes a virtual-machine-monitor module 518 ("VMM") that virtualizes physical processors in the hardware layer to create virtual processors on which each of the virtual machines executes. For execution efficiency, the virtualization layer attempts to allow virtual machines to directly execute non-privileged instructions and to directly access non-privileged registers and memory. However, when the guest operating system within a virtual machine accesses virtual privileged instructions, virtual privileged registers, and virtual privileged memory through the virtualization-layer interface 508, the accesses result in execution of virtualization-layer code to simulate or emulate the privileged resources. The virtualization layer additionally includes a kernel module 520 that manages memory, communications, and data-storage machine resources on behalf of executing virtual machines ("VM kernel"). The VM kernel, for example, maintains shadow page tables on each virtual machine so that hardware-level virtual-memory facilities can be used to process memory accesses. The VM kernel additionally includes routines that implement virtual communications and data-storage devices as well as device drivers that directly control the operation of underlying hardware communications and data-storage devices. Similarly, the VM kernel virtualizes various other types of I/O devices, including keyboards, optical-disk drives, and other such devices. The virtualization layer essentially schedules execution of virtual machines much like an operating system schedules execution of application programs, so that the virtual machines each execute within a complete and fully functional virtual hardware layer.

FIG. 5B illustrates a second type of virtualization. In FIG. 5B, the computer system 540 includes the same hardware layer 542 and software layer 544 as the hardware layer 402 shown in FIG. 4. Several application programs 546 and 548 are shown running in the execution environment provided by the operating system. In addition, a virtualization layer 550 is also provided, in computer 540, but, unlike the virtualization layer 504 discussed with reference to FIG. 5A, virtualization layer 550 is layered above the operating system 544, referred to as the "host OS," and uses the operating system interface to access operating-system-provided functionality as well as the hardware. The virtualization layer 550 comprises primarily a VMM and a hardware-like interface 552, similar to hardware-like interface 508 in FIG. 5A. The virtualization-layer/hardware-layer interface 552, equivalent to interface 416 in FIG. 4, provides an execution environment for a number of virtual machines 556-558, each including one or more application programs or other higher-level computational entities packaged together with a guest operating system.

In FIGS. 5A-B, the layers are somewhat simplified for clarity of illustration. For example, portions of the virtualization layer 550 may reside within the host-operating-system kernel, such as a specialized driver incorporated into the host operating system to facilitate hardware access by the virtualization layer.

It should be noted that virtual hardware layers, virtualization layers, and guest operating systems are all physical entities that are implemented by computer instructions stored in physical data-storage devices, including electronic memories, mass-storage devices, optical disks, magnetic disks, and other such devices. The term "virtual" does not, in any way, imply that virtual hardware layers, virtualization layers, and guest operating systems are abstract or intangible. Virtual hardware layers, virtualization layers, and guest operating systems execute on physical processors of physical computer systems and control operation of the physical computer systems, including operations that alter the physical states of physical devices, including electronic memories and mass-storage devices. They are as physical and tangible as any other component of a computer since, such as power supplies, controllers, processors, busses, and data-storage devices.

Figure 6:
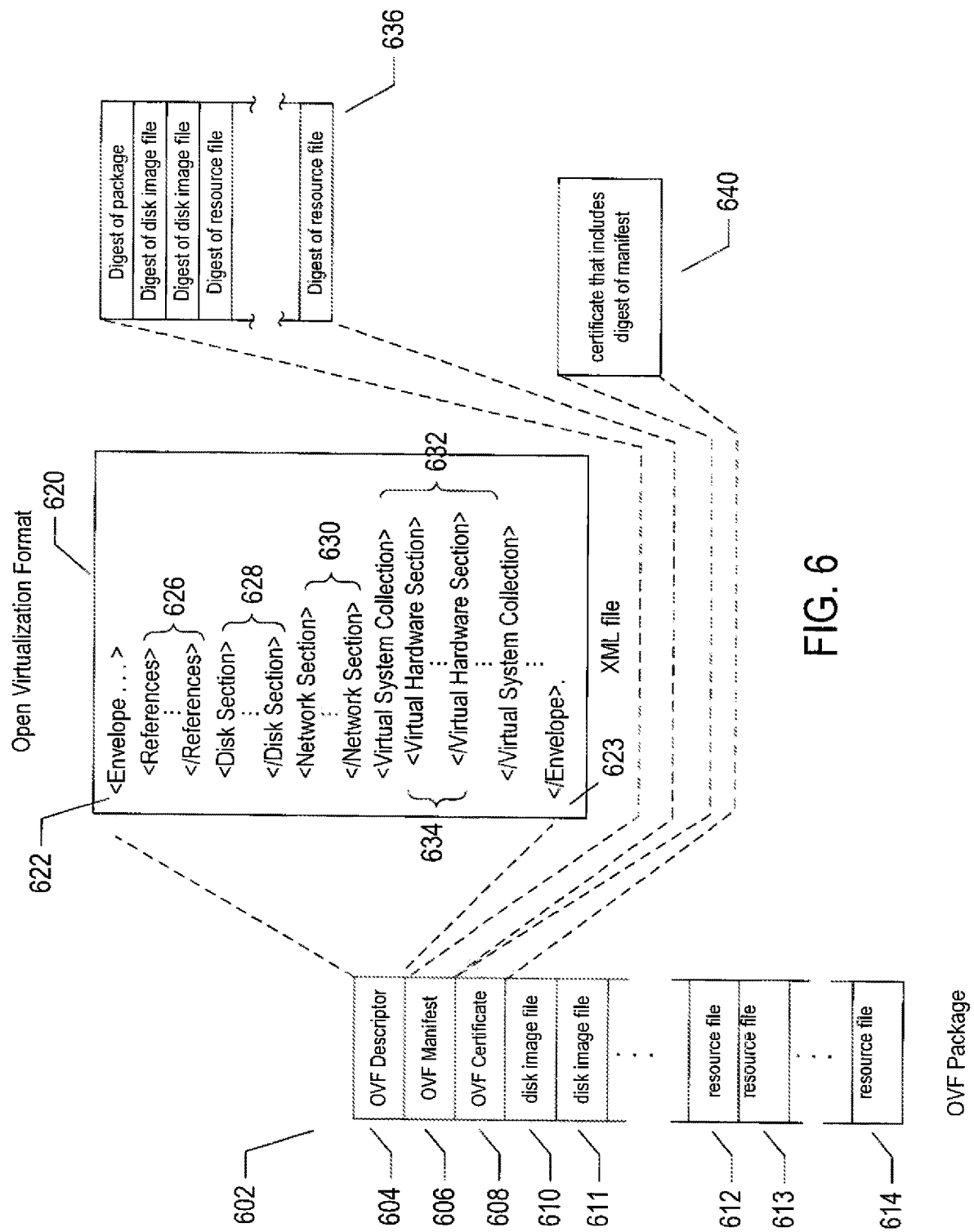
FIG. 6 illustrates an OVF package.

A virtual machine or virtual application, described below, is encapsulated within a data package for transmission, distribution, and loading into a virtual-execution environment. One public standard for virtual-machine encapsulation is referred to as the "open virtualization format" ("OVF"). The OVF standard specifies a format for digitally encoding a virtual machine within one or more data files. FIG. 6 illustrates an OVF package. An OVF package 602 includes an OVF descriptor 604, an OVF manifest 606, an OVF certificate 608, one or more disk-image files 610-611, and one or more resource files 612-614. The OVF package can be encoded and stored as a single file or as a set of files. The OVF descriptor 604 is an XML document 620 that includes a hierarchical set of elements, each demarcated by a beginning tag and an ending tag. The outermost, or highest-level, element is the envelope element, demarcated by tags 622 and 623. The next-level element includes a reference element 626 that includes references to all files that are part of the OVF package, a disk section 628 that contains meta information about all of the virtual disks included in the OVF package, a networks section 630 that includes meta information about all of the logical networks included in the OVF package, and a collection of virtual-machine configurations 632 which further includes hardware descriptions of each virtual machine 634. There are many additional hierarchical levels and elements within a typical OVF descriptor. The OVF descriptor is thus a self-describing, XML file that describes the contents of an OVF package. The OVF manifest 606 is a list of cryptographic-hash-function-generated digests 636 of the entire OVF package and of the various components of the OVF package. The OVF certificate 608 is an authentication certificate 640 that includes a digest of the manifest and that is cryptographically signed. Disk image files, such as disk image file 610, are digital encodings of the contents of virtual disks and resource files 612 are digitally encoded content, such as operating-system images. A virtual machine or a collection of virtual machines encapsulated together within a virtual application can thus be digitally encoded as one or more files within an OVF package that can be transmitted, distributed, and loaded using well-known tools for transmitting, distributing, and loading files. A virtual appliance is a software service that is delivered as a complete software stack installed within one or more virtual machines that is encoded within an OVF package.

Figure 7:
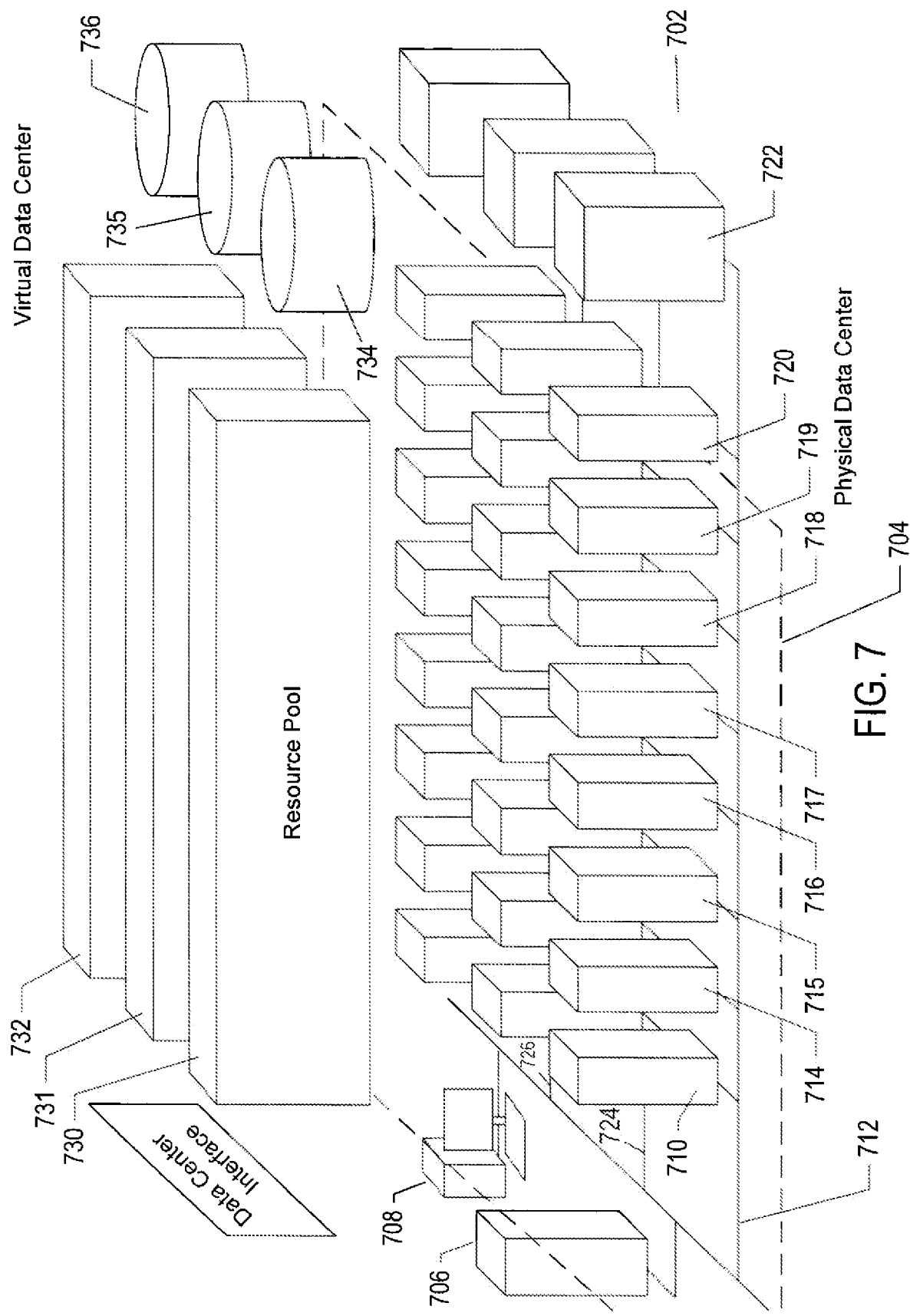
FIG. 7 illustrates virtual data centers provided as an abstraction of underlying physical-data-center hardware components.

The advent of virtual machines and virtual environments has alleviated many of the difficulties and challenges associated with traditional general-purpose computing. Machine and operating-system dependencies can be significantly reduced or entirely eliminated by packaging applications and operating systems together as virtual machines and virtual appliances that execute within virtual environments provided by virtualization layers running on many different types of computer hardware. A next level of abstraction, referred to as virtual data centers or virtual infrastructure, provide a data-center interface to virtual data centers computationally constructed within physical data centers. FIG. 7 illustrates virtual data centers provided as an abstraction of underlying physical-data-center hardware components. In FIG. 7, a physical data center 702 is shown below a virtual-interface plane 704. The physical data center consists of a virtual-data-center management server 706 and any of various different computers, such as PCs 708, on which a virtual-data-center management interface may be displayed to system administrators and other users. The physical data center additionally includes generally large numbers of server computers, such as server computer 710, that are coupled together by local area networks, such as local area network 712 that directly interconnects server computer 710 and 714-720 and a mass-storage array 722. The physical data center shown in FIG. 7 includes three local area networks 712, 724, and 726 that each directly interconnects a bank of eight servers and a mass-storage array. The individual server computers, such as server computer 710, each includes a virtualization layer and runs multiple virtual machines. Different physical data centers may include many different types of computers, networks, data-storage systems and devices connected according to many different types of connection topologies. The virtual-data-center abstraction layer 704, a logical abstraction layer shown by a plane in FIG. 7, abstracts the physical data center to a virtual data center comprising one or more resource pools, such as resource pools 730-732, one or more virtual data stores, such as virtual data stores 734-736, and one or more virtual networks. In certain implementations, the resource pools abstract banks of physical servers directly interconnected by a local area network.

Figure 8:
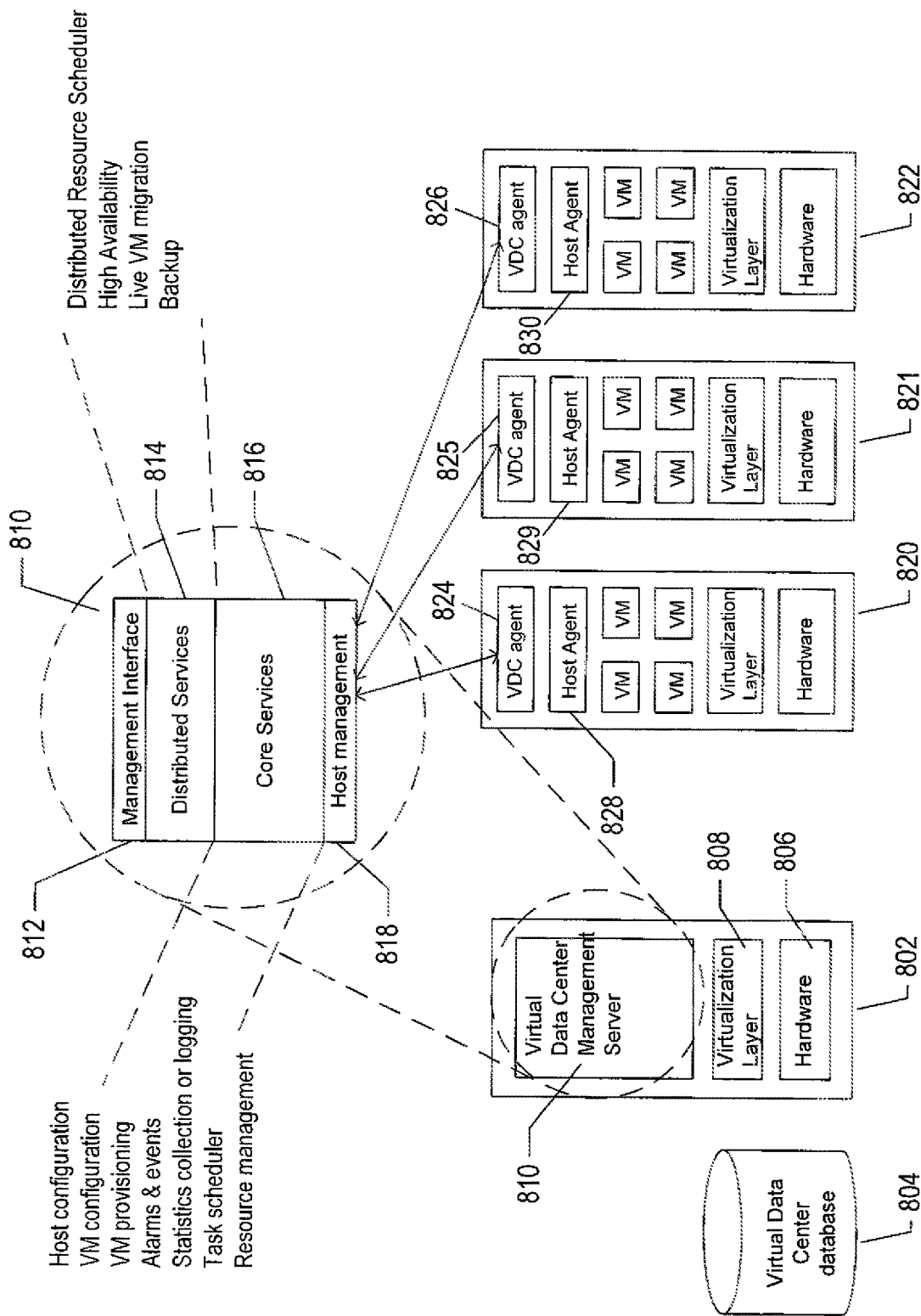
FIG. 8 illustrates virtual-machine components of a virtual-data-center management server and physical servers of a physical data center above which a virtual-data-center interface is provided by the virtual-data-center management server.

The virtual-data-center management interface allows provisioning and launching of virtual machines with respect to resource pools, virtual data stores, and virtual networks, so that virtual-data-center administrators need not be concerned with the identities of physical-data-center components used to execute particular virtual machines. Furthermore, the virtual-data-center management server includes functionality to migrate running virtual machines from one physical server to another in order to optimally or near optimally manage resource allocation, provide fault tolerance, and high availability by migrating virtual machines to most effectively utilize underlying physical hardware resources, to replace virtual machines disabled by physical hardware problems and failures, and to ensure that multiple virtual machines supporting a high-availability virtual appliance are executing on multiple physical computer systems so that the services provided by the virtual appliance are continuously accessible, even when one of the multiple virtual appliances becomes compute bound, data-access bound, suspends execution, or fails. Thus, the virtual data center layer of abstraction provides a virtual-data-center abstraction of physical data centers to simplify provisioning, launching, and maintenance of virtual machines and virtual appliances as well as to provide high-level, distributed functionalities that involve pooling the resources of individual physical servers and migrating virtual machines among physical servers to achieve load balancing, fault tolerance, and high availability. FIG. 8 illustrates virtual-machine components of a virtual-data-center management server and physical servers of a physical data center above which a virtual-data-center interface is provided by the virtual-data-center management server. The virtual-data-center management server 802 and a virtual-data-center database 804 comprise the physical components of the management component of the virtual data center. The virtual-data-center management server 802 includes a hardware layer 806 and virtualization layer 808, and runs a virtual-data-center management-server virtual machine 810 above the virtualization layer. Although shown as a single server in FIG. 8, the virtual-data-center management server ("VDC management server") may include two or more physical server computers that support multiple VDC-management-server virtual appliances. The virtual machine 810 includes a management-interface component 812, distributed services 814, core services 816, and a host-management interface 818. The management interface is accessed from any of various computers, such as the PC 708 shown in FIG. 7. The management interface allows the virtual-data-center administrator to configure a virtual data center, provision virtual machines, collect statistics and view log files for the virtual data center, and to carry out other, similar management tasks. The host-management interface 818 interfaces to virtual-data-center agents 824, 825, and 826 that execute as virtual machines within each of the physical servers of the physical data center that is abstracted to a virtual data center by the VDC management server.

The distributed services 814 include a distributed-resource scheduler that assigns virtual machines to execute within particular physical servers and that migrates virtual machines in order to most effectively make use of computational bandwidths, data-storage capacities, and network capacities of the physical data center. The distributed services further include a high-availability service that replicates and migrates virtual machines in order to ensure that virtual machines continue to execute despite problems and failures experienced by physical hardware components. The distributed services also include a live-virtual-machine migration service that temporarily halts execution of a virtual machine, encapsulates the virtual machine in an OVF package, transmits the OVF package to a different physical server, and restarts the virtual machine on the different physical server from a virtual-machine state recorded when execution of the virtual machine was halted. The distributed services also include a distributed backup service that provides centralized virtual-machine backup and restore.

The core services provided by the VDC management server include host configuration, virtual-machine configuration, virtual-machine provisioning, generation of virtual-data-center alarms and events, ongoing event logging and statistics collection, a task scheduler, and a resource-management module. Each physical server 820-822 also includes a host-agent virtual machine 828-830 through which the virtualization layer can be accessed via a virtual-infrastructure application programming interface ("API"). This interface allows a remote administrator or user to manage an individual server through the infrastructure API. The virtual-data-center agents 824-826 access virtualization-layer server information through the host agents. The virtual-data-center agents are primarily responsible for offloading certain of the virtual-data-center management-server functions specific to a particular physical server to that physical server. The virtual-data-center agents relay and enforce resource allocations made by the VDC management server, relay virtual-machine provisioning and configuration-change commands to host agents, monitor and collect performance statistics, alarms, and events communicated to the virtual-data-center agents by the local host agents through the interface API, and to carry out other, similar virtual-data-management tasks.

The virtual-data-center abstraction provides a convenient and efficient level of abstraction for exposing the computational resources of a cloud-computing facility to cloud-computing-infrastructure users. A cloud-director management server exposes virtual resources of a cloud-computing facility to cloud-computing-infrastructure users. In addition, the cloud director introduces a multi-tenancy layer of abstraction, which partitions VDCs into tenant-associated VDCs that can each be allocated to a particular individual tenant or tenant organization, both referred to as a "tenant." A given tenant can be provided one or more tenant-associated VDCs by a cloud director managing the multi-tenancy layer of abstraction within a cloud-computing facility. The cloud services interface (308 in FIG. 3) exposes a virtual-data-center management interface that abstracts the physical data center.

Figure 9:
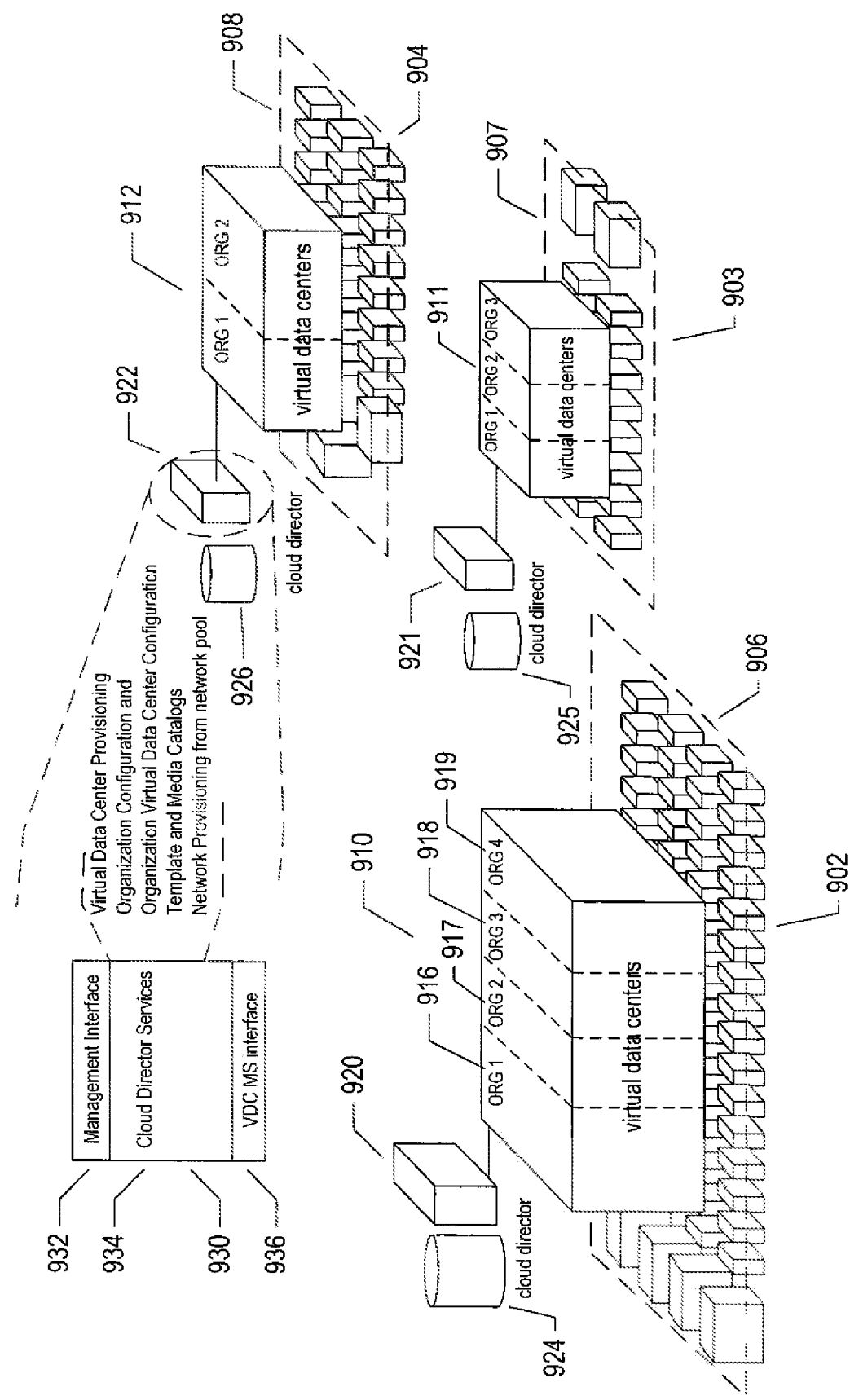
FIG. 9 illustrates a cloud-director level of abstraction.

FIG. 9 illustrates a cloud-director level of abstraction. In FIG. 9, three different physical data centers 902-904 are shown below planes representing the cloud-director layer of abstraction 906-908. Above the planes representing the cloud-director level of abstraction, multi-tenant virtual data centers 910-912 are shown. The resources of these multi-tenant virtual data centers are securely partitioned in order to provide secure virtual data centers to multiple tenants, or cloud-services-accessing organizations. For example, a cloud-services-provider virtual data center 910 is partitioned into four different tenant-associated virtual-data centers within a multi-tenant virtual data center for four different tenants 916-919. Each multi-tenant virtual data center is managed by a cloud director comprising one or more cloud-director servers 920-922 and associated cloud-director databases 924-926. Each cloud-director server or servers runs a cloud-director virtual appliance 930 that includes a cloud-director management interface 932, a set of cloud-director services 934, and a virtual-data-center management-server interface 936. The cloud-director services include an interface and tools for provisioning multi-tenant virtual data center virtual data centers on behalf of tenants, tools and interfaces for configuring and managing tenant organizations, tools and services for organization of virtual data centers and tenant-associated virtual data centers within the multi-tenant virtual data center, services associated with template and media catalogs, and provisioning of virtualization networks from a network pool. Templates are virtual machines that each contains an OS and/or one or more virtual machines containing applications. A template may include much of the detailed contents of virtual machines and virtual appliances that are encoded within OVF packages, so that the task of configuring a virtual machine or virtual appliance is significantly simplified, requiring only deployment of one OVF package. These templates are stored in catalogs within a tenant's virtual-data center. These catalogs are used for developing and staging new virtual appliances and published catalogs are used for sharing templates in virtual appliances across organizations. Catalogs may include OS images and other information relevant to construction, distribution, and provisioning of virtual appliances.

Considering FIGS. 7 and 9, the VDC-server and cloud-director layers of abstraction can be seen, as discussed above, to facilitate employment of the virtual-data-center concept within private and public clouds. However, this level of abstraction does not fully facilitate aggregation of single-tenant and multi-tenant virtual data centers into heterogeneous or homogeneous aggregations of cloud-computing facilities.

Figure 10:
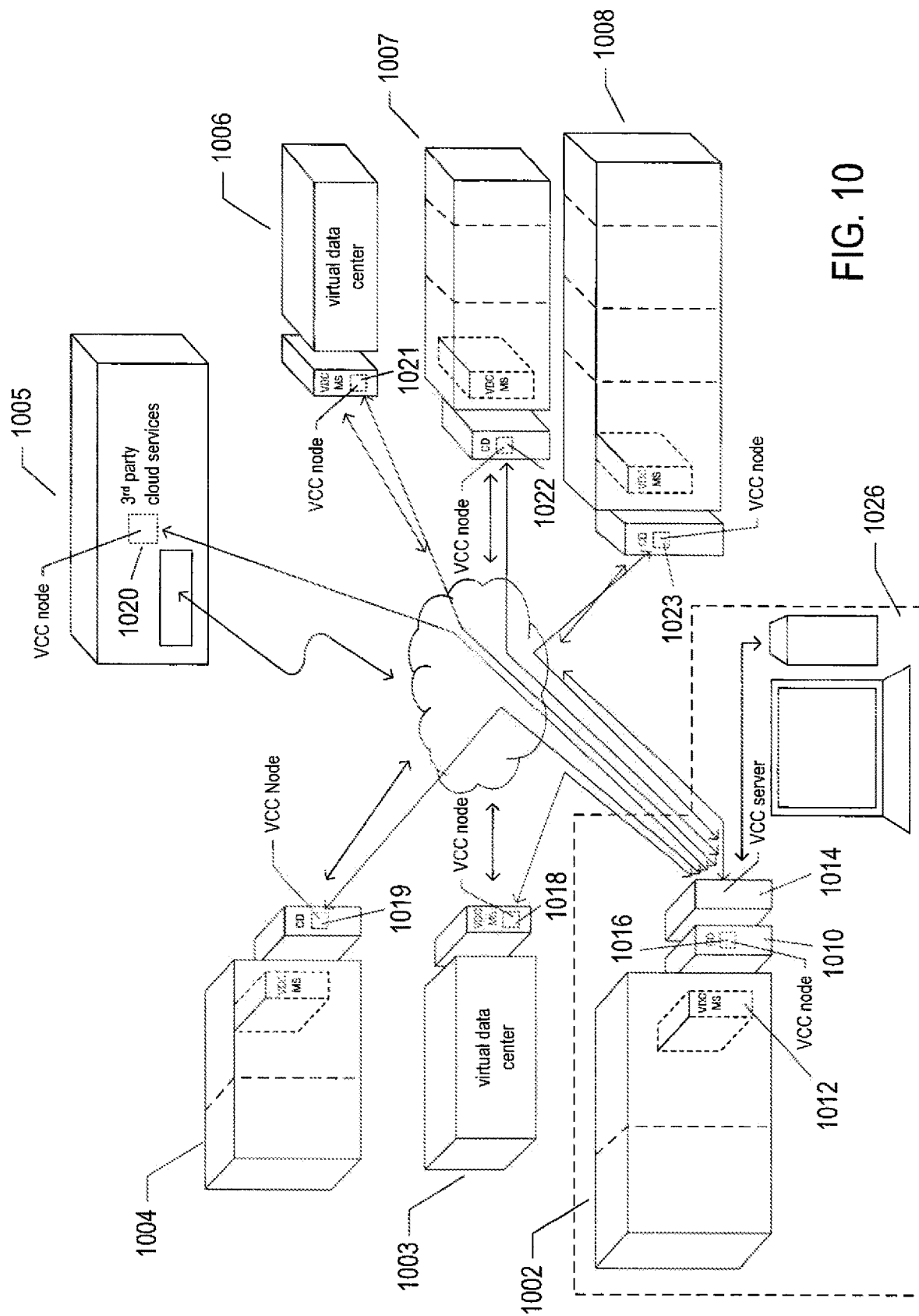
FIG. 10 illustrates virtual-cloud-connector nodes ("VCC nodes") and a VCC server, components of a distributed system that provides multi-cloud aggregation and that includes a cloud-connector server and cloud-connector nodes that cooperate to provide services that are distributed across multiple clouds.

FIG. 10 illustrates virtual-cloud-connector nodes ("VCC nodes") and a VCC server, components of a distributed system that provides multi-cloud aggregation and that includes a cloud-connector server and cloud-connector nodes that cooperate to provide services that are distributed across multiple clouds. VMware vCloud™ VCC servers and nodes are one example of VCC server and nodes. In FIG. 10, seven different cloud-computing facilities are illustrated 1002-1008. Cloud-computing facility 1002 is a private multi-tenant cloud with a cloud director 1010 that interfaces to a VDC management server 1012 to provide a multi-tenant private cloud comprising multiple tenant-associated virtual data centers. The remaining cloud-computing facilities 1003-1008 may be either public or private cloud-computing facilities and may be single-tenant virtual data centers, such as virtual data centers 1003 and 1006, multi-tenant virtual data centers, such as multi-tenant virtual data centers 1004 and 1007-1008, or any of various different kinds of third-party cloud-services facilities, such as third-party cloud-services facility 1005. An additional component, the VCC server 1014, acting as a controller is included in the private cloud-computing facility 1002 and interfaces to a VCC node 1016 that runs as a virtual appliance within the cloud director 1010. A VCC server may also run as a virtual appliance within a VDC management server that manages a single-tenant private cloud. The VCC server 1014 additionally interfaces, through the Internet, to VCC node virtual appliances executing within remote VDC management servers, remote cloud directors, or within the third-party cloud services 1018-1023. The VCC server provides a VCC server interface that can be displayed on a local or remote terminal, PC, or other computer system 1026 to allow a cloud-aggregation administrator or other user to access VCC-server-provided aggregate-cloud distributed services. In general, the cloud-computing facilities that together form a multiple-cloud-computing aggregation through distributed services provided by the VCC server and VCC nodes are geographically and operationally distinct.

Application Management and Reinforcement Learning

Figure 11A:
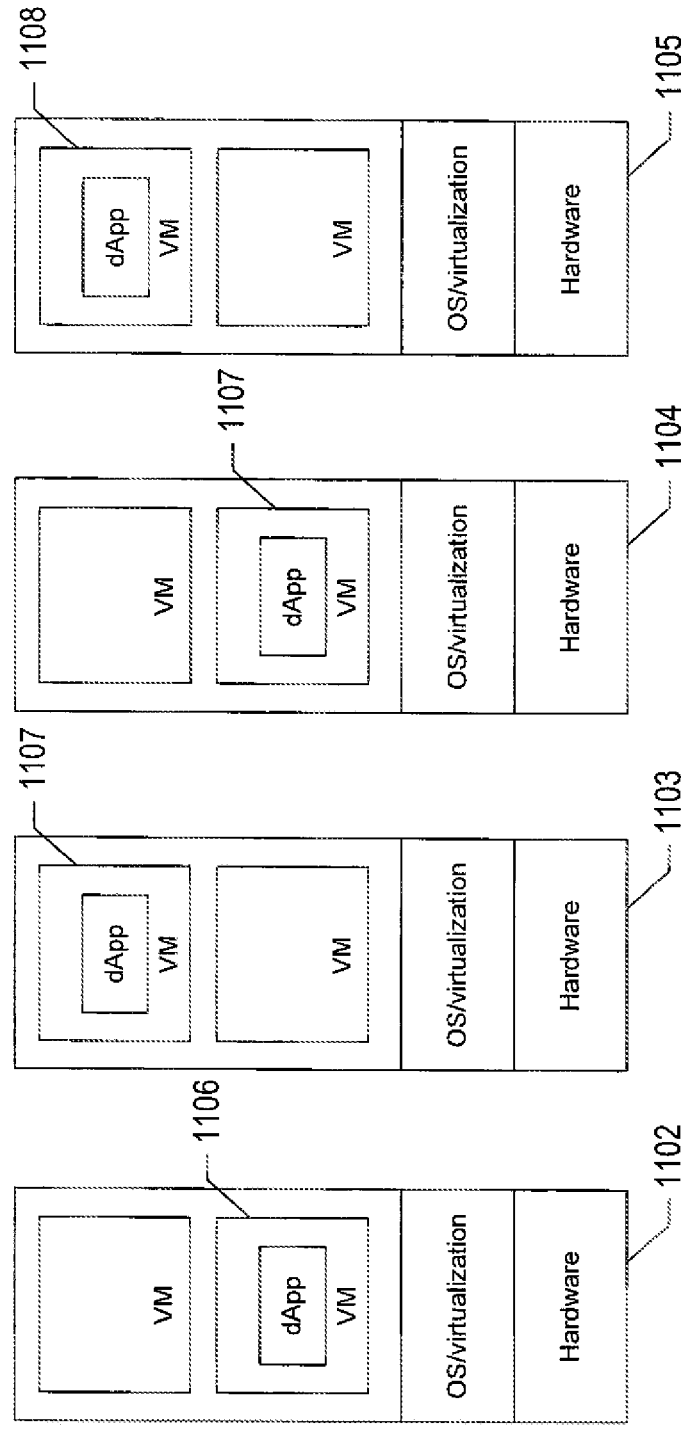
FIGS. 11A-C illustrate an application manager.
Figure 11B:
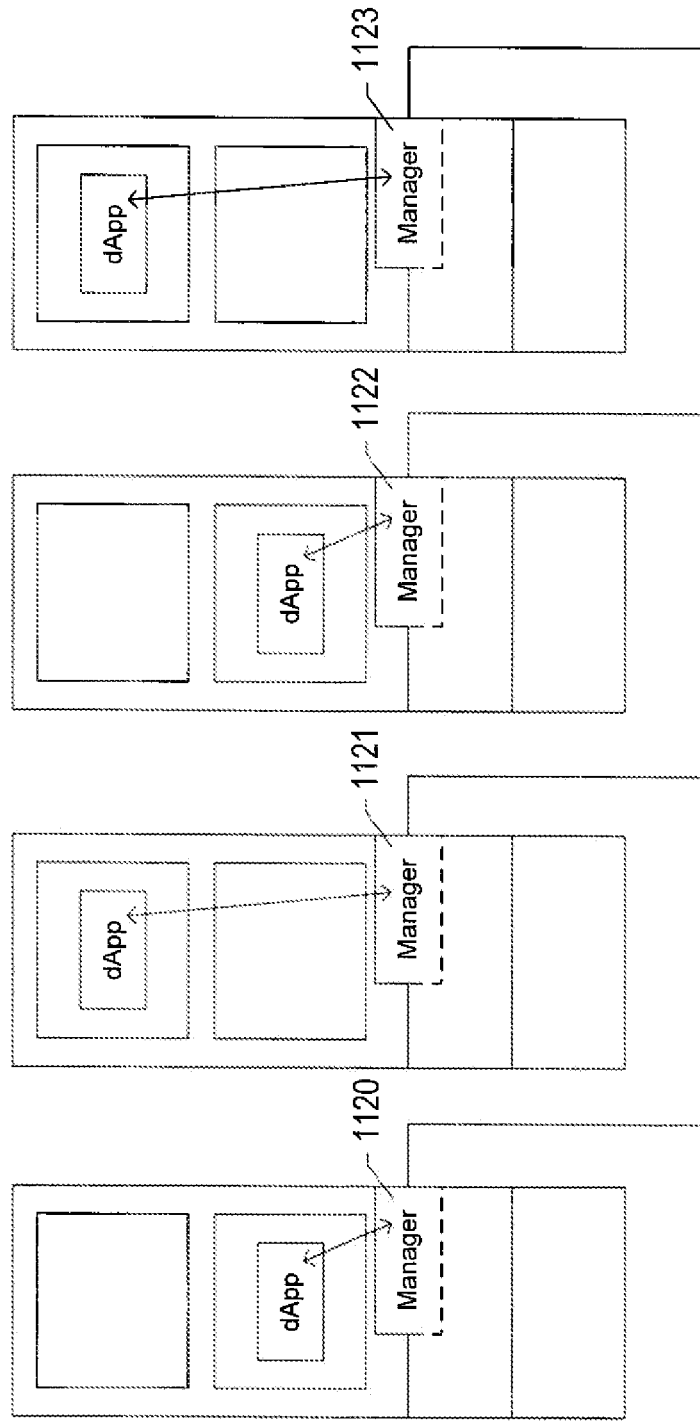
Figure 11C:
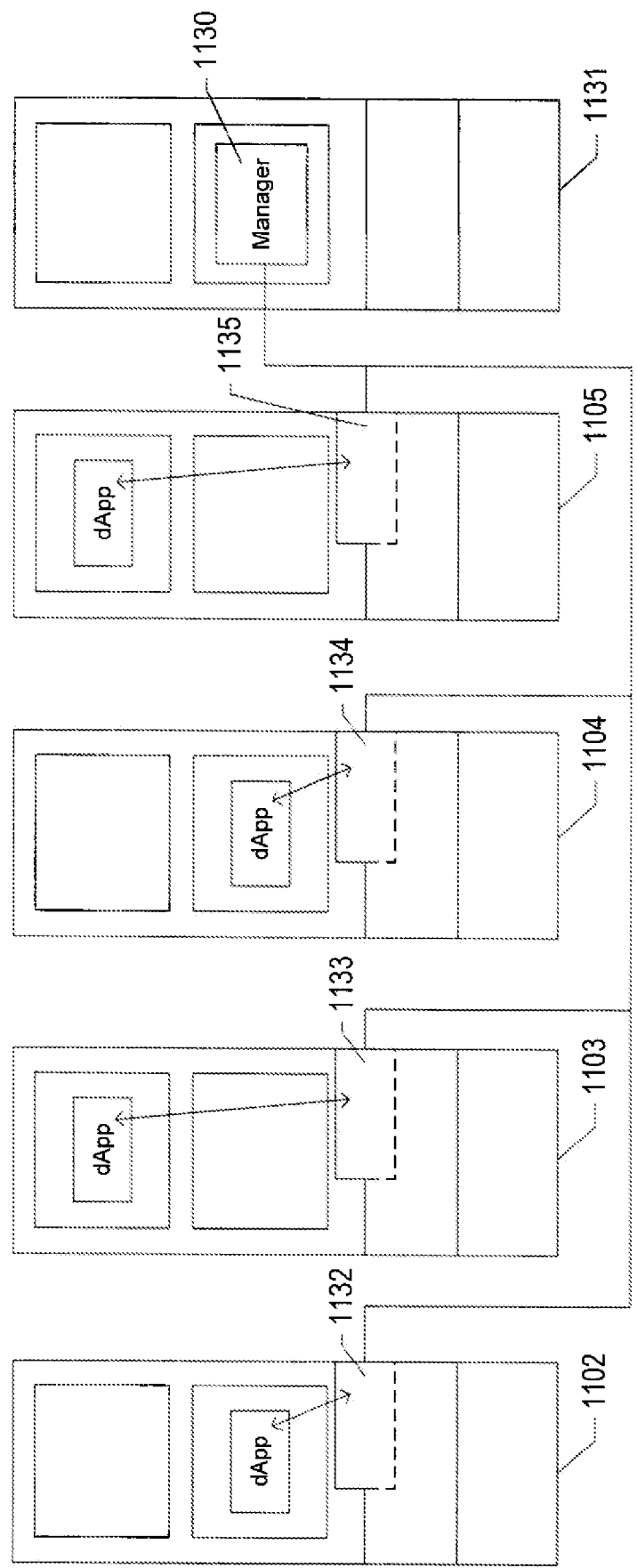

FIGS. 11A-C illustrate an application manager. All three figures use the same illustration conventions, next described with reference to FIG. 11A. The distributed computing system is represented, in FIG. 11A, by four servers 1102-1105 that each support execution of a virtual machine, 1106-1108 respectively, that provides an execution environment for a local instance of the distributed application. Of course, in real-life cloud-computing environments, a particular distributed application may run on many tens to hundreds of individual physical servers. Such distributed applications often require fairly continuous administration and management. For example, instances of the distributed application may need to be launched or terminated, depending on current computational loads, and may be frequently relocated to different physical servers and even to different cloud-computing facilities in order to take advantage of favorable pricing for virtual-machine execution, to obtain necessary computational throughput, and to minimize networking latencies. Initially, management of distributed applications as well as the management of multiple, different applications executing on behalf of a client or client organization of one or more cloud-computing facilities was carried out manually through various management interfaces provided by cloud-computing facilities and distributed-computer data centers. However, as the complexity of distributed-computing environments has increased and as the numbers and complexities of applications concurrently executed by clients and client organizations have increased, efforts have been undertaken to develop automated application managers for automatically monitoring and managing applications on behalf of clients and client organizations of cloud-computing facilities and distributed-computer-system-based data centers.

As shown in FIG. 11B, one approach to automated management of applications within distributed computer systems is to include, in each physical server on which one or more of the managed applications executes, a local instance of the distributed application manager 1120-1123. The local instances of the distributed application manager cooperate, in peer-to-peer fashion, to manage a set of one or more applications, including distributed applications, on behalf of a client or client organization of the data center or cloud-computing facility. Another approach, as shown in FIG. 11C, is to run a centralized or centralized-distributed application manager 1130 on one or more physical servers 1131 that communicates with application-manager agents 1132-1135 on the servers 1102-1105 to support control and management of the managed applications. In certain cases, application-management facilities may be incorporated within the various types of management servers that manage virtual data centers and aggregations of virtual data centers discussed in the previous subsection of the current document. The phrase "application manager" means, in this document, an automated controller than controls and manages applications programs and the computational environment in which they execute. Thus, an application manager may interface to one or more operating systems and virtualization layers, in addition to applications, in various implementations, to control and manage the applications and their computational environments. In certain implementations, an application manager may even control and manage virtual and/or physical components that support the computational environments in which applications execute.

In certain implementations, an application manager is configured to manage applications and their computational environments within one or more distributed computing systems based on a set of one or more policies, each of which may include various rules, parameter values, and other types of specifications of the desired operational characteristics of the applications. As one example, the one or more policies may specify maximum average latencies for responding to user requests, maximum costs for executing virtual machines per hour or per day, and policy-driven approaches to optimizing the cost per transaction and the number of transactions carried out per unit of time. Such overall policies may be implemented by a combination of finer-grain policies, parameterized control programs, and other types of controllers that interface to operating-system and virtualization-layer-management subsystems. However, as the numbers and complexities of applications desired to be managed on behalf of clients and client organizations of data centers and cloud-computing facilities continues to increase, it is becoming increasingly difficult, if not practically impossible, to implement policy-driven application management by manual programming and/or policy construction. As a result, a new approach to application management based on the machine-learning technique referred to as "reinforcement learning" has been undertaken.

Figure 12:
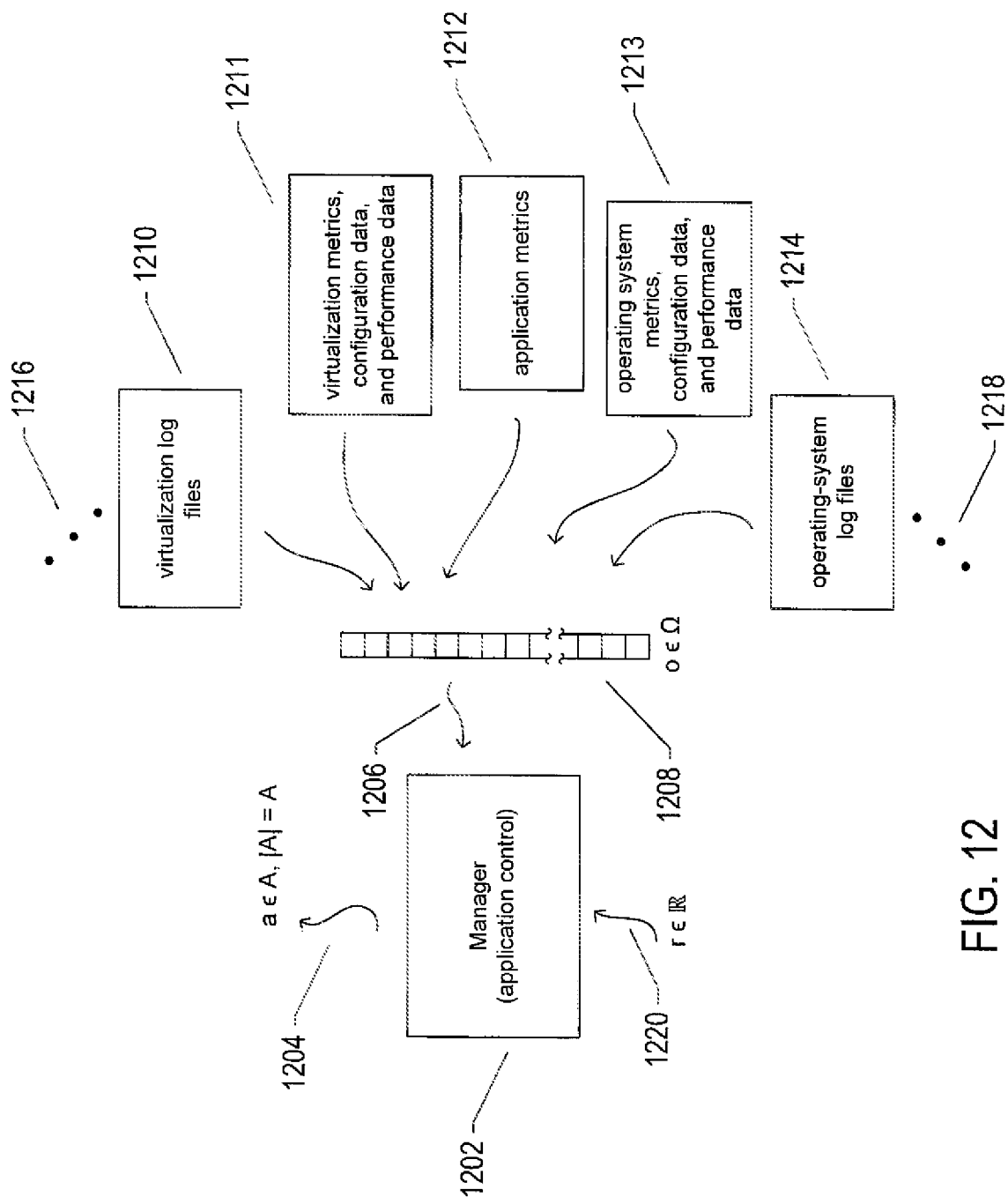
FIG. 12 illustrates, at a high level of abstraction, a reinforcement-learning-based application manager controlling a computational environment, such as a cloud-computing facility.

FIG. 12 illustrates, at a high level of abstraction, a reinforcement-learning-based application manager controlling a computational environment, such as a cloud-computing facility. The reinforcement-learning-based application manager 1202 manages one or more applications by emitting or issuing actions, as indicated by arrow 1204. These actions are selected from a set of actions A of cardinality |A|. Each action a in the set of actions A can be generally thought of as a vector of numeric values that specifies an operation that the manager is directing the environment to carry out. The environment may, in many cases, translate the action into one or more environment-specific operations that can be carried out by the computational environment controlled by the reinforcement-learning-based application manager. It should be noted that the cardinality |A| may be indeterminable, since the numeric values may include real values, and the action space may be therefore effectively continuous or effectively continuous in certain dimensions. The operations represented by actions may be, for example, commands, including command arguments, executed by operating systems, distributed operating systems, virtualization layers, management servers, and other types of control components and subsystems within one or more distributed computing systems or cloud-computing facilities. The reinforcement-learning-based application manager receives observations from the computational environment, as indicated by arrow 1206. Each observation o can be thought of as a vector of numeric values 1208 selected from a set of possible observation vectors $\Omega$. The set $\Omega$ may, of course, be quite large and even practically innumerable. Each element of the observation o represents, in certain implementations, a particular type of metric or observed operational characteristic or parameter, numerically encoded, that is related to the computational environment. The metrics may have discrete values or real values, in various implementations. For example, the metrics or observed operational characteristics may indicate the amount of memory allocated for applications and/or application instances, networking latencies experienced by one or more applications, an indication of the number of instruction-execution cycles carried out on behalf of applications or local-application instances, and many other types of metrics and operational characteristics of the managed applications and the computational environment in which the managed applications run. As shown in FIG. 12, there are many different sources 1210-1214 for the values included in an observation o, including virtualization-layer and operating-system log files 1210 and 1214, virtualization-layer metrics, configuration data, and performance data provided through a virtualization-layer management interface 1211, various types of metrics generated by the managed applications 1212, and operating-system metrics, configuration data, and performance data 1213. Ellipses 1216 and 1218 indicate that there may be many additional sources for observation values. In addition to receiving observation vectors o, the reinforcement-learning-based application manager receives rewards, as indicated by arrow 1220. Each reward is a numeric value that represents the feedback provided by the computational environment to the reinforcement-learning-based application manager after carrying out the most recent action issued by the manager and transitioning to a resultant state, as further discussed below. The reinforcement-learning-based application manager is generally initialized with an initial policy that specifies the actions to be issued in response to received observations and over time, as the application manager interacts with the environment, the application manager adjusts the internally maintained policy according to the rewards received following issuance of each action. In many cases, after a reasonable period of time, a reinforcement-learning-based application manager is able to learn a near-optimal or optimal policy for the environment, such as a set of distributed applications, that it manages. In addition, in the case that the managed environment evolves over time, a reinforcement-learning-based application manager is able to continue to adjust the internally maintained policy in order to track evolution of the managed environment so that, at any given point in time, the internally maintained policy is near-optimal or optimal. In the case of an application manager, the computational environment in which the applications run may evolve through changes to the configuration and components, changes in the computational load experienced by the applications and computational environment, and as a result of many additional changes and forces. The received observations provide the information regarding the managed environment that allows the reinforcement-learning-based application manager to infer the current state of the environment which, in turn, allows the reinforcement-learning-based application manager to issue actions that push the managed environment towards states that, over time, produce the greatest reward feedbacks. Of course, similar reinforcement-learning-based application managers may be employed within standalone computer systems, individual, networked computer systems, various processor-controlled devices, including smart phones, and other devices and systems that run applications.

Figure 13:
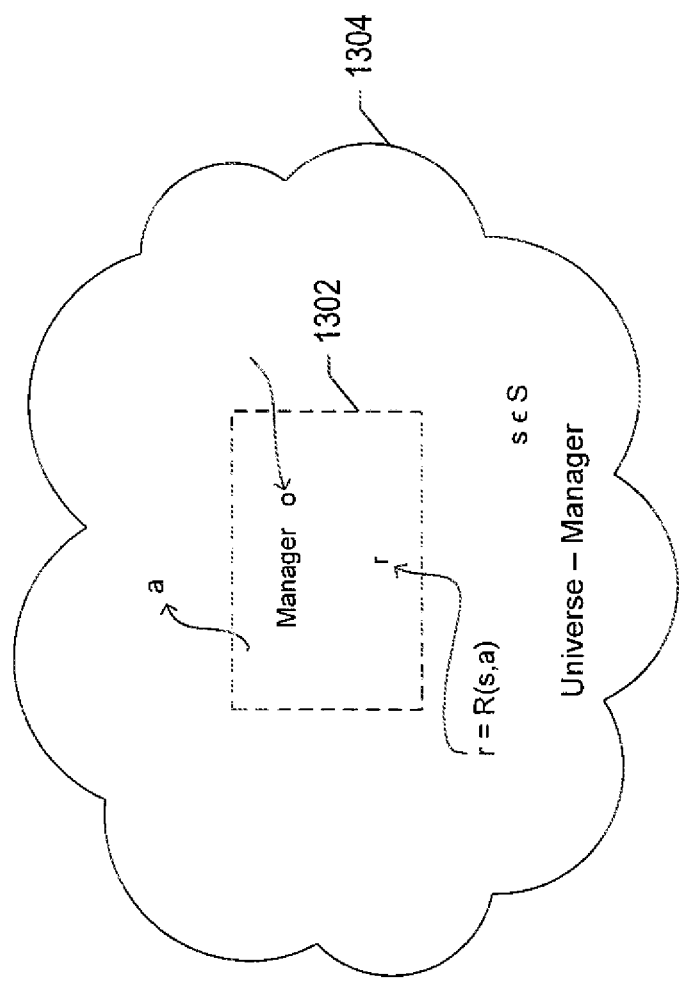
FIG. 13 summarizes the reinforcement-learning-based approach to control.

FIG. 13 summarizes the reinforcement-learning-based approach to control. The manager or controller 1302, referred to as a "reinforcement-learning agent," is contained within, but is distinct and separate from, the universe 1304. Thus, the universe comprises the manager or controller 1302 and the portion of the universe not included in the manager, in set notation referred to as "universe—manager." In the current document, the portion of the universe not included in the manager is referred to as the "environment." In the case of an application manager, the environment includes the managed applications, the physical computational facilities in which they execute, and even generally includes the physical computational facilities in which the manager executes. The rewards are generated by the environment and the reward-generation mechanism cannot be controlled or modified by the manager.

Figure 14A:
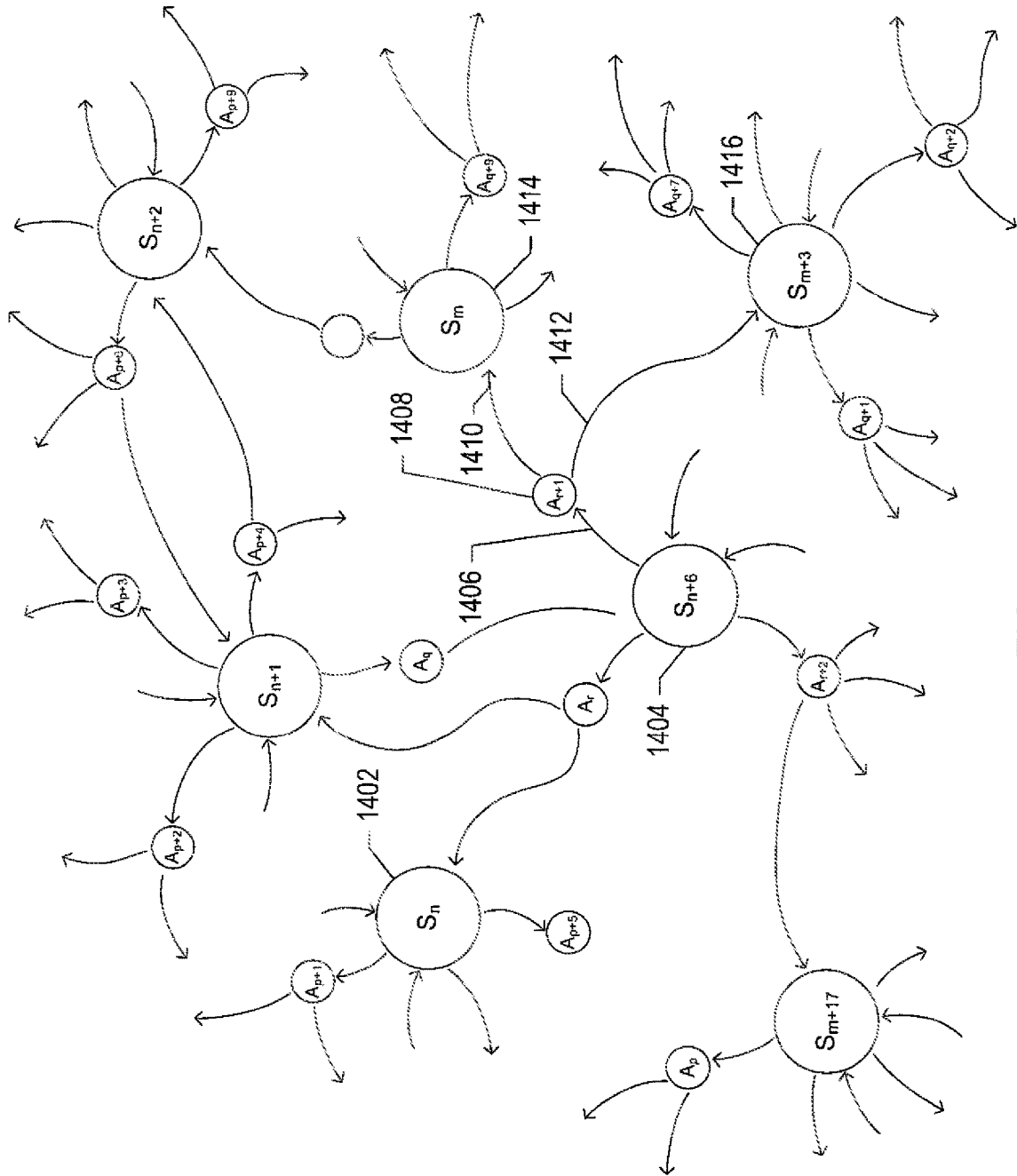
FIGS. 14A-B illustrate states of the environment.
Figure 14B:
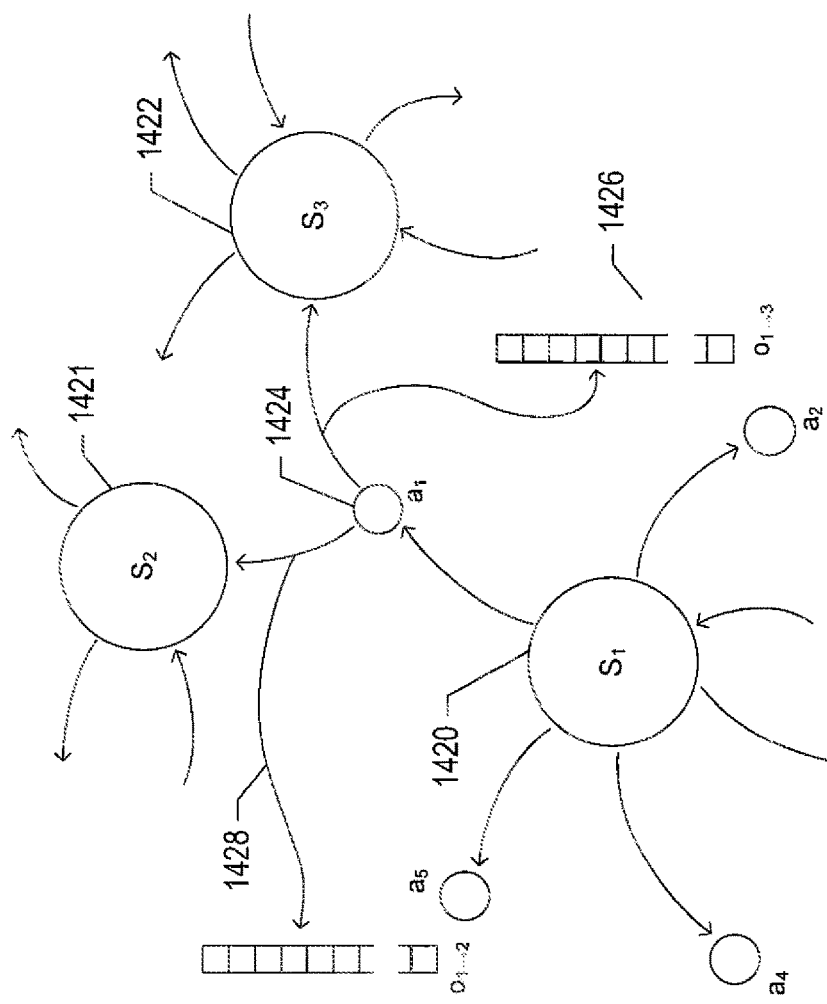

FIGS. 14A-B illustrate states of the environment. In the reinforcement-learning approach, the environment is considered to inhabit a particular state at each point in time. The state may be represented by one or more numeric values or character-string values, but generally is a function of hundreds, thousands, millions, or more different variables. The observations generated by the environment and transmitted to the manager reflect the state of the environment at the time that the observations are made. The possible state transitions can be described by a state-transition diagram for the environment. FIG. 14A illustrates a portion of a state-transition diagram. Each of the states in the portion of the state-transition diagram shown in FIG. 14A are represented by large, labeled disks, such as disc 1402 representing a particular state $S_n$. The transition between one state to another state occurs as a result of an action, emitted by the manager, that is carried out within the environment. Thus, arrows incoming to a given state represent transitions from other states to the given state and arrows outgoing from the given state represent transitions from the given state to other states. For example, one transition from state 1404, labeled $S_{n+6}$, is represented by outgoing arrow 1406. The head of this arrow points to a smaller disc that represents a particular action 1408. This action node is labeled $A_{r+1}$. The labels for the states and actions may have many different forms, in different types of illustrations, but are essentially unique identifiers for the corresponding states and actions. The fact that outgoing arrow 1406 terminates in action 1408 indicates that transition 1406 occurs upon carrying out of action 1408 within the environment when the environment is in state 1404. Outgoing arrows 1410 and 1412 emitted by action node 1408 terminate at states 1414 and 1416, respectively. These arrows indicate that carrying out of action 1408 by the environment when the environment is in state 1404 results in a transition either to state 1414 or to state 1416. It should also be noted that an arrow emitted from an action node may return to the state from which the outgoing arrow to the action node was emitted. In other words, carrying out of certain actions by the environment when the environment is in a particular state may result in the environment maintaining that state. Starting at an initial state, the state-transition diagram indicates all possible sequences of state transitions that may occur within the environment. Each possible sequence of state transitions is referred to as a "trajectory."

FIG. 14B illustrates additional details about state-transition diagrams and environmental states and behaviors. FIG. 14B shows a small portion of a state-transition diagram that includes three state nodes 1420-1422. A first additional detail is the fact that, once an action is carried out, the transition from the action node to a resultant state is accompanied by the emission of an observation, by the environment, to the manager. For example, a transition from state 1420 to state 1422 as a result of action 1424 produces observation 1426, while transition from state 1420 to state 1421 via action 1424 produces observation 1428. A second additional detail is that each state transition is associated with a probability. Expression 1430 indicates that the probability of transitioning from state $s_1$ to state $s_2$ as a result of the environment carrying out action $a_1$, where s indicates the current state of the environment and s' indicates the next state of the environment following s, is output by the state-transition function T, which takes, as arguments, indications of the initial state, the final state, and the action. Thus, each transition from a first state through a particular action node to a second state is associated with a probability. The second expression 1432 indicates that probabilities are additive, so that the probability of a transition from state $s_1$ to either state $s_2$ or state $s_3$ as a result of the environment carrying out action $a_1$ is equal to the sum of the probability of a transition from state $s_1$ to state $s_2$ via action $a_1$ and the probability of a transition from state $s_1$ to state $s_3$ via action $a_1$. Of course, the sum of the probabilities associated with all of the outgoing arrows emanating from a particular state is equal to 1.0, for all non-terminal states, since, upon receiving an observation/reward pair following emission of a first action, the manager emits a next action unless the manager terminates. As indicated by expressions 1434, the function O returns the probability that a particular observation o is returned by the environment given a particular action and the state to which the environment transitions following execution of the action. In other words, in general, there are many possible observations o that might be generated by the environment following transition to a particular state through a particular action, and each possible observation is associated with a probability of occurrence of the observation given a particular state transition through a particular action.

Figure 15:
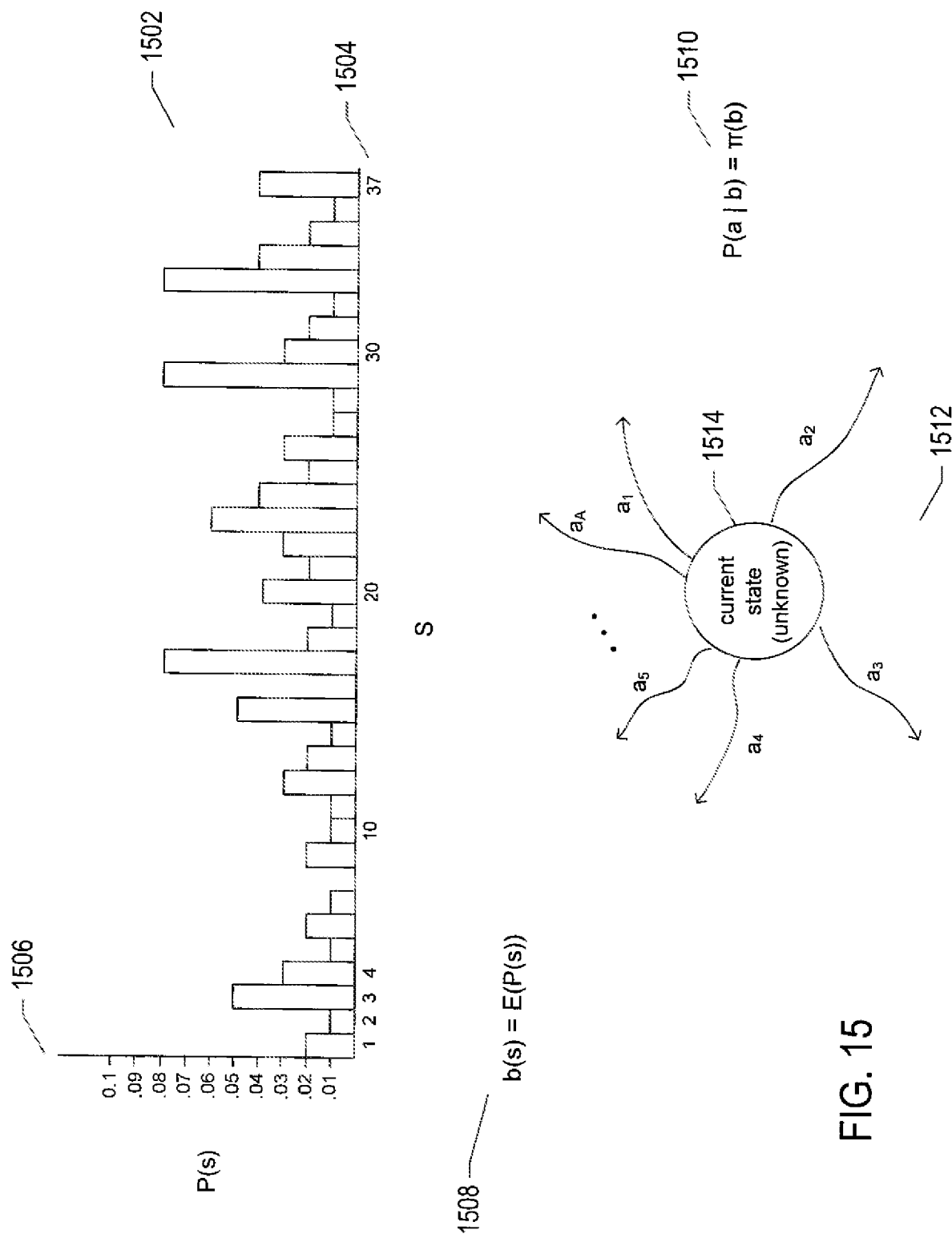
FIG. 15 illustrates the concept of belief.

FIG. 15 illustrates the concept of belief. At the top of FIG. 15, a histogram 1502 is shown. The horizontal axis 1502 represents 37 different possible states for a particular environment and the vertical axis 1506 represents the probability of the environment being in the corresponding state at some point in time. Because the environment must be in one state at any given point in time, the sum of the probabilities for all the states is equal to 1.0. Because the manager does not know the state of the environment, but instead only knows the values of the elements of the observation following the last executed action, the manager infers the probabilities of the environment being in each of the different possible states. The manager's belief b(s) is the expectation of the probability that the environment is in state s, as expressed by equation 1508. Thus, the belief b is a probability distribution which could be represented in a histogram similar to histogram 1502. Over time, the manager accumulates information regarding the current state of the environment and the probabilities of state transitions as a function of the belief distribution and most recent actions, as a result of which the probability distribution b shifts towards an increasingly non-uniform distribution with greater probabilities for the actual state of the environment. In a deterministic and fully observable environment, in which the manager knows the current state of the environment, the policy $\pi$ maintained by the manager can be thought of as a function that returns the next action a to be emitted by the manager to the environment based on the current state of the environment, or, in mathematical notation, $a=\pi(s)$. However, in the non-deterministic and non-transparent environment in which application managers operate, the policy $\pi$ maintained by the manager determines a probability for each action based on the current belief distribution b, as indicated by expression 1510 in FIG. 15, and an action with the highest probability is selected by the policy $\pi$, which can be summarized, in more compact notation, by expression 1511. Thus, as indicated by the diagram of a state 1512, at any point in time, the manager does not generally certainly know the current state of the environment, as indicated by the label 1514 within the node representation of the current date 1512, as a result of which there is some probability, for each possible state, that the environment is currently in that state. This, in turn, generally implies that there is a non-zero probability that each of the possible actions that the manager can issue should be the next issued action, although there are cases in which, although the state of the environment is not known with certain, there is enough information about the state of the environment to allow a best action to be selected.

Figure 16A:
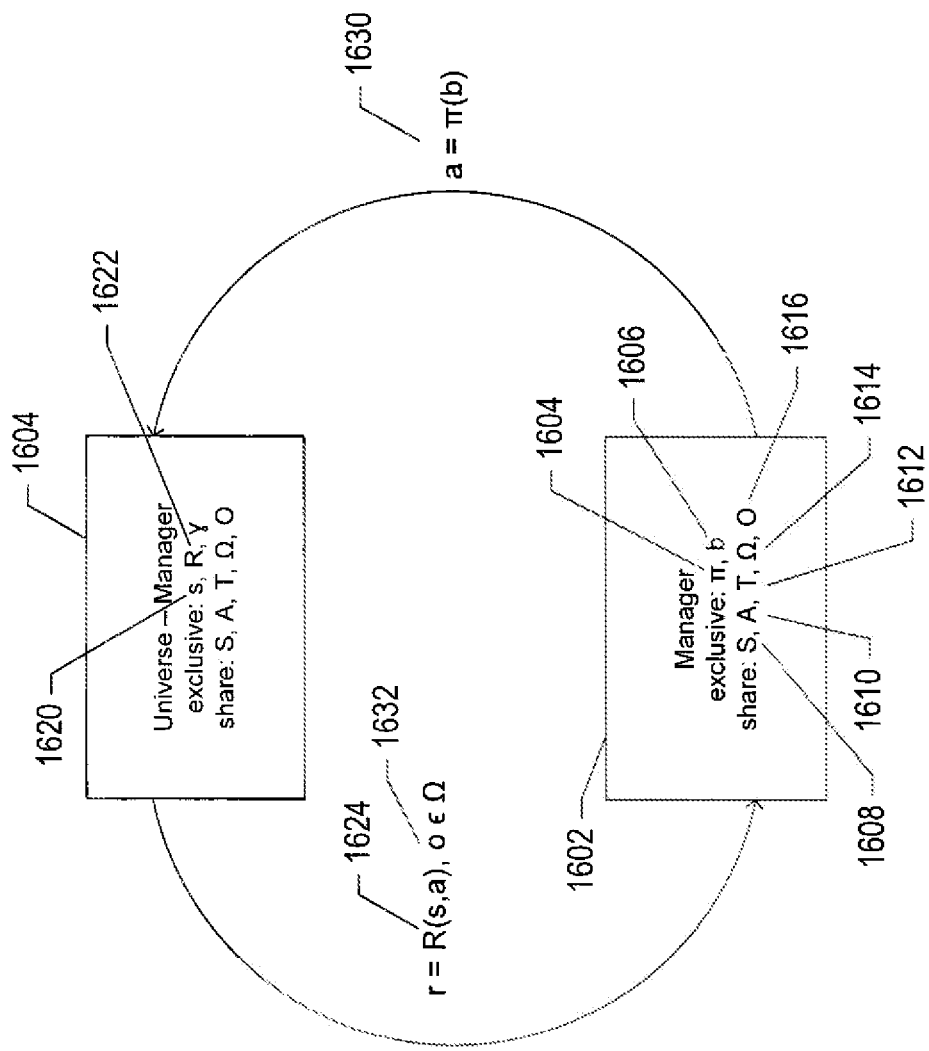
FIGS. 16A-B illustrate a simple flow diagram for the universe comprising the manager and the environment in one approach to reinforcement learning.
Figure 16B:
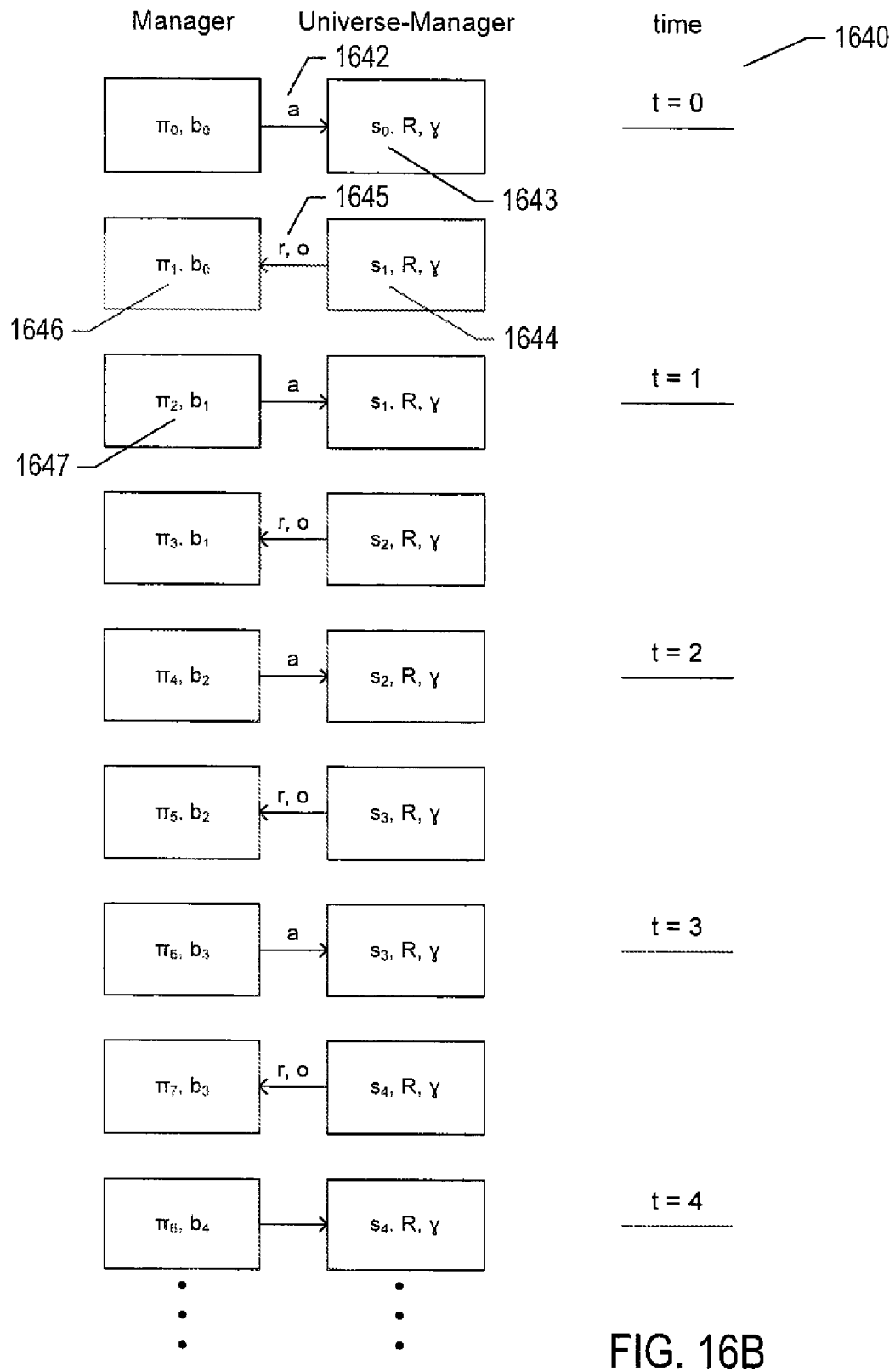

FIGS. 16A-B illustrate a simple flow diagram for the universe comprising the manager and the environment in one approach to reinforcement learning. The manager 1602 internally maintains a policy $\pi$ 1604 and a belief distribution b 1606 and is aware of the set of environment states S 1608, the set of possible actions A 1610, the state-transition function T 1612, the set of possible observations $\Omega$ 1614 and, and the observation-probability function O 1616, all discussed above. The environment 1604 shares knowledge of the sets A, and $\Omega$ with the manager. Usually, the true state space S and the functions T and O are unknown and estimated by the manager. The environment maintains the current state of the environment s 1620, a reward function R 1622 that returns a reward r in response to an input current state s and an input action a received while in the current state 1624, and a discount parameter $\gamma$ 1626, discussed below. The manager is initialized with an initial policy and belief distribution. The manager emits a next action 1630 based on the current belief distribution which the environment then carries out, resulting in the environment occupying a resultant state and then issues a reward 1624 and an observation o 1632 based on the resultant state and the received action. The manager receives the reward and observation, generally updates the internally stored policy and belief distribution, and then issues a next action, in response to which the environment transitions to a resultant state and emits a next reward and observation. This cycle continues indefinitely or until a termination condition arises.

It should be noted that this is just one model of a variety of different specific models that may be used for a reinforcement-learning agent and environment. There are many different models depending on various assumptions and desired control characteristics. In certain models which employ policy-gradient approaches, for example, a belief distribution may not be needed.

FIG. 16B shows an alternative way to illustrate operation of the universe. In this alternative illustration method, a sequence of time steps is shown, with the times indicated in a right-hand column 1640. Each time step consists of issuing, by the manager, an action to the environment and issuing, by the environment, a reward and observation to the manager. For example, in the first time step t=0, the manager issues an action a 1642, the environment transitions from state s0 1643 to $s_1$ 1644, and the environment issues a reward r and observation o 1645 to the manager. As a result, the manager updates the policy and belief distribution in preparation for the next time step. For example, the initial policy and belief distribution $\pi_0$ and $b_0$ 1646 are updated to the policy and belief distribution $\pi_1$ and $b_1$ 1647 at the beginning of the next time step t=1. The sequence of states $\{s_0, s_1, \ldots\}$ represents the trajectory of the environment as controlled by the manager. Each time step is thus equivalent to one full cycle of the control-flow-diagram-like representation discussed above with reference to FIG. 16A.

Figure 17:
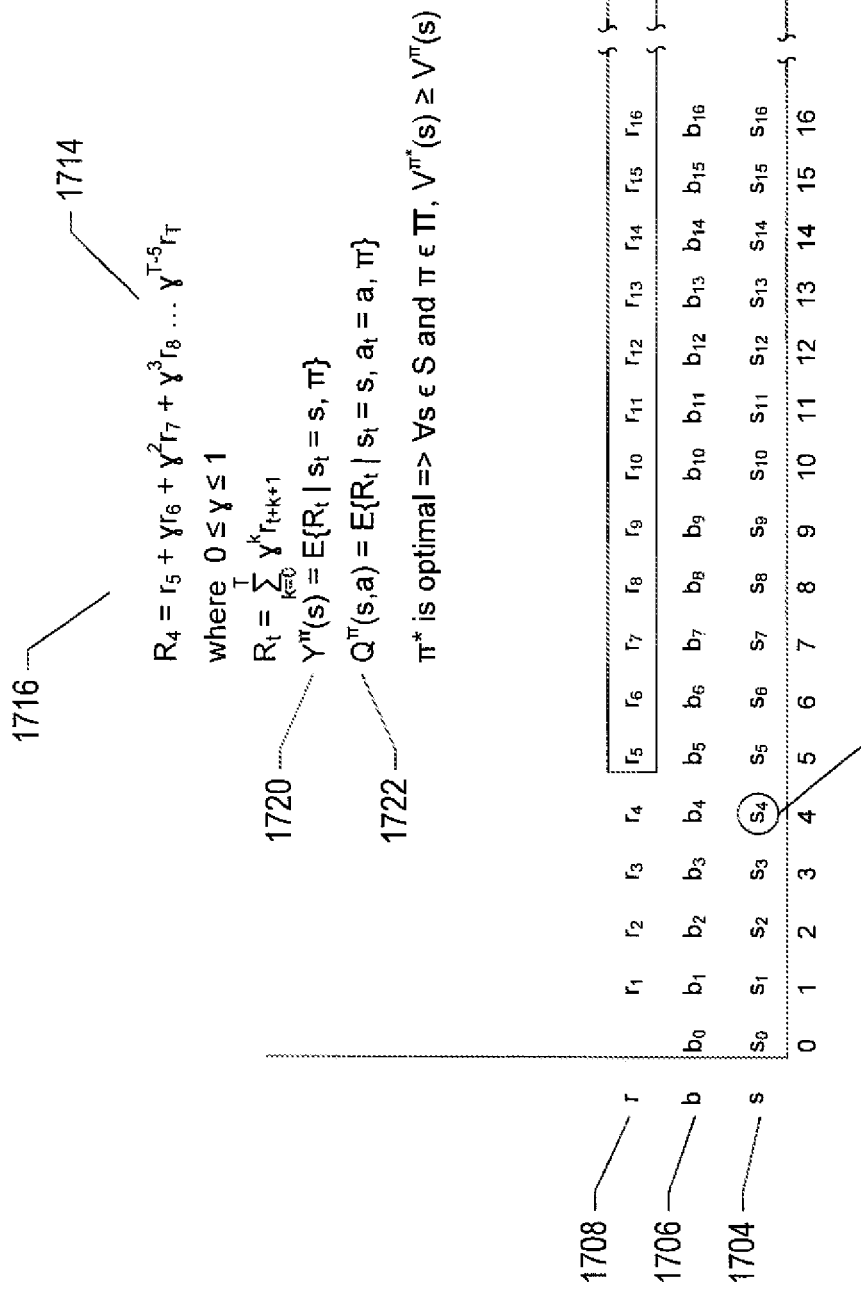
FIG. 17 provides additional details about the operation of the manager, environment, and universe.

FIG. 17 provides additional details about the operation of the manager, environment, and universe. At the bottom of FIG. 17, a trajectory for the manager and environment is laid out horizontally with respect to the horizontal axis 1702 representing the time steps discussed above with reference to FIG. 16B. A first horizontal row 1704 includes the environment states, a second horizontal row 1706 includes the belief distributions, and a third horizontal row 1708 includes the issued rewards. At any particular state, such as circled state $s_4$ 1710, one can consider all of the subsequent rewards, shown for state $s_4$ within box 1712 in FIG. 17. The discounted return for state $s_4$, $G_4$, is the sum of a series of discounted rewards 1714. The first term in the series 1716 is the reward $r_5$ returned when the environment transitions from state $s_4$ to state $s_5$. Each subsequent term in the series includes the next reward multiplied by the discount rate $\gamma$ raised to a power. The discounted reward can be alternatively expressed using a summation, as indicated in expression 1718. The value of a given state s, assuming a current policy $\pi$, is the expected discounted return for the state, and is returned by a value function $V^\pi(\ )$, as indicated by expression 1720. Alternatively, an action-value function returns a discounted return for a particular state and action, assuming a current policy, as indicated by expression 1722. An optimal policy $\pi^*$ provides a value for each state that is greater than or equal to the value provided by any possible policy $\pi$ in the set of possible policies $\Pi$. There are many different ways for achieving an optimal policy. In general, these involve running a manager to control an environment while updating the value function $V^\pi(\ )$ and policy $\pi$, either in alternating sessions or concurrently. In some approaches to reinforcement learning, when the environment is more or less static, once an optimal policy is obtained during one or more training runs, the manager subsequently controls the environment according to the optimal policy. In other approaches, initial training generates an initial policy that is then continuously updated, along with the value function, in order to track changes in the environment so that a near-optimal policy is maintained by the manager.

Figure 18:
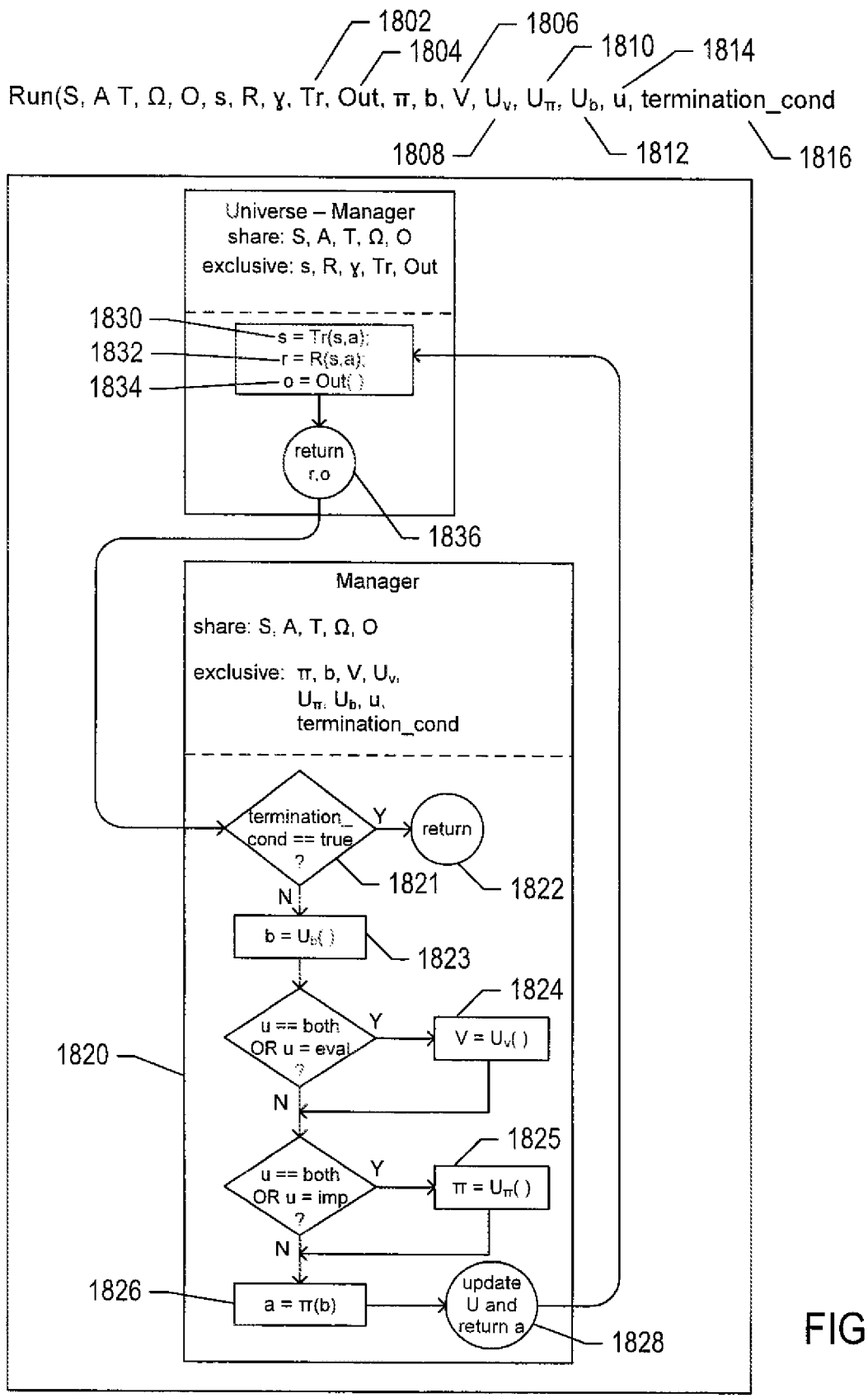
FIG. 18 provides a somewhat more detailed control-flow-like description of operation of the manager and environment than originally provided in FIG. 16A.

FIG. 18 provides a somewhat more detailed control-flow-like description of operation of the manager and environment than originally provided in FIG. 16A. The control-flow-like presentation corresponds to a run of the manager and environment that continues until a termination condition evaluates to TRUE. In addition to the previously discussed sets and functions, this model includes a state-transition function Tr 1802, an observation-generation function Out 1804, a value function V 1806, update functions $U_v$ 1808, $U_x$ 1810, and $U_b$ 1812 that update the value function, policy, and belief distribution, respectively, an update variable u 1814 that indicates whether to update the value function, policy, or both, and a termination condition 1816. The manager 1820 determines whether the termination condition evaluates to TRUE, in step 1821, and, if so, terminates in step 1822. Otherwise, the manager updates the belief, in step 1823 and updates one or both of the value function and policy, in steps 1824 and 1825, depending on the current value of the update variable u. In step 1826, the manager generates a new action and, in step 1828, updates the update variable u and issues the generated action to the environment. The environment determines a new state 1830, determines a reward 1832, and determines an observation 1834 and returns the generated reward and observation in step 1836.

Figure 19:
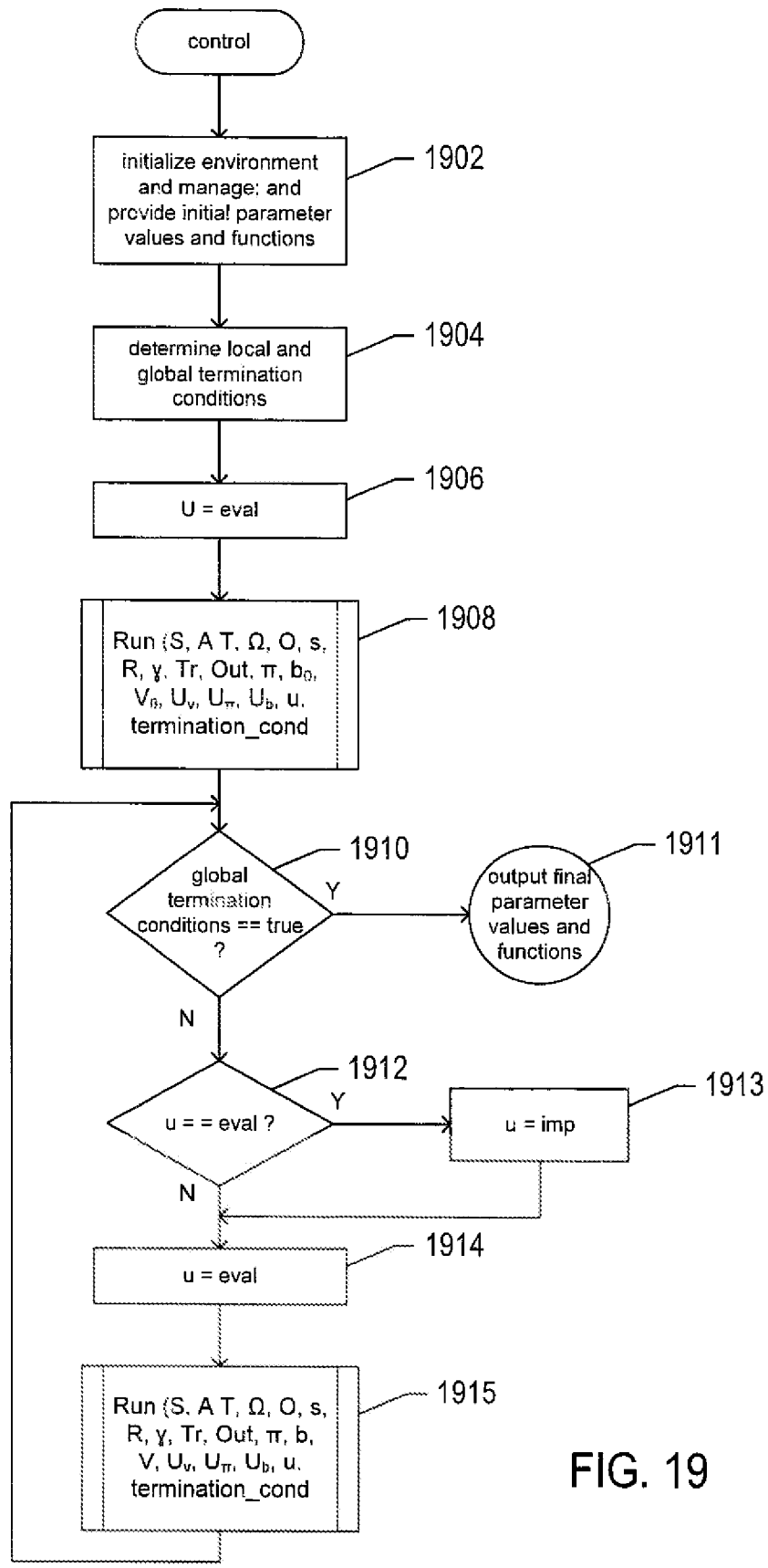
FIG. 19 provides a traditional control-flow diagram for operation of the manager and environment over multiple runs.

FIG. 19 provides a traditional control-flow diagram for operation of the manager and environment over multiple runs. In step 1902, the environment and manager are initialized. This involves initializing certain of the various sets, functions, parameters, and variables shown at the top of FIG. 18. In step 1904, local and global termination conditions are determined. When the local termination condition evaluates to TRUE, the run terminates. When the global termination condition evaluates to TRUE, operation of the manager terminates. In step 1906, the update variable u is initialized to indicate that the value function should be updated during the initial run. Step 1908 consists of the initial run, during which the value function is updated with respect to the initial policy. Then, additional runs are carried out in the loop of steps 1910-1915. When the global termination condition evaluates to TRUE, as determined in step 1910, operation of the manager is terminated in step 1911, with output of the final parameter values and functions. Thus, the manager may be operated for training purposes, according to the control-flow diagram shown in FIG. 19, with the final output parameter values and functions stored so that the manager can be subsequently operated, according to the control-flow diagram shown in FIG. 19, to control a live system. Otherwise, when the global termination condition does not evaluate to TRUE and when the update variable u has a value indicating that the value function should be updated, as determined in step 1912, the value stored in the update variable u is changed to indicate that the policy should be updated, in step 1913. Otherwise, the value stored in the update variable u is changed to indicate that the value function should be updated, in step 1914. Then, a next run, described by the control-flow-like diagram shown in FIG. 18, is carried out in step 1915. Following termination of this run, control flows back to step 1910 for a next iteration of the loop of steps 1910-1915. In alternative implementations, the update variable u may be initially set to indicate that both the value function and policy should be updated during each run and the update variable u is not subsequently changed. This approach involves different value-function and policy update functions than those used when only one of the value function and policy is updated during each run.

Figure 20:
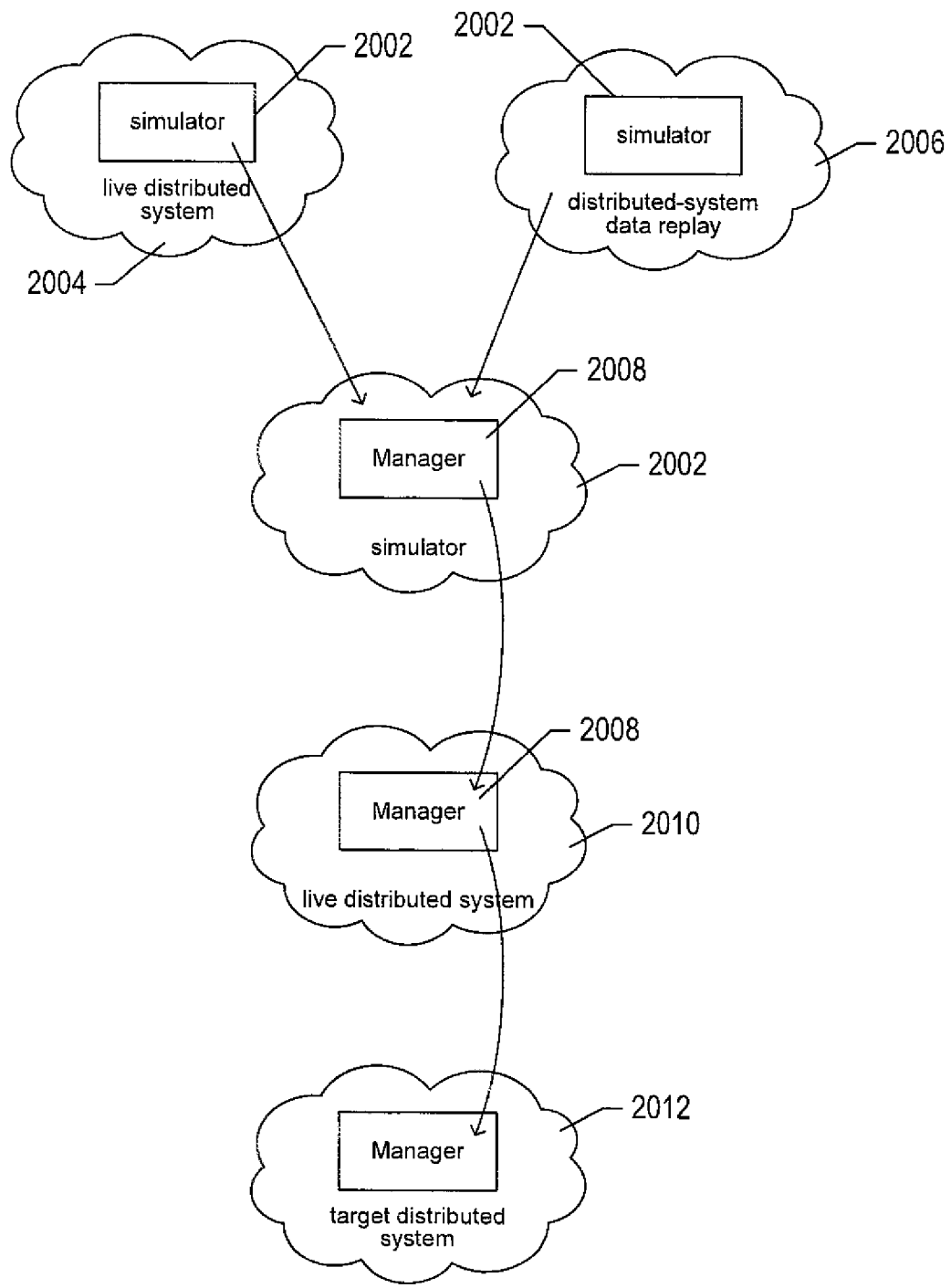
FIG. 20 illustrates one approach to using reinforcement learning to generate and operate an application manager.

FIG. 20 illustrates one approach to using reinforcement learning to generate and operate an application manager. First, reinforcement learning is used to train an environment simulator 2002 by one or both of operating the simulator against a live-distributed-system environment 2004 or against a simulated distributed-system environment that replays archived data generated by a live distributed system to the simulator 2006. Then, a manager 2008 is initially trained by controlling an environment consisting of the simulator 2002. The manager, once trained, is then operated for a time to control an environment comprising a live distributed system 2010. Once the manager has been trained both against the simulator and the live distributed system, it is ready to be deployed to manage an environment 2012 comprising a target live distributed system.

Figure 21:
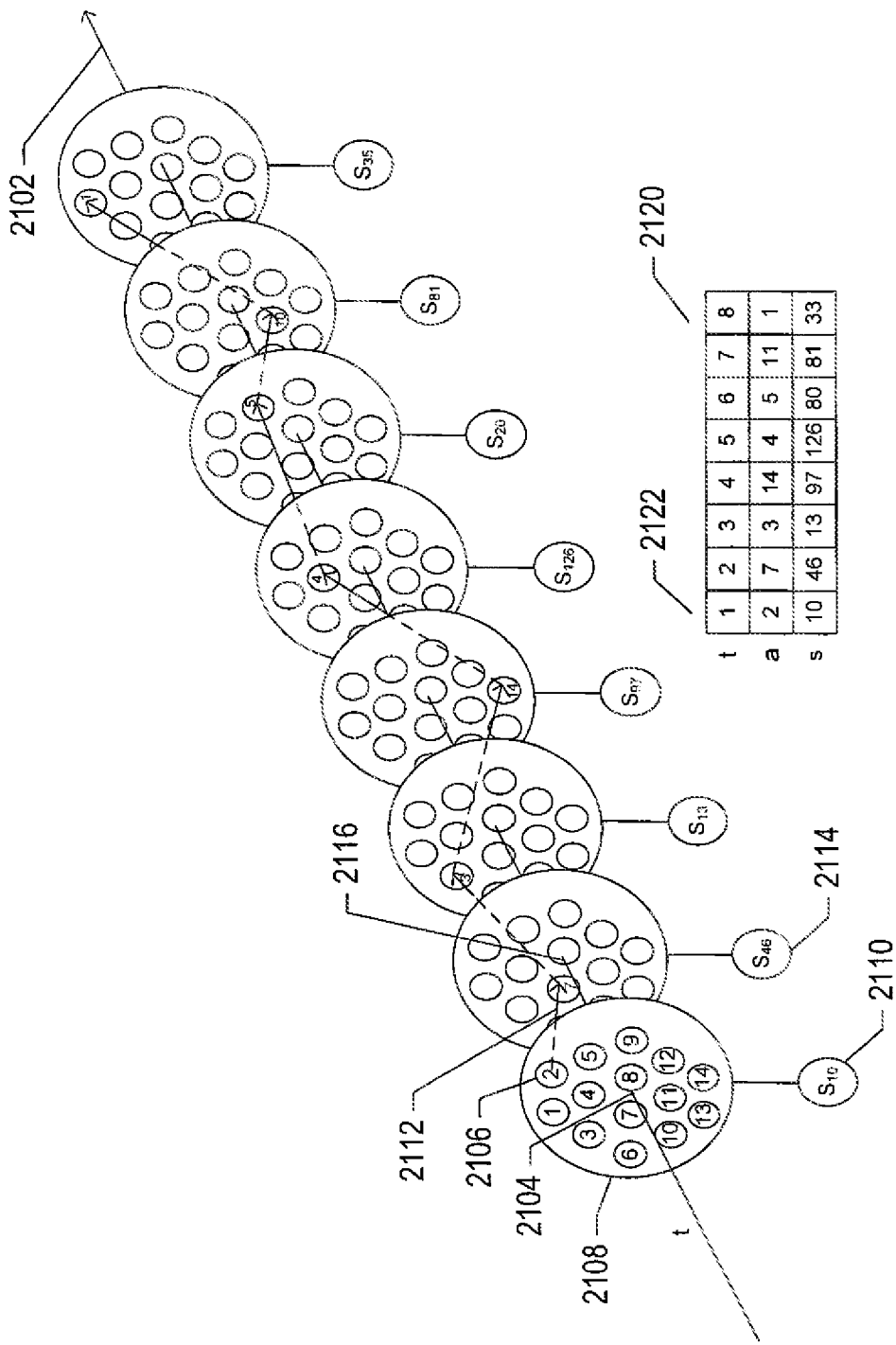
FIG. 21 illustrates an alternative view of a control trajectory comprising a sequence of executed of actions, each accompanied by a managed-environment state change.

FIG. 21 illustrates an alternative view of a control trajectory comprising a sequence of executed of actions, each accompanied by a managed-environment state change. In FIG. 21, arrow 2102 represents a timeline. At the beginning of each of multiple time intervals, a reinforcement-learning-based controller invokes the above-discussed policy π to select a next action from a set of actions A. For example, at the time interval that begins with time 2104, the reinforcement-learning-based controller invokes the policy π to select action 2106, represented as a circle inscribing a numerical label "2," from the set of possible actions A, represented by disk 2108, which contains 14 different possible actions represented by smaller circles that each inscribe a different numeric label. Of course, in real-world situations, there may be hundreds, thousands, tens of thousands, or more different possible actions. The state of the managed-environment, at time 2104, is represented by the circle 2110 inscribing the label "$s_{10}$" indicating the managed-environment state. When the reinforcement-learning-based controller executes the selected action, as represented by arrow 2112, the managed environment transitions to a new state 2114 at a next point in time 2116, where the process is repeated to produce a next action and next state transition. Thus, reinforcement-learning-based control can be thought of as a trajectory through a state/action space. In the simple example of FIG. 21, with both actions and states represented by integers, the state/action space can be imagined as a two-dimensional plane with two orthogonal coordinate axes corresponding to actions and states. A control trajectory can be represented as a table, such as table 2120 shown in FIG. 21, containing three-value columns, such as column 2122, that each includes a time value, an indication of an action, and an indication of the state. Again, as mentioned above, actions and states may be represented by integers, floating-point numbers, and other types of symbols and symbol strings, including character strings.

Figure 22:
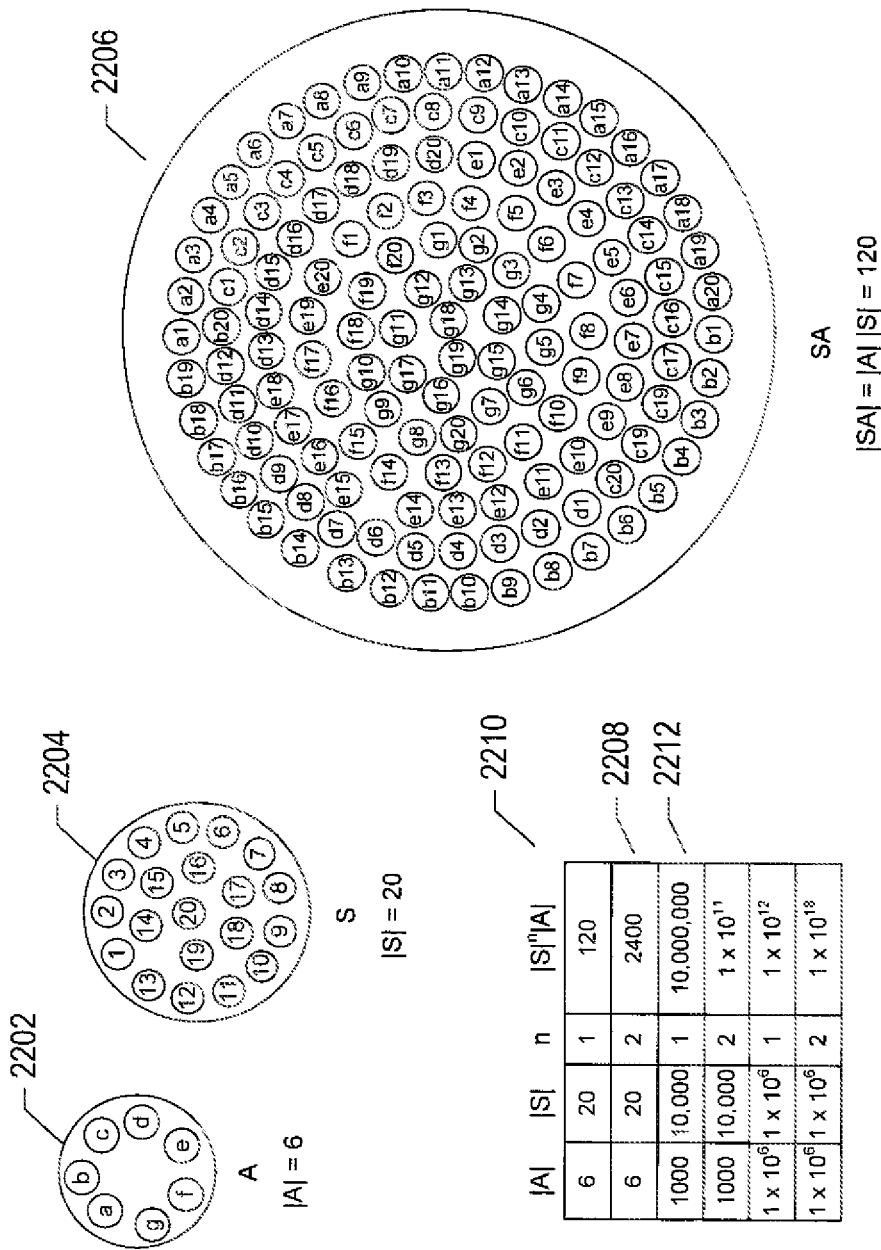
FIG. 22 illustrates the potential sizes of the set of possible state/action pairs.

FIG. 22 illustrates the potential sizes of the set of possible state/action pairs. Using similar illustration conventions as used in FIG. 21, FIG. 22 shows an illustration of a set of actions A 2202, with a cardinality of 6, and a set of states S 2204, with a cardinality of 20. In certain reinforcement-learning-based controller implementations, the policy π is based on an assumed Markov model. In a Markov-model based policy, the policy π selects a next action based on the current managed-environment state or, when the state is unknown to the reinforcement-learning-based controller, on the belief distribution b for the current managed-environment state, as discussed above. The set of possible state/action pairs SA 2206 can be thought of as the set of all possible current-state/next-action control decisions that can be generated from the set of possible actions A and the set of possible states S. For a Markov-based reinforcement-learning-based controller, the number of possible state/action pairs is equal to the product of the cardinalities of the set of possible actions A and the set of possible states S. In the example shown in FIG. 22, the number of possible state/action pairs is 120, even though there are only 6 possible actions and 20 possible states. Other types of reinforcement-learning-based controllers may consider the current state and the preceding state in order to choose a next action. In this case, each possible action-selection decision can be considered to be a triple comprising an action and two states. In this case, the number of possible control decisions is equal to the product of the cardinality of the set of possible actions A and the square of the cardinality of the set of possible states S. In yet other types of reinforcement-learning-based controllers, the n most recent states, including the current state, of the managed environment are considered when making an action-selection decision. The most general expression for the number of possible control decisions is: $|S|^n |A|$. In the case that n equals 2, there are 2400 possible control decisions for the example shown in FIG. 22, as indicated in the second row 2208 of the table 2210 shown in FIG. 22. Of course, in real-world problem domains, there may be very large numbers of different possible actions and states. As shown in the third row 2212 of the table 2210, when there are 1000 possible actions and 10,000 possible states, a controller using a Markov policy, where n is equal to 1, includes 10,000,000 different possible control decisions. It would take on the order of many months of testing time for a controller, given these figures, to sample each possible control decision. For a controller using a policy based on a model for which n is equal to 2, with 1000 possible actions and 10,000 possible states, there are $10^{11}$ different possible control decisions, which would take many thousands of years for controller to sample once each. Thus, in practical, real-world situations, the number of possible control decisions, which represents the state space that a reinforcement-learning-based control system needs to explore in order to find an optimal policy, can be enormous.

Figure 23A:
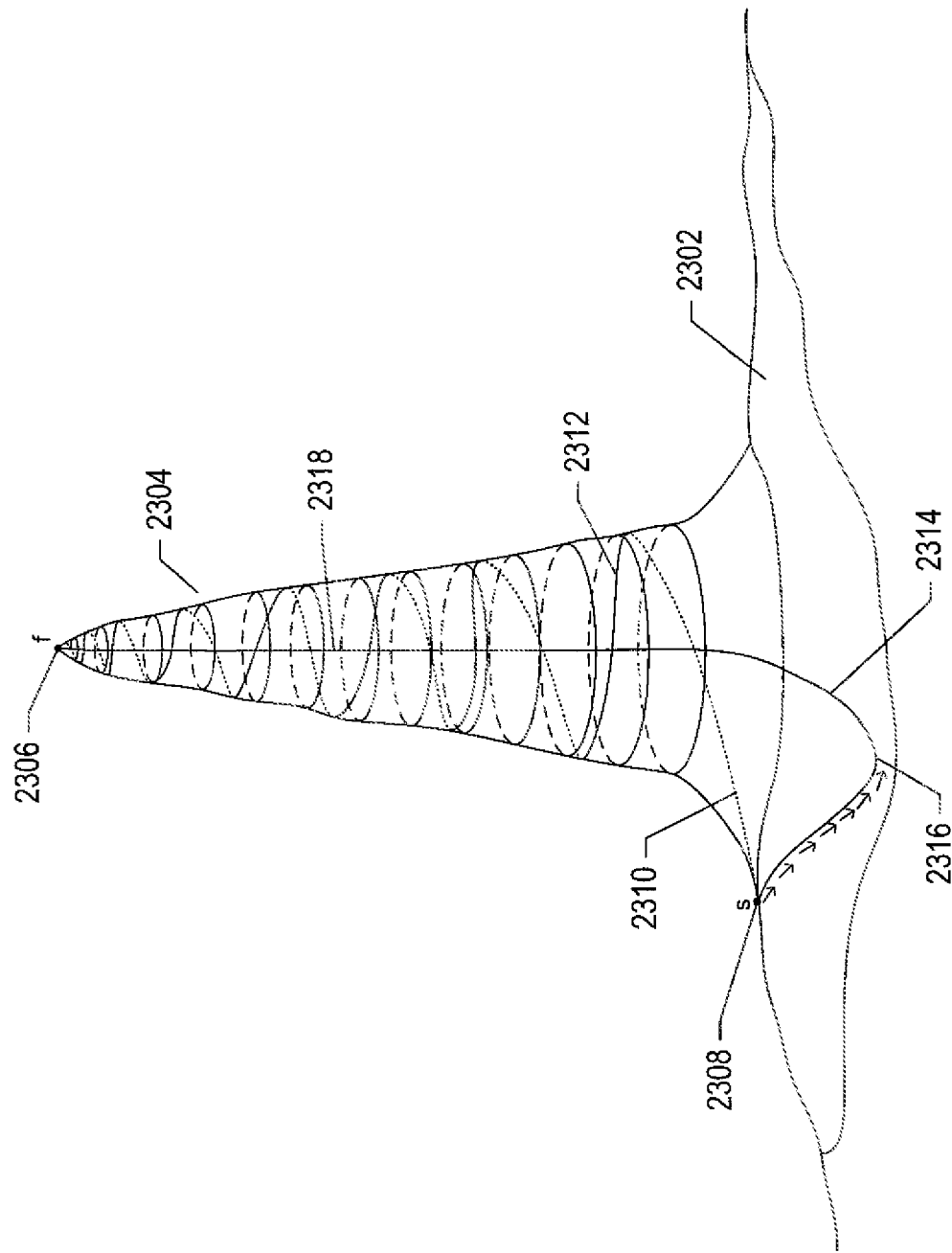
FIGS. 23A-B illustrate the need for state/action exploration by a reinforcement-learning-based controller.
Figure 23B:
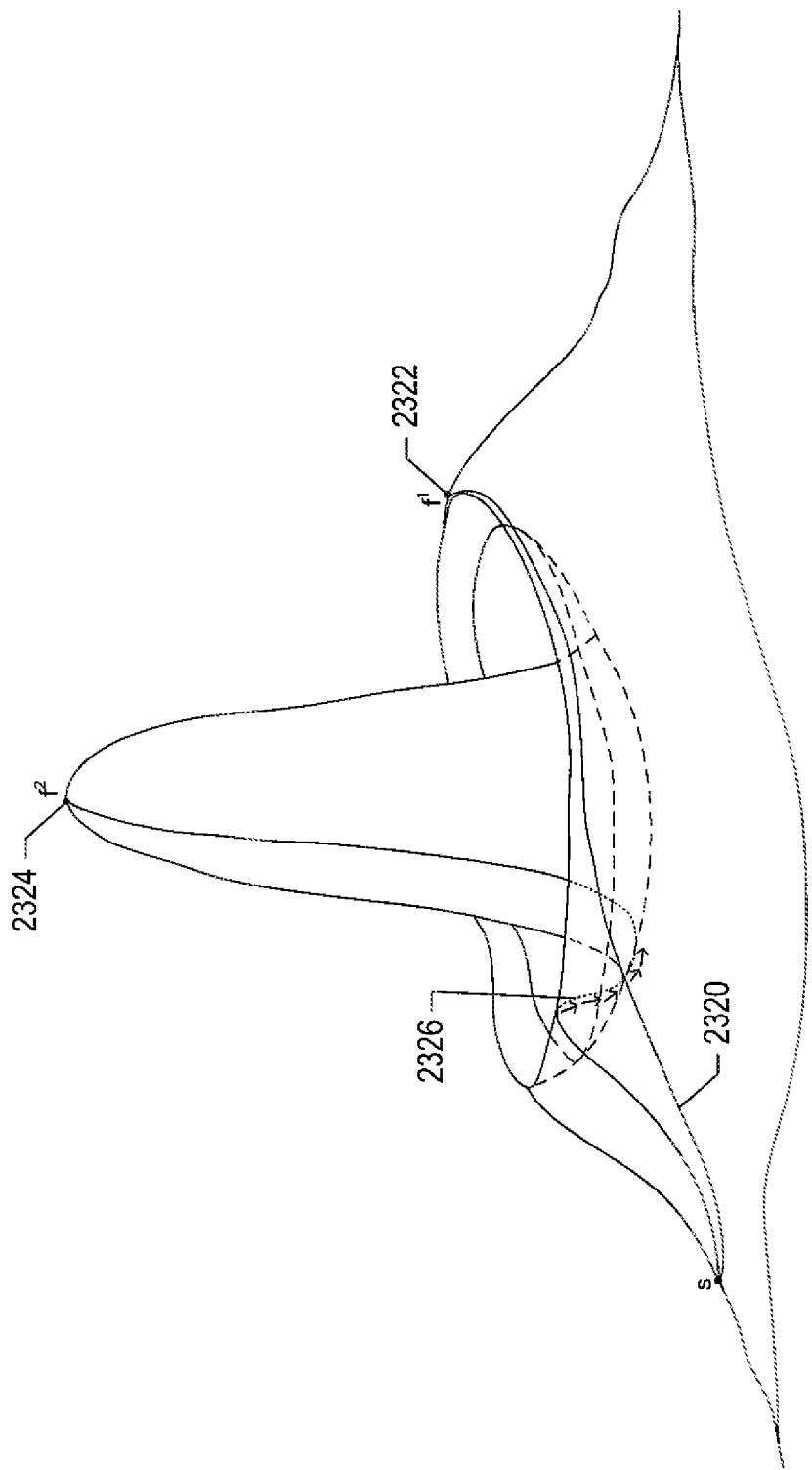

FIGS. 23A-B illustrate the need for state/action exploration by a reinforcement-learning-based controller. FIGS. 23A-B both use the same illustration conventions, next described with reference to FIG. 23A. A portion of a surface 2302 that represents the value or expected reward for state/action pairs includes a rather prominent peak 2304. The point at the summit of the surface 2306 represents a state/action pair that generates the greatest expected reward or value. In static environments, a reinforcement-learning-based controller, over time, seeks to obtain the maximum possible value by reaching point 2306, starting from an initial point 2308. Two different trajectories are shown in FIG. 23A. In non-static environments, the controller seeks to obtain a maximum discounted reward over the most recent window in time. A first trajectory 2310 gradually ascends the peak, initially ascending the back side of the peak, wrapping around to the front side of the peak 2312, and slowly spiraling upward, continuously reaching higher-valued state/action pairs until reaching point 2306. A second trajectory 2314 initially descends to a lower point on the surface 2316 and then directly and steeply ascends 2318 to point 2306. In this case, if the number of actions needed to be taken in order to reach the optimal control decision is a measure of the efficiency of the reinforcement-learning-based controller, the second trajectory 2314 is by far most efficient. However, the second trajectory involves initially carrying out locally suboptimal actions of decreasing value. Of course, this is a somewhat artificial example and illustration, since trajectories would not generally map to quasi-continuous curves and would normally not continuously increase in value, but is intended to show that, unless the reinforcement-learning-based controller carries out a certain amount of state/action space exploration, the reinforcement-learning-based controller cannot discover optimal policies n*. In other words, were the reinforcement-learning-based controller to always select the currently most valuable action, and thus follow a greedy policy, the reinforcement-learning-based controller would generally fail to find the most efficient trajectories. As shown in FIG. 23B, in a different example, a greedy policy may allow a reinforcement-learning-based controller to find a trajectory 2320 that results in discovery of a locally optimal state/action pair 2322, but would not allow the reinforcement-learning-based controller to find the global optimal 2324, since all trajectories leading to the global optimum involve a stretch of non-optimal action selections 2326.

Figure 24:
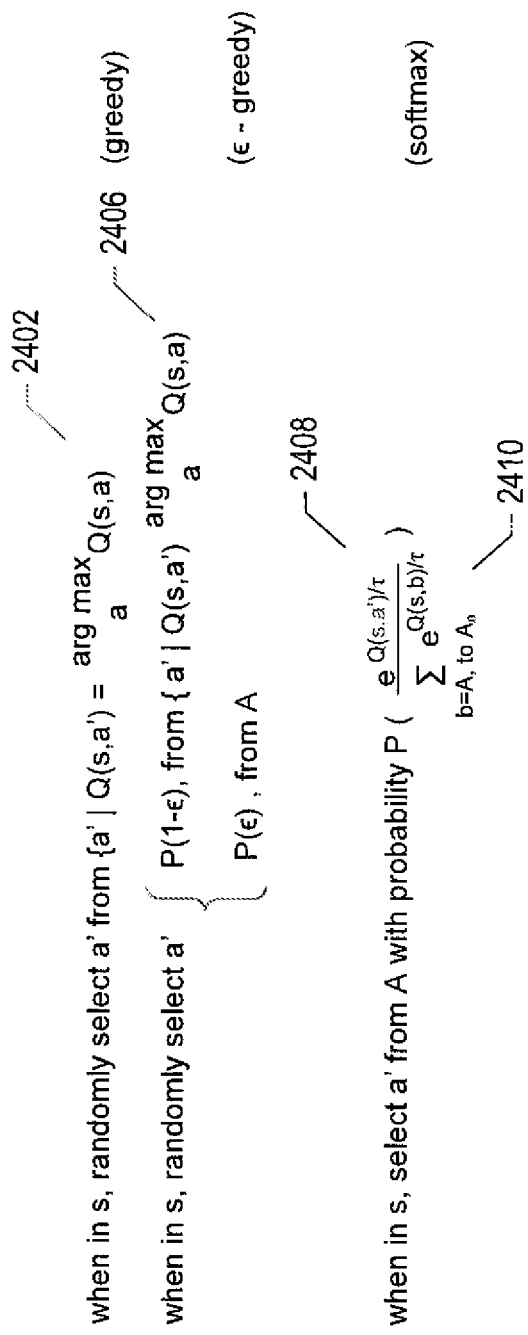
FIG. 24 provides expressions illustrating various types of policies.

FIG. 24 provides expressions illustrating various types of policies. As discussed above, an action-value function $Q^\pi(s, a)$ (1722 in FIG. 17) returns a discounted return for a particular state and action, assuming a current policy $\pi$. A first expression 2402 represents the greedy policy. When the reinforcement-learning-based controller is in a state s, the greedy policy selects a next action a' for which the discounted expected return value is maximum among all possible actions a. As discussed above, the greedy policy generally does not allow a reinforcement-learning-based controller to efficiently find optimally efficient trajectories and optimal state/action pairs, and may not allow a reinforcement-learning-based controller to efficiently find optimally efficient trajectories regardless of the control/learning period during which the reinforcement-learning-based controller operates. The $\epsilon$-greedy policy 2406 selects a next action a' according to the greedy policy with a probability of $1-\epsilon$ and selects a next action randomly from A with a probability of $\epsilon$. In general, $\epsilon$ as a relatively low value, such as 0.1 or 0.01, so that, most of the time, the $\epsilon$-greedy policy selects a next action with the maximum discounted-return value. However, occasionally, the $\epsilon$-greedy policy randomly selects a next action, so that, over time, the reinforcement-learning-based controller tries a wide variety of the many possible control decisions. By exploring the state/action space, the reinforcement-learning-based controller gradually learns to assign accurate discounted expected-return values to the various different state/action pairs so that the policy can be optimized. The SoftMax policy 2408 randomly selects a next action a' from A with the probability 2410, which corresponds to the Boltzmann distribution used in statistical mechanics. When the temperature factor $\tau$ has a low value, approaching 0, the probabilities of selection very dramatically with the estimated discounted return for the state/action, but when the temperature factor $\tau$ has a large value, the differences in the probabilities of selection diminish. Like the $\epsilon$-greedy policy, the SoftMax policy favors selection of an action with the greatest estimated return value, but occasionally selects non-optimal actions in order to facilitate state/action space exploration.

Figure 25:
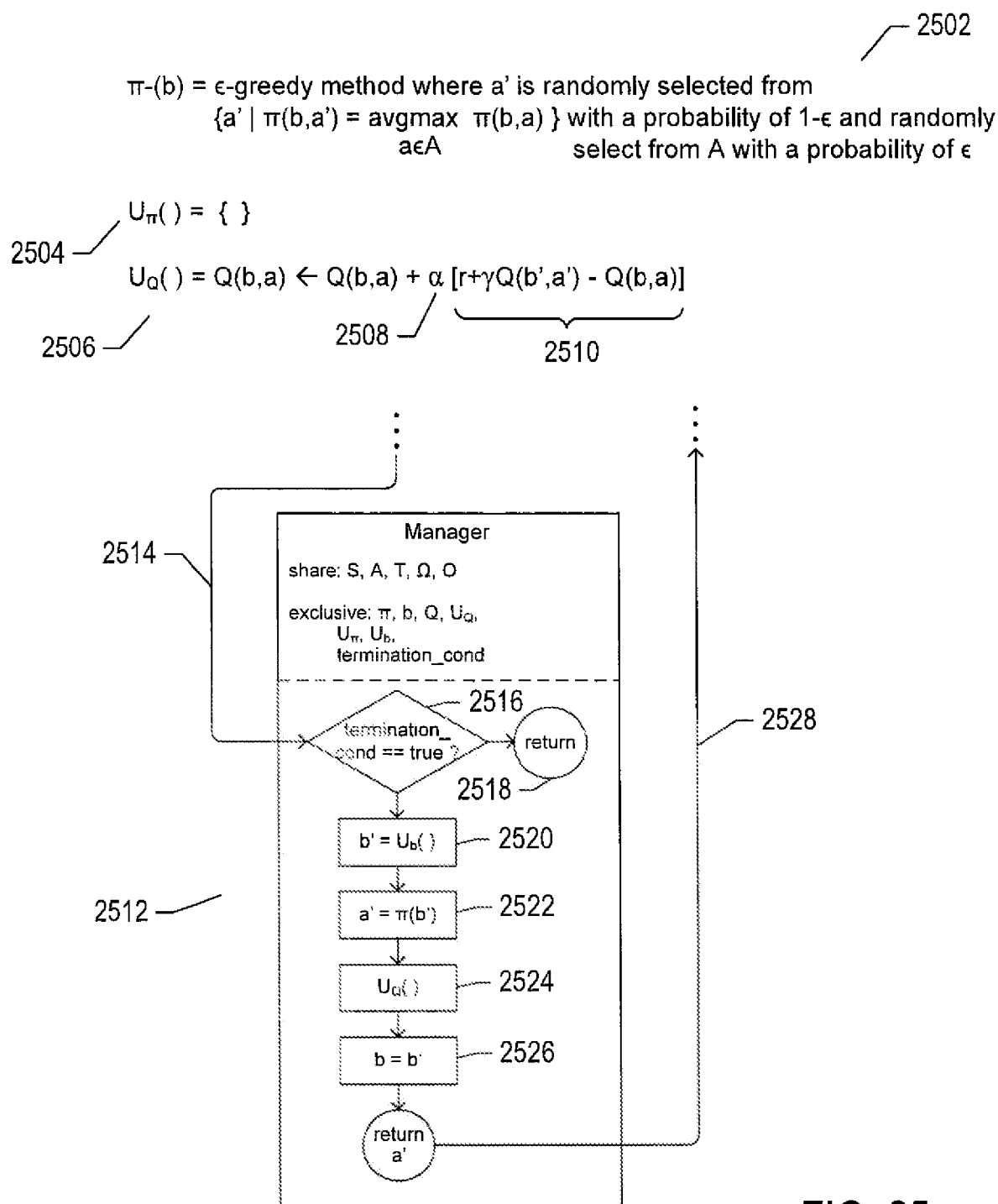
FIG. 25 illustrates one implementation of a reinforcement-learning-based application manager that employs state/action-space exploration via the above-discussed $\epsilon$-greedy policy.

FIG. 25 illustrates one implementation of a reinforcement-learning-based application manager that employs state/action-space exploration via the above-discussed $\epsilon$-greedy policy. As indicated by expression 2502, the policy employed by this implementation, $\pi(b)$, selects a next action a' with maximum estimated value with a probability of $1-\epsilon$ and randomly selects the next action a' from A the probability of $\epsilon$, and is therefore an $\epsilon$-greedy policy. In this implementation, as indicated by expression 2504, there is no explicit policy-update function, unlike the case in the implementation illustrated in FIG. 18. Instead, a state/action-value update function $U_Q(\ )$ 2506 is employed. This function updates the state/action value Q(b,a) by adding to the state/action value Q(b,a) the product of a learning rate $\alpha$ 2508 and an estimate of the most recent return value 2510, where r is the reward received from executing action a, $\gamma$ is the above-discussed discount rate, and b' and a' are the updated belief distribution and new selected action following execution of action a. Diagram 2512 illustrates the application manager logic that replaces the logic 1820 previously shown in FIG. 18. After execution of an action a, the universe returns the resulting reward r and observation vector o via path 2514. If the termination condition has occurred, as determined in step 2516, the application manager terminates, in step 2518. Otherwise, in step 2520, the application manager generates an updated belief distribution b' using the belief-distribution-update function that, in turn, considers the returned observation vector o returned by the managed environment, and, in step 2522, applies the policy (2502) to generate a next action a' using the updated belief distribution b'. Then, in step 2524, the application manager updates the discounted return value for the preceding action and belief distribution using the state/action-value update function 2506. In step 2526, the application manager stores the updated belief distribution as the current belief distribution and then returns the next action a' to the managed environment via path 2528.

As discussed above, for even modest numbers of possible actions and states, the state/action space can be enormous. In many real-world scenarios, there may be enormous numbers of possible actions and states, as a result of which the state/action space may be many tens of orders of magnitude larger than could possibly be practically exhaustively searched by exploration policies. Furthermore, there would be insufficient memory in even the largest distributed computing systems for maintaining current discounted values for each possible state/action pair. For these reasons, as indicated by expression 2530, the reinforcement-learning-based controller uses a parameterized function $Q_t(s,a)$ that returns, at any point in time t, an estimate of the value of the state/action pair s/a. The function $Q_t(s,a)$ is a function of n parameters contained in a parameter vector $\theta_t$. As indicated by expression 2532, the action-value update function $U_Q(\ )$ updates the parameter values via a gradient-descent method rather than updating a stored action value Q(b,a). Thus, at time t+1, the previous parameter vector $\theta_t$ is updated to parameter vector $\theta_{t+1}$.

Control and Learning Processes of Reinforcement-Learning-Based Application Managers In the preceding subsection, reinforcement-learning-based application managers and aspects of the implementations of reinforcement-learning-based application managers were discussed with reference to FIGS. 11A-25. This discussion introduced observation vectors o, actions a, states s, and belief distributions b. Further details are provided in the current subsection.

Figure 26:
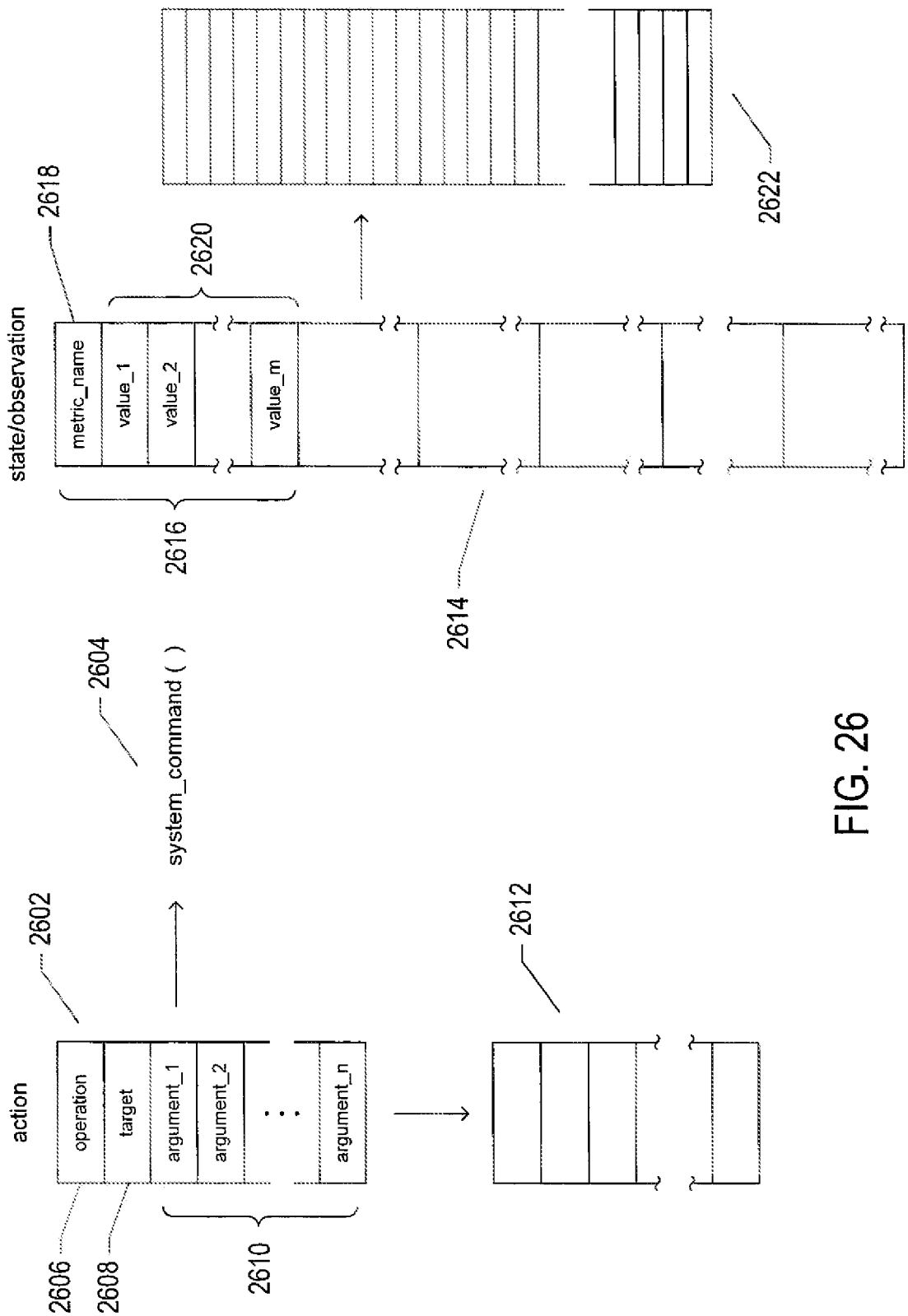
FIG. 26 illustrates actions, states, and observations.

FIG. 26 illustrates actions, states, and observations. In many implementations, an action is a vector of values 2602 that is more or less directly translated into a system command 2604 that is issued by the resource-learning-based application manager to a computational entity within the managed environment, such as a virtual-data-center management server, server computer, data-storage appliance, or other such computational entities. There may be various different numbers and types of values for different types of actions, which may be represented by action templates, but, for purposes of explaining action tags and metric tags, a generalized action format can be considered to comprise an indication of the operation or command, often referred to as an "op code," 2606, an indication of the type of target computational entity for the command 2608, and a number n of arguments 2610, including a target indication, were arguments are commonly floating-point and integer values. As mentioned above, although the values in the action vector 2602 have particular meanings within the managed environment, the above-described reinforcement-learning-based application manager essentially considers actions to be undifferentiated vectors of numeric values 2612 that, in the aggregate, represent a numeric indication of a specific action. Similarly, states vectors and observation vectors, in many implementations, comprise vectors of metrics 2614, where each metric, such as the first metric in the vector 2616, may include a metric name 2618 and m numeric values 2620 that represents the value of the metric. There may be many different types of metrics represented in an observation or state vector. For example, one metric may be the number of current external users or clients who are accessing a distributed application. Another metric might be the total cost, per hour, for the leased virtual machines currently allocated for executing a distributed application. As mentioned above, although the metrics and metric values have particular meanings within the managed environment, the above-described reinforcement-learning-based application manager essentially considers state and observation vectors to be undifferentiated vectors of numeric values 2622. In essence, the above-described reinforcement-learning-based application manager may consider action vectors, state vectors, and observation vectors to each be a single numeric value within a range of numeric values that can be expressed by the number of bits used to encode all of the values in the vectors.

FIGS. 27A-B illustrate one example of a data representation of actions and metrics. This example uses a relational database for storing actions and metrics. Actions are stored in relational-database tables including the table Actions 2702, the table Action_Args 2704, and a variety of additional tables such as the table Action_Constant_Float_Values 2706. Each entry, or role, in the table Actions 2702 represents a different action. Each entry includes the fields: (1) action_ID 2708, a unique identifier for the action; (2) operation 2709, the opcode discussed above; (3) t_type 2710, the type of computational-entity target for the action; (4) numArgs 2711, the number of arguments included in the action; and (5) name 2712, the name of the action. The table Action_Args 2704 stores information about each of the arguments of each of the actions. Each entry in the table Action_Args is associated with an entry in the table Actions 2702 through a common value stored in the field action_ID 2708 and 2714 of both entries. The actual argument values are stored in additional tables, such as table 2706, which stores the floating-point-valued-argument values, with a particular entry in this table associated with an entry in the table Action_Args by the common values in the common two fields action_ID 2714 and 2715 and argNo 2716 and 2717. A similar scheme is used to store metric values in the table Metrics 2720, the table Metric_Fields 2722, and additional field-value tables, such as the action-values table 2706, discussed above.

FIG. 27B illustrates various representational forms of a particular action. The action "addVirtualServer" may be texturally expressed by expression 2730 in the general context of application management. The action is stored in the above-discussed relational-database tables as indicated by the table entries 2732. When the various pieces of information are extracted from the relational database tables, they are used to compose the action vector 2734, and this action vector is directly translated into the system command 2736. A reinforcement-learning-based application manager may more concisely represent the action by expression 2738.

FIG. 28 provides numerous expressions that indicate a generic implementation of several different types of value functions and an $\epsilon$-greedy policy. There are many different types of value functions and policies that may be used in implementing a reinforcement-learning-based application manager. The value functions and policies shown in FIG. 28 are provided to illustrate the nature of value functions and policies. Certain of this information has been discussed using different expressions in the previous subsection. A state-value function $V^\pi(s)$ for a particular policy $\pi$ is represented by expression 2802. This function receives a state vector, as input, and returns a value for the state s, where the value is the expected sum of returns that will accrue during subsequent control of the managed environment, with future values discounted by a discount rate $\gamma$. Expression 2804 provides a similar representation of a state/action-value function $Q^\pi(s,a)$, where the value of state/action pair is the expected cumulative return following execution of the action a when the managed environment is in the state s. Expression 2805 shows the meaning of the state-transition probability $P_{ss'}^a$, which is the probability that, when the managed environment is in the state s and the managed environment executes the action a, the managed environment will transition to the state s'. Expression 2806 shows the meaning of the expected reward $R_{ss'}^a$, which is the expected reward returned by the managed environment, when the managed environment is in the state s, following execution of the action a. Expression 2807 is an expression of an estimate of the state-value function $V^\pi(s)$, expressed as the weighted sum of all of the sums of the return values and discounted subsequent state values for all the possible actions taken from state s. This estimate provides a basis for iterative approaches to determining the state-value function for any particular policy. The three expressions 2808 illustrate the meaning of the optimal state-value and state/action-value functions $V^\pi(s)$ and $Q^\pi(s,a)$, which are the state-value functions and state/action-value functions for the optimal control policies. Finally, expressions 2809 again illustrates an example $\epsilon$-greedy policy, which selects, as a next action, the action corresponding to the state/action pair having the highest value according to the state/action-value function in most cases, but occasionally selects the next action a randomly from the set of possible actions A.

Figure 29A:
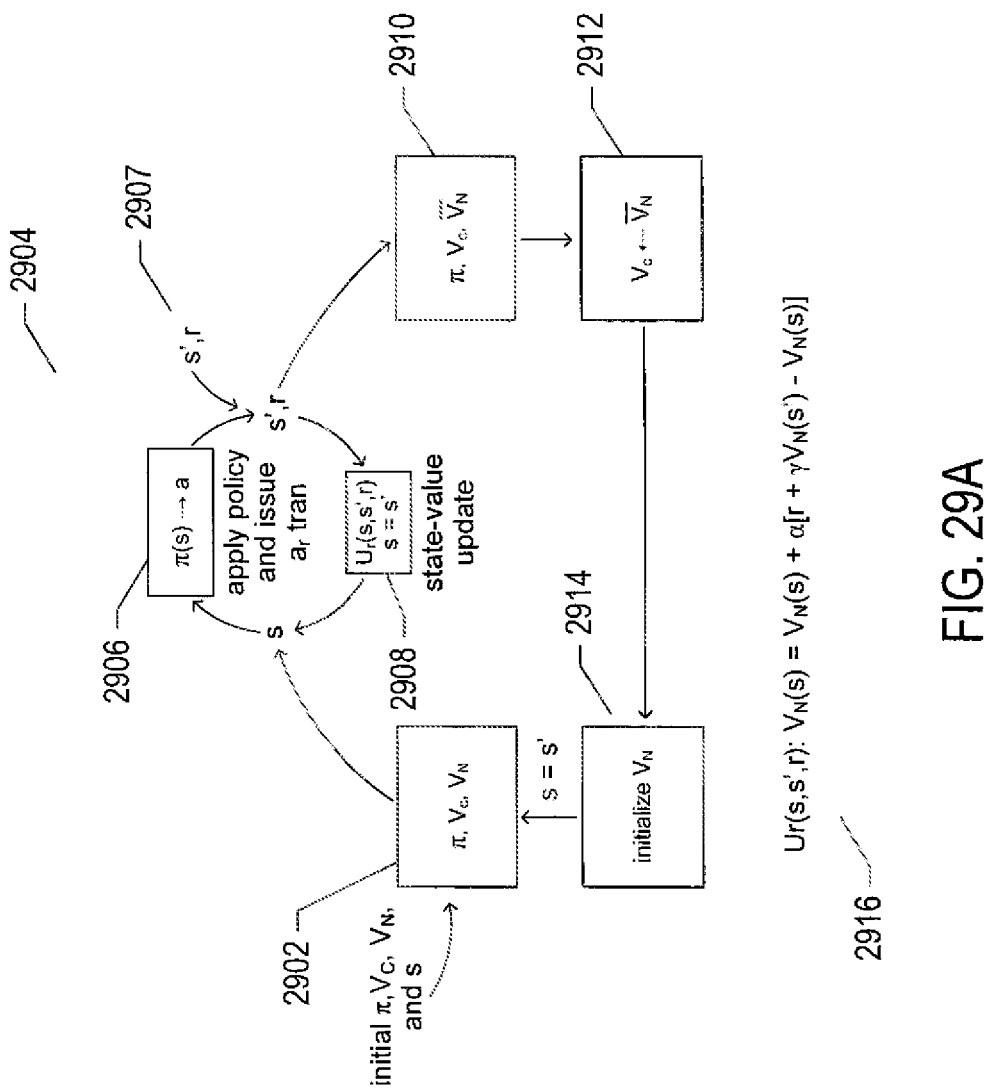
FIGS. 29A-B illustrate two different types of reinforcement-learning control-and-learning schemes that provide bases for three different reinforcement-learning-based application managers.
Figure 29B:
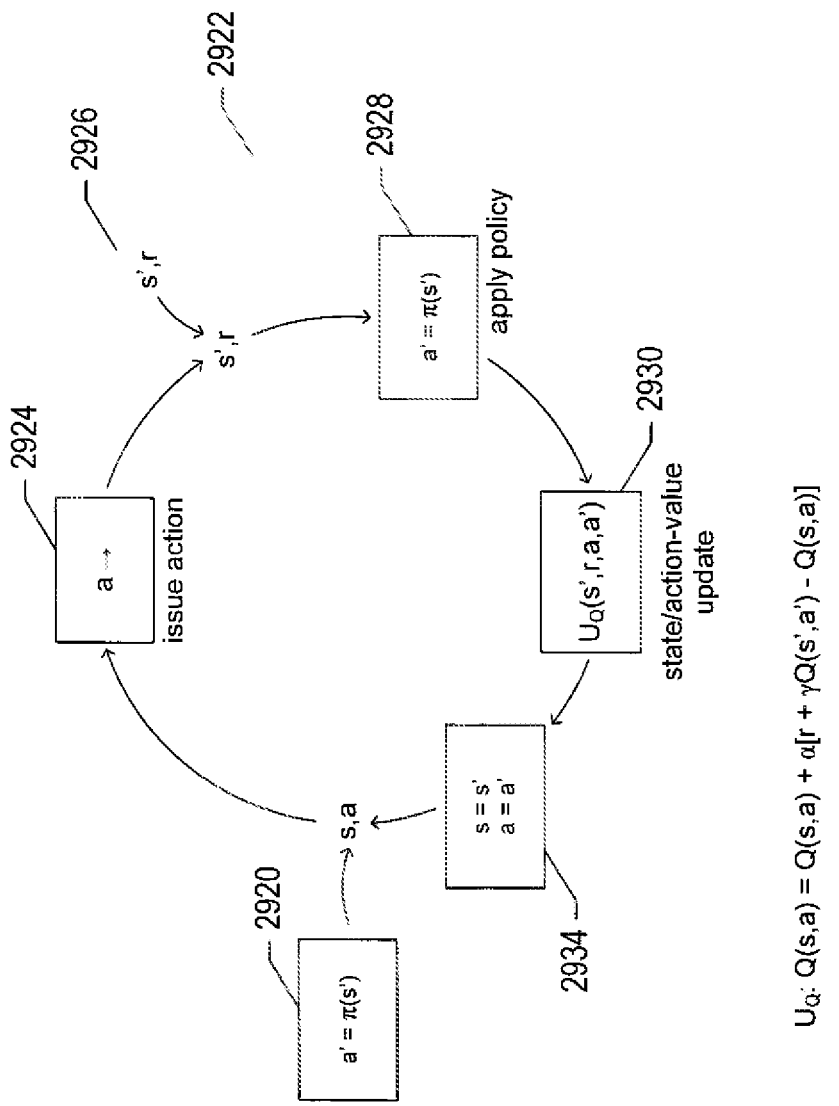

FIGS. 29A-B illustrate two different types of reinforcement-learning control-and-learning schemes that provide bases for three different reinforcement-learning-based application managers. The first implementation, shown in FIG. 29A, uses the $\epsilon$-greedy policy and a current state-value function while learning the next state-value function. The process begins with step 2902, where an initial state, an initial current state-value function $V_C$, and a newly initialized next state-value function $V_N$ are provided to begin a next learning cycle. A learning cycle comprises iterative execution of a control cycle comprising action selection 2906 followed by action execution and input of a next state and reward 2907, in turn followed by update of the next state-value function $V_N$ 2908. The control cycle continues to execute for a period of time needed to generate a reasonably accurate state-value function $V_N$. Step 2910 represents the end of the current learning cycle. In step 2912, the current state-value function is changed to the next state-value function and, in step 2914, a new next state-value function is initialized, after which the process continues with step 2902. Expression 2916 shows a representative state-value function update, where the new value for a current state in which an action has been executed is equal to the sum of the old value of the current state and the product of a learning rate $\alpha$ and the sum of the reward returned from executing the action and the difference between the discounted value of the next state and the old value of the current state. By using the $\epsilon$-greedy policy, the reimbursement-based-learning application manager continues to explore the state/action space, as discussed above in the preceding section of this document. This implementation might be useful when it is expected that the values of states change over time but when a constant policy is desired over periods of time corresponding to the time allocated to each learning cycle.

FIG. 29B illustrates a second reinforcement-learning-based application-manager implementation. In this implementation, an initial action is produced from an initial state, in step 2920, and then a continuous control-and-learning cycle 2922 executes. In step 2924, the next action is executed. In response, the managed environment returns a new state and reward 2926 and then, in step 2928, a new action is generated based on the new state. In step 2930, the state/action-value function Q is updated using an update function $U_Q$ represented by expression 2932. Then, in step 2934, the current state in action are set to the new state received from the managed environment 2926 and the new action generated from that new state in step 2928. This second implementation continuously updates the state/action-value function and continues to explore the state/action space by virtue of using the $\epsilon$-greedy policy.

Currently Disclosed Methods and Systems for Simulator-Based Training of Automated Reinforcement-Learning-Based Application Managers As mentioned above with reference to FIG. 20, extensive training of an automated reinforcement-learning-based application manager is generally necessary before the automated reinforcement-learning-based application manager can be allowed to control a live application, particularly in the case of automated reinforcement-learning-based application managers that control distributed applications within distributed computing systems, due to the large state/action spaces and high dimensionality of state vectors. As also mentioned above with reference to FIG. 20, simulated-based training represents an and efficient and cost-effective approach for initial training of an automated reinforcement-learning-based application manager. As discussed above with reference to FIG. 22, the state/action space for distributed applications running within distributed computing systems is generally enormous, and any method that can provide reasonable initial state/action-space values and other information that would otherwise require time-consuming and costly exploratory learning by an automated reinforcement-learning-based application manager can significantly decrease both the time and cost of training the automated reinforcement-learning-based application manager to the level needed for live control of a distributed application.

Figure 30:
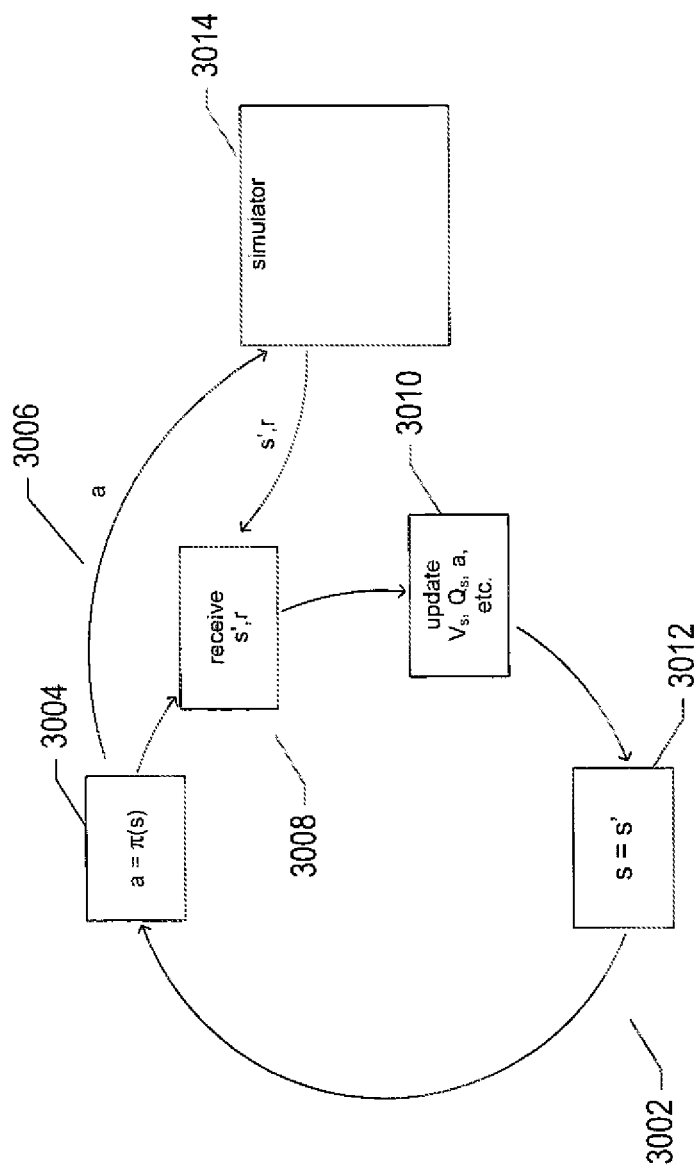
FIG. 30 illustrates one type of simulator that may be used for initial training of an automated reinforcement-learning-based application manager.

FIG. 30 illustrates one type of simulator that may be used for initial training of an automated reinforcement-learning-based application manager. They control cycle 3002 shown on the left side of the figure is an abbreviated representation of the above-discussed control cycles employed by automated reinforcement-learning-based application managers for both control of an application and for learning an optimal or near-optimal control policy. During each cycle, a next action a is selected, in step 3004, using the current control policy and the action is issued 3006 to the managed computing environment. In step 3008, the managed computing environment returns a next state s' and a reward r. In step 3010, the automated reinforcement-learning-based application manager updates state-value and state/action-value functions and the other information through which the automated reinforcement-learning-based application manager learns, over time, a near-optimal or optimal control policy. Finally, in step 3012, the current state is set to the state received in step 3008. In the case of simulator-based training, the next action is issued not to a controlled computing environment, but is issued, instead, to a simulator 3014. The simulator maintains a current state s and simulates execution of the action a by a computing system in state s to obtain the next state s' and generate a reward r, which the simulator returns to the automated reinforcement-learning-based application manager. In general, the simulator is an executable program that runs on one or more computer systems. The simulator uses various different internal machine-learning models to learn state-transition and reward models, during training of the simulator via stored data collected from controlled operation of a computing system. The state-transition and reward models simulate execution of actions during subsequent training of the automated reinforcement-learning-based application manager.

Figure 31:
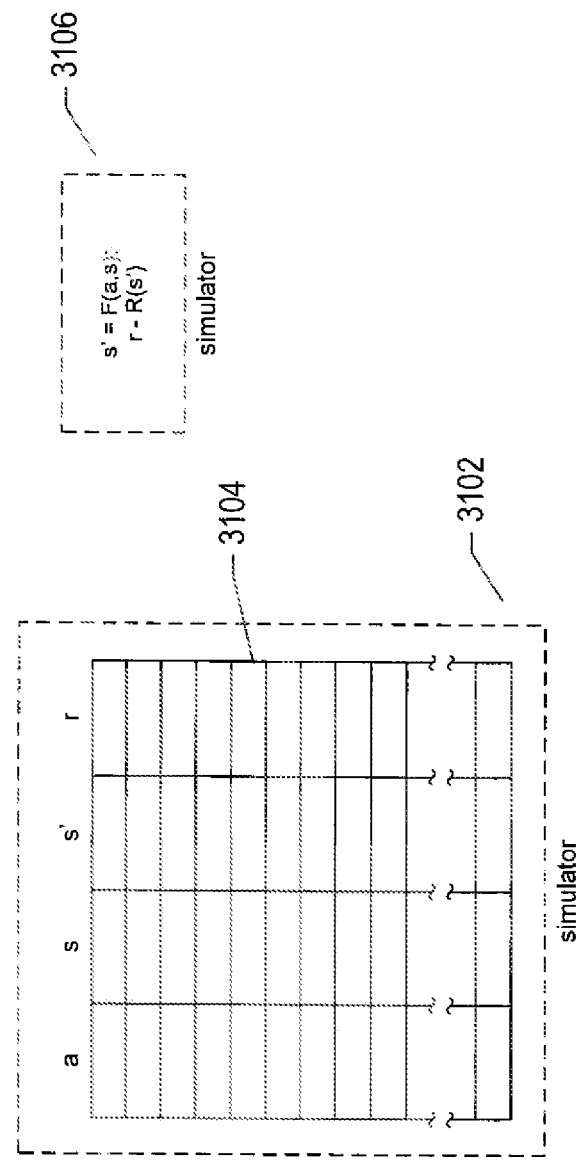
FIG. 31 illustrates several different types of simulator implementations.

FIG. 31 illustrates several different types of simulator implementations. In one implementation 3102, the simulator may encapsulate state transitions and rewards observed in the collected data used during training of the simulator in one or more tables, such as the table 3104 shown in FIG. 31. The table contains entries, each including indications of an action a, a current state s, the state s' to which the simulated system transitions after executing the action a while in state s, and the reward r generated as a result of the state transition. Thus, once learned, this table allows the simulator to simulate operation of a computing environment by simple lookup of the next state and reward for any input action/current-state pair. A more sophisticated table-based system may include multiple different state transitions and corresponding rewards, with associated probabilities, for each action/current-state pair, and the simulator would employ a pseudo-random number generator to select a particular state transition and corresponding reward from the multiple different state transitions and corresponding rewards associated with an input action/current-state pair. A table-based simulator is logically simple and computationally straightforward. However, in general, it is not possible to generate a complete table of state transitions and rewards for each possible action/state pair for a computing environment due to the enormous size of the typical action/state space. A more practical and useful implementation 3106 involves learning a state-transition function s'=F(a,s) and a reward function r=R(s') that simulates an actual computing environment controlled by an automated reinforcement-learning-based application manager. Of course, in almost all practical contexts, the computational complexity of such functions and the computational overheads involved in learning such functions would be as intractable as for a table-based implementation. Instead, parameterized state-transition and reward functions that approximate the behavior of the controlled computing environment are learned by a simulator during simulator training. In general, the more parameters on which the state-transition and reward functions are based, the better they may be able to approximate an actual controlled computing environment, but as the number of parameters increases, the computational complexity and computational overheads involved in learning parameter values geometrically increases. Thus, useful and effective simulators must strike a careful balance between simulation accuracy and computational overheads.

Figure 32:
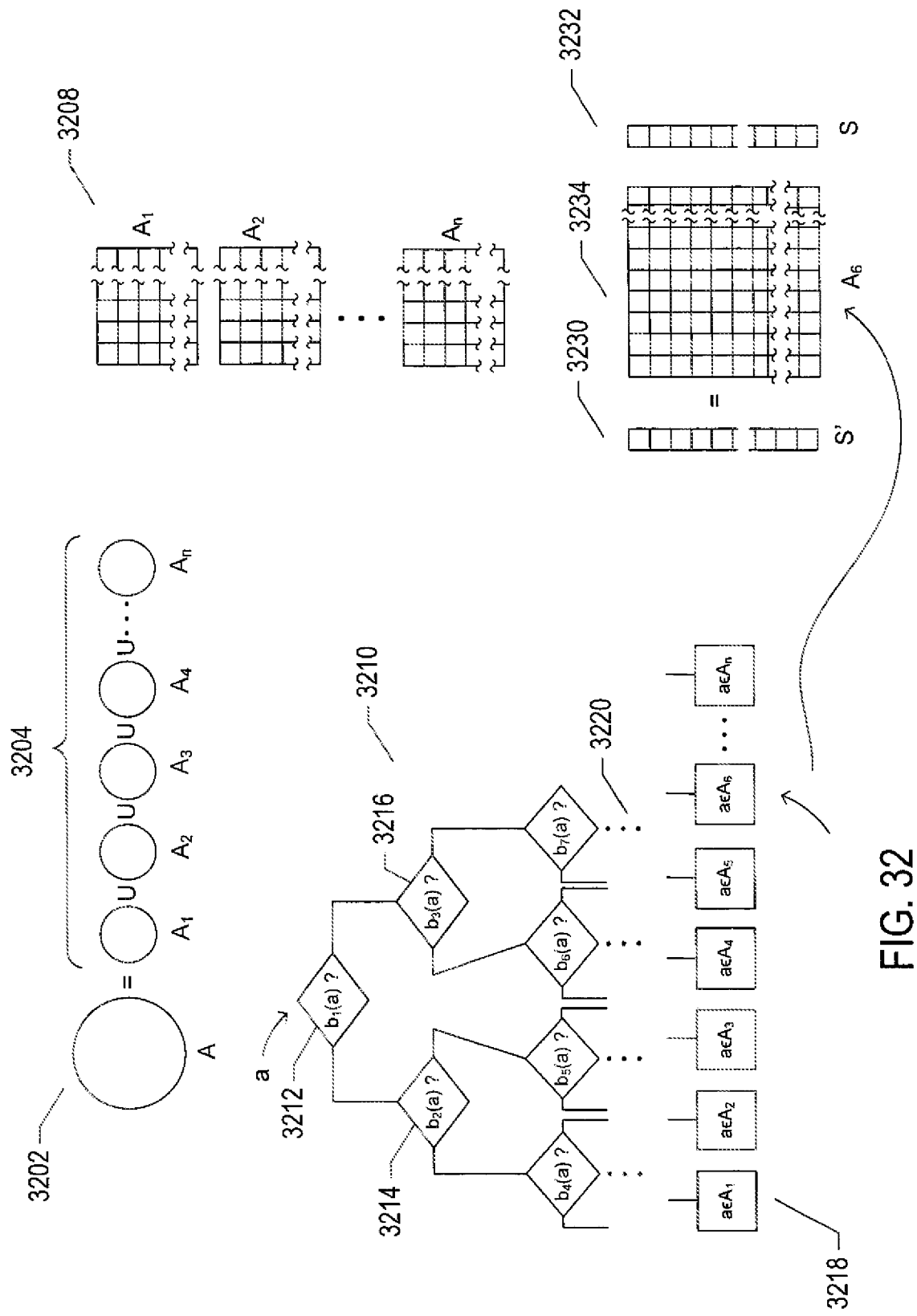
FIGS. 32-33 illustrate example models that may be used to implement a simulator.
Figure 33:
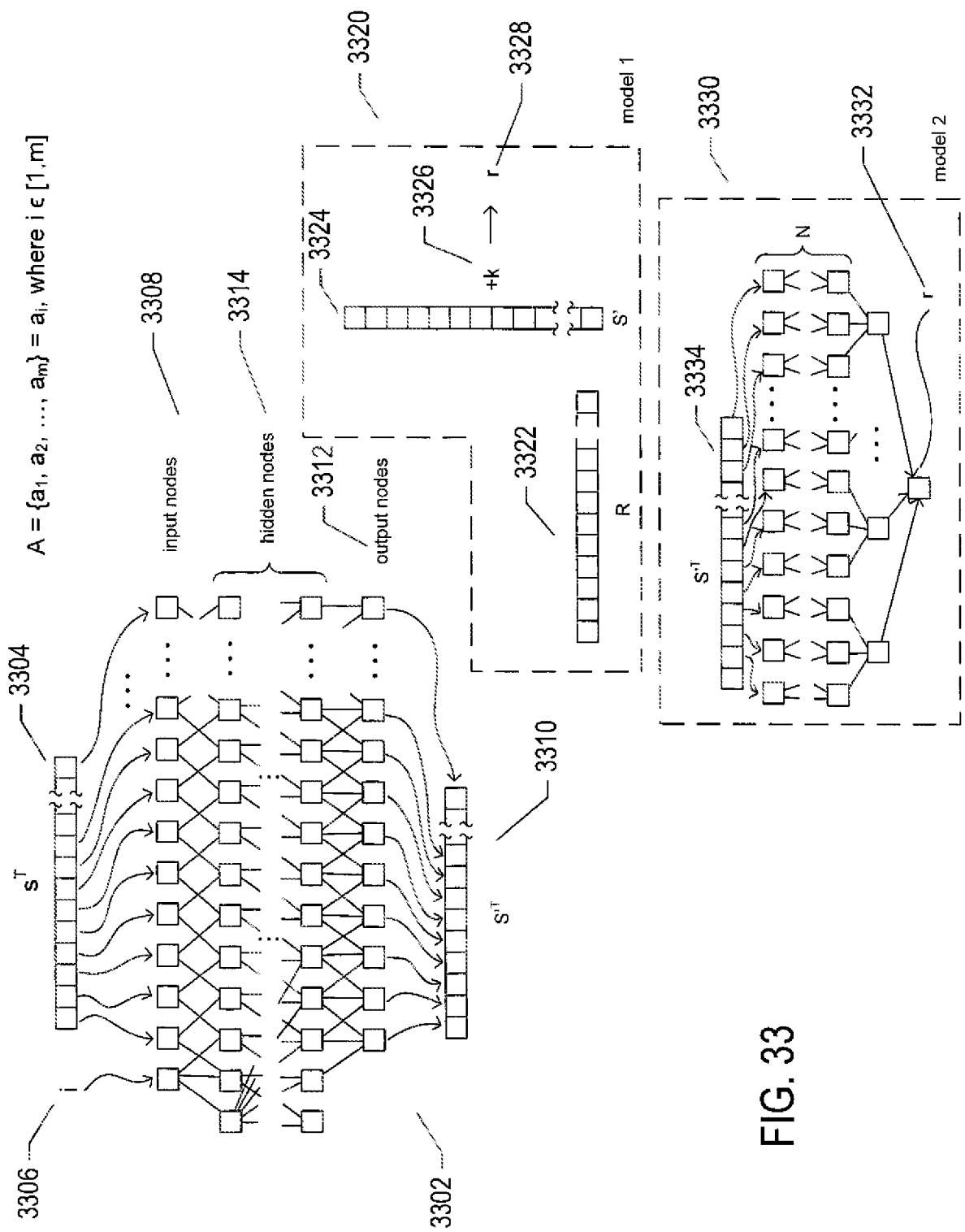

FIGS. 32-33 illustrate example models that may be used to implement a simulator. There are a large variety of different types of machine-learning models that may be incorporated into simulators and therefore a very large number of different possible implementations. The examples shown in FIGS. 32-33 are provided merely as indications of how simulator implementation may be approached, but are not intended that is representative of the very large number of different possible implementations of simulators used for training automated reinforcement-learning-based application managers. In the implementation approach shown in FIGS. 32-33, in order to reduce the computational complexity of the problem domain, the set of actions A 3202 is partitioned into n subsets 3204. Each subset, such as subset $A_1$ 3206, is associated with a matrix, such as matrix $A_1$ 3208. Any particular action a can be associated with an action subset using a decision tree 3310. The action a is submitted to the root node 3212 of the decision tree, and application, to the action, of a Boolean function within the node leads to selection one of two child nodes 3214 and 3216 of the root node. By successive application of Boolean functions within the nodes along a traversal path, the decision tree is traversed to a leaf node, such as leaf node 3218, where input action a is assigned to one of the action subsets. Ellipses are used, such as ellipsis 3220, to indicate that additional levels of nodes are present within the decision tree. Thus, for any action/state pair, the action extracted from the action/state pair can be assigned to a particular action subset via the decision tree 3210, and then a next state 3230 is obtained by multiplying the current state 3232 extracted from the action/state pair by the matrix 3234 associated with the action subset to which the action extracted from the action/state pair has been assigned. State transitions are thus linear functions of the input state and an action class corresponding to the input action.

FIG. 33 shows an alternative approach to modeling state transitions, in which a neural network 3302 is employed rather than the linear model discussed above with reference to FIG. 32. A current state vector 3304 and the index of the action extracted from an input state/action pair 3306 are input to the input nodes 3308 of the neural network 3302. A next state 3310 is produced at the output nodes 3312 of the neural network. The neural network generally includes multiple hidden-node layers 3314. Neural networks are essentially nonlinear parameterized functions. In a first model 3320, the reward function is simulated by a linear function of the elements of the state vector input to the reward function. A dot product of a simulated-reward-function array R 3322 and the input state vector 3324 is added to a constant 3326 in order to produce a simulated or estimated reward r 3328. In an alternative model 3330, a neural network is used to produce an estimated reward r 3332 from an input state vector 3334.

Figure 34:
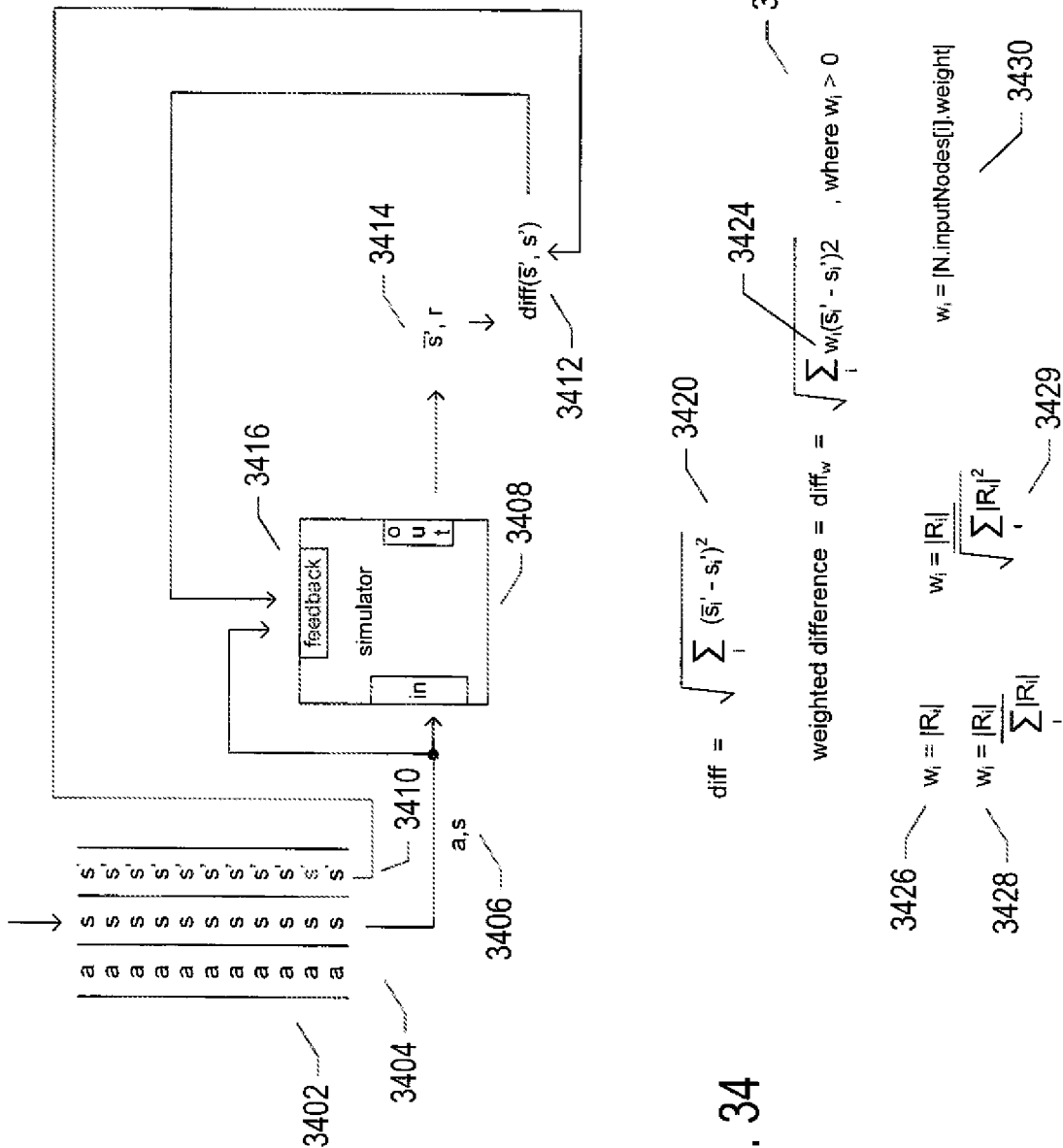
FIG. 34 illustrate simulation training and a difference metric used in certain implementations of the currently disclosed methods and systems.

FIG. 34 illustrate simulation training and a difference metric used in certain implementations of the currently disclosed methods and systems. As mentioned above, a simulator must first be trained, using data collected from a controlled computing environment, in order to determine the values for the parameters of parameter-based model functions used to implement the simulator, as discussed above with reference to FIGS. 31-33. The data collected from a controlled computing environment can be thought of as a sequence of action/current-state/next-state triples 3402.

These triples are successively fed into the simulator and used to produce a difference metric following output of a next state and reward by the simulator, and the difference metric is then fed back into the simulator, along with the action/current-state/next-state triple to adjust parameter weights within the simulator. Thus, the next action/current-state/next-state triple 3404 is split into an action/state pair 3406 that is fed into the simulator 3408 and a next state 3410 that is input to a different-metric function 3412 along with the estimated next state 3414 produced by the simulator in response to input of the action/state pair 3406 to the simulator. The difference metric produces an indication of the magnitude of the disparity between the actual next state 3410 and the simulator's estimate of the next state 3414, which is fed back into the simulator 3416 along with the action/state pair so that the parameter values for the model functions can be adjusted towards producing a better estimate of the next state. In addition, the parameters for the reward function are adjusted, over time, to estimate the reward function that would have led to the sequence of action/current-state/next-state triples. Alternatively, when the reward can be captured in the collected data, a difference between the estimated reward and actual reward can be fed back to the simulator for more direct adjustment of reward-function parameters. In this implementation, the training interface for the simulator is different from the control interface provided to the automated reinforcement-learning-based application manager during training of the automated reinforcement-learning-based application manager. The training interface accepts both an action and a current state, while, during training of the automated reinforcement-learning-based application manager, the control interface accepts only an action, with the current state maintained by the simulator and automated reinforcement-learning-based application manager. In alternative implementations, the training and control interfaces are identical.

Traditionally, the difference-metric function used for training machine-learning models has been the Euclidean difference metric 3420 which computes the distance between the two points, represented by two input state vectors, in a high-dimensional real space. However, in the context of training a simulator that will be used for training an automated reinforcement-learning-based application manager, the Euclidean difference metric is associated with significant problems. One problem is that the values of the different metrics included in the state vectors may vary over different periods of time, depending on different measurement frequencies, which can lead to significant biasing towards more frequently measured metrics. Another problem is that different metrics within the state vector may contribute differently to the overall changes in state that occurs as a result of execution of actions, and there is usually a significant noise component in the metric-value measurement. Because of the high dimensionality of state vectors, noise associated with relatively insignificant metric values can mask trends in the values of those metrics that are significant with respect to state transitions. To overcome these problems, the currently disclosed methods and systems employ a weighted difference metric 3422, where the squares of the differences between the metric values in the terms i of a linear combination are each weighted by a weighting factor $w_i$ 3424. The weights represent the relative significances of the terms to the difference metric used for feedback training. One source of weights are the elements of the reward-function vector R, discussed with reference to FIG. 33, which are learned during simulator training. In one implementation, the weights used in the weighted-difference-metric function are the absolute values of the elements of the reward-function vector R 3426. In alternative implementations, normalized values of the elements of the reward-function vector R are used 3428 and 3429. When the second neural-network model 3330 is used for the reward function, the absolute values of the weights of the input nodes of the neural network may be employed as the weights for the weighted-difference-metric function 3430.

Figure 35:
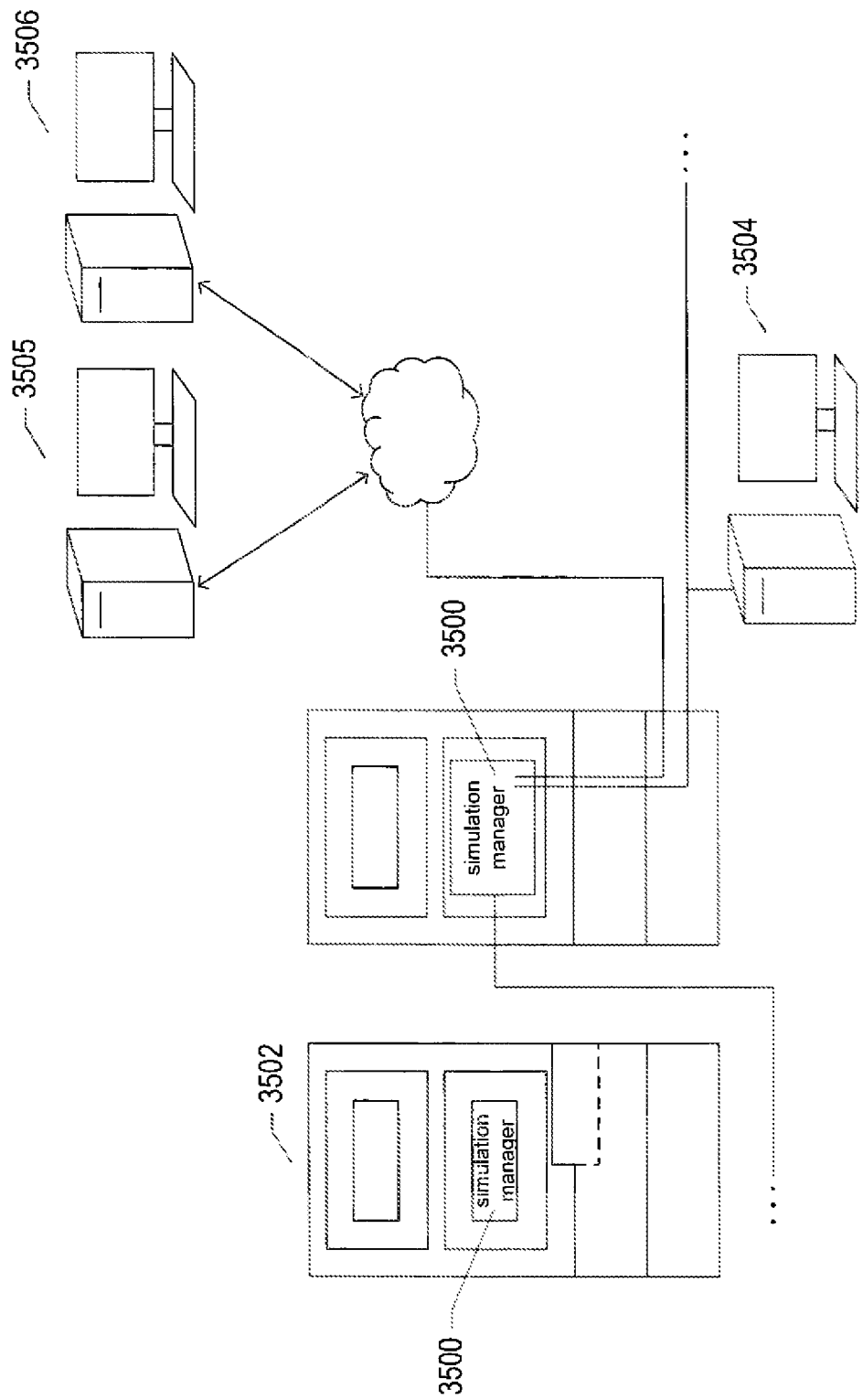
FIG. 35 illustrates simulator management.

FIG. 35 illustrates simulator management. A distributed simulation manager 3500 executes on multiple server computers 3502-3503 within a distributed computing system. The simulation manager is responsible for generating and training simulators and then carrying out simulator-based training of automated reinforcement-learning-based application managers. The simulation manager provides an execution environment for simulators to which the automated reinforcement-learning-based application managers are connected for initial training. The simulation manager 3500 additionally provides a management interface, on various processor-controlled devices 3504-3506, through which human users can monitor and manage simulator generation, training, and application to training automated reinforcement-learning-based application managers.

Figure 36A:
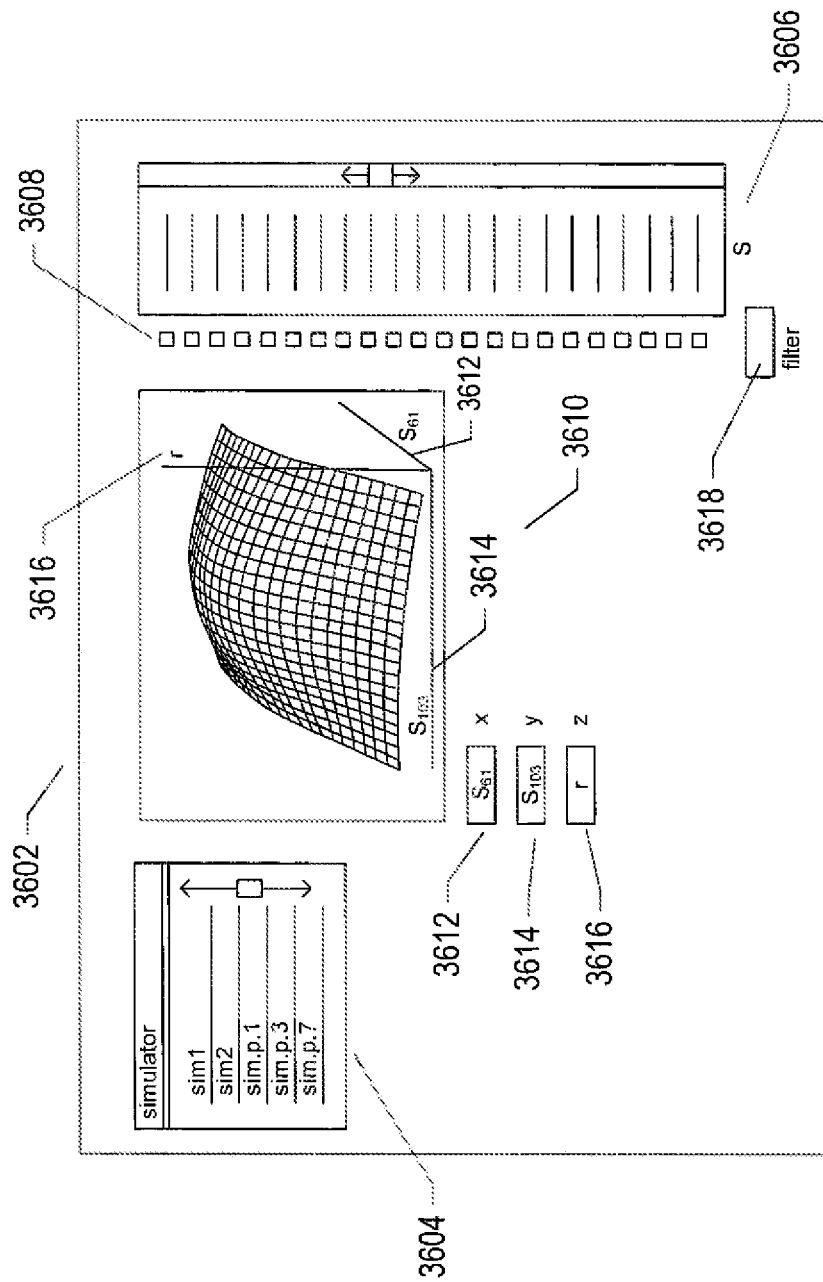
FIGS. 36A-B illustrate one simulator-monitoring facility provided by the management interface provided by the simulation manager, discussed above with reference to FIG. 35.
Figure 36B:
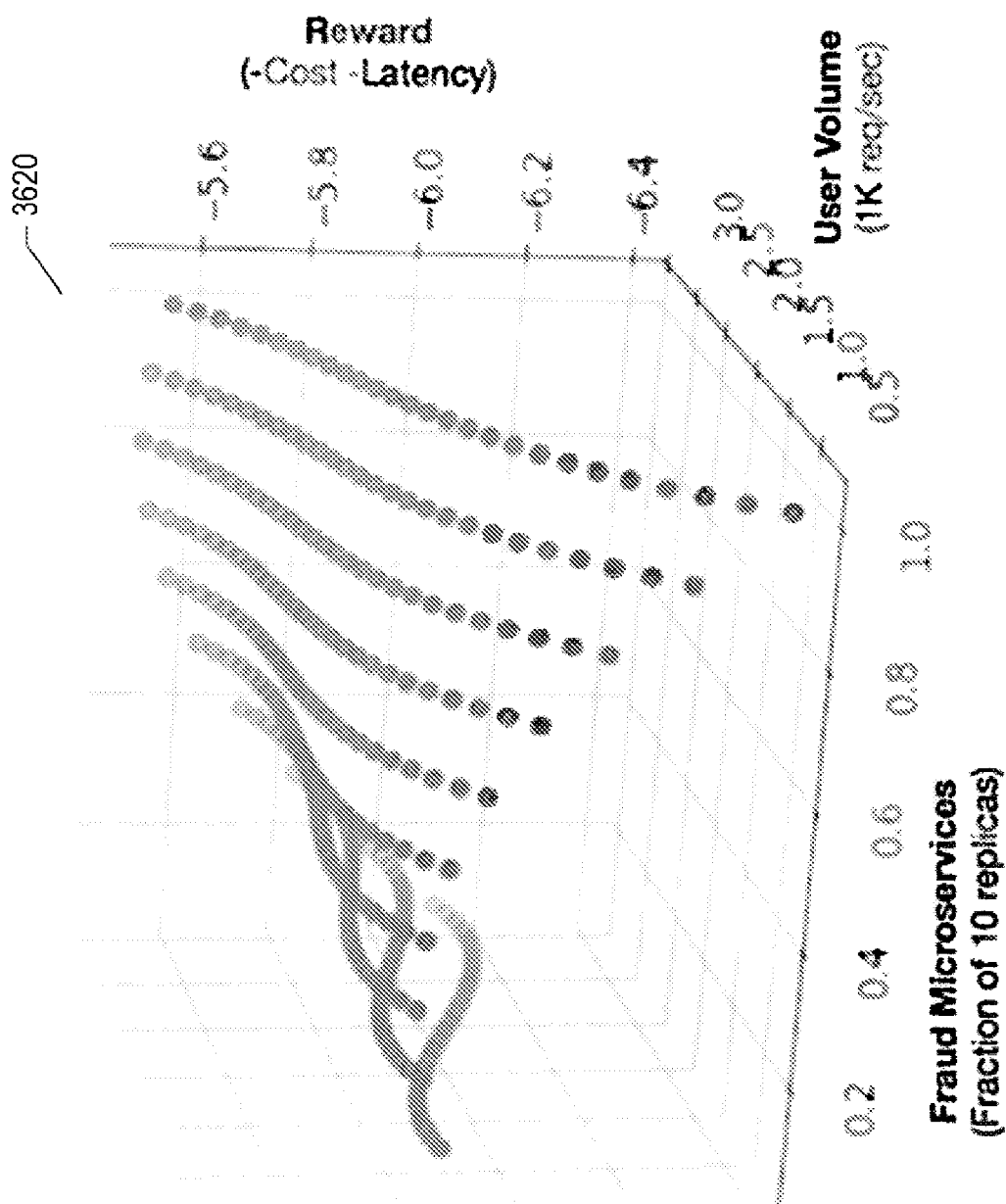

FIGS. 36A-B illustrate one simulator-monitoring facility provided by the management interface provided by the simulation manager, discussed above with reference to FIG. 35. In many machine-learning-based simulators, very little feedback is provided to users of the simulators with regard to their level of training and accuracy of simulation. At best, one or more numeric metrics, such as an average difference metric computed for differences between data-provided values and corresponding estimated values produced by the simulator. Such metric values often provide little useful information to those contemplating use of simulators for training other systems, such as automated reinforcement-learning-based application managers.

According to the currently disclosed methods and systems, the management interface provided by the simulation manager allows users to assess the level of training and quality of simulators based on visual representations of the reward surface. As shown in FIG. 36A, in one implementation, the reward-surface-visualization interface 3602 provides a list of simulators 3604 from which a user can select a particular simulator, a list of state-vector metrics 3606, along with associated tags and other information 3608, and a reward-surface viewing window 3610. When a particular simulator is chosen from the list of simulators, by mouse-click input or by other user input, a user can select two metrics from the state vector 3606, again by mouse click or other user input, for the x 3612 and y 3614 dimensions, or axes, of a three-dimensional representation of the reward surface, with the reward value plotted with respect to the z axis 3616. To facilitate selection of metrics, the state-vector metrics may be filtered 3618 according to tag values or other information. The metric-associated tags 3608 may indicate various different types of metrics, such as metrics whose values can be directly controlled by actions and metrics whose values are outside of automated-reinforcement-learning-based-application-manager control. The three-dimensional visualization indicates, to a user, how the reward computed for a particular state vector varies with respect to the selected metrics. The smoothness of the surface, for example, may be indicative of how well the parameters used for modeling the reward function fit the data. A rough surface, for example, may indicate a greater than desired sensitivity to noise in the data. The reward service may also indicate a disparity between problem-domain-based understanding of how the reward ought to depend on the values of the selected metrics versus how the estimated rewards generated by the simulator depend on close metrics. Visualization of reward surfaces is but one example of the types of visualization of the simulator-produced results that may be viewed by the users of the management interface provided by the simulation manager.

FIG. 36B shows a three-dimensional plot of a reward surface 3620 produced by one implementation of the visualization interface provided as part of the management interface provided by the simulation manager. In this example, the reward function has been plotted, with respect to the z axis, where the horizontal axes represent the number of fraud-micro-service replicas and the user volume. In this case, the peak reward with respect to the number of fraud-micro-service replicas varies depending on the user volume. In addition, the reward surface is smooth. These facts, easily and intuitively acquired from the visualization, may support user confidence in the level of training embodied in the simulator.

FIGS. 37A-E illustrate user input to simulator generation and configuration facilitated by the simulation manger according to the currently disclosed systems and methods. In traditional simulators used for training machine-learning-based entities, there is little support for user input with respect to configuring the machine-learning models incorporated into the simulators. However, users may possess a great deal of problem-domain knowledge that, if incorporated into simulator configuration, could significantly decrease training times and the computational overheads associated with training simulators. According to the currently disclosed methods and systems, the management interface provided by the simulation manager includes a variety of different simulator-configuration-input facilities to allow human experts to configure and tune simulated configurations according to domain knowledge acquired by the human experts. Of course, the types of simulator-configuration-input facilities depend on the types of simulators and machine-learning models incorporated within the simulators. In the following discussion, a simulator intended for training automated reinforcement-learning-based application managers is assumed, and it is further assumed that the simulator employs the machine-learning models discussed above with reference to FIGS. 32-33.

Figure 37A:
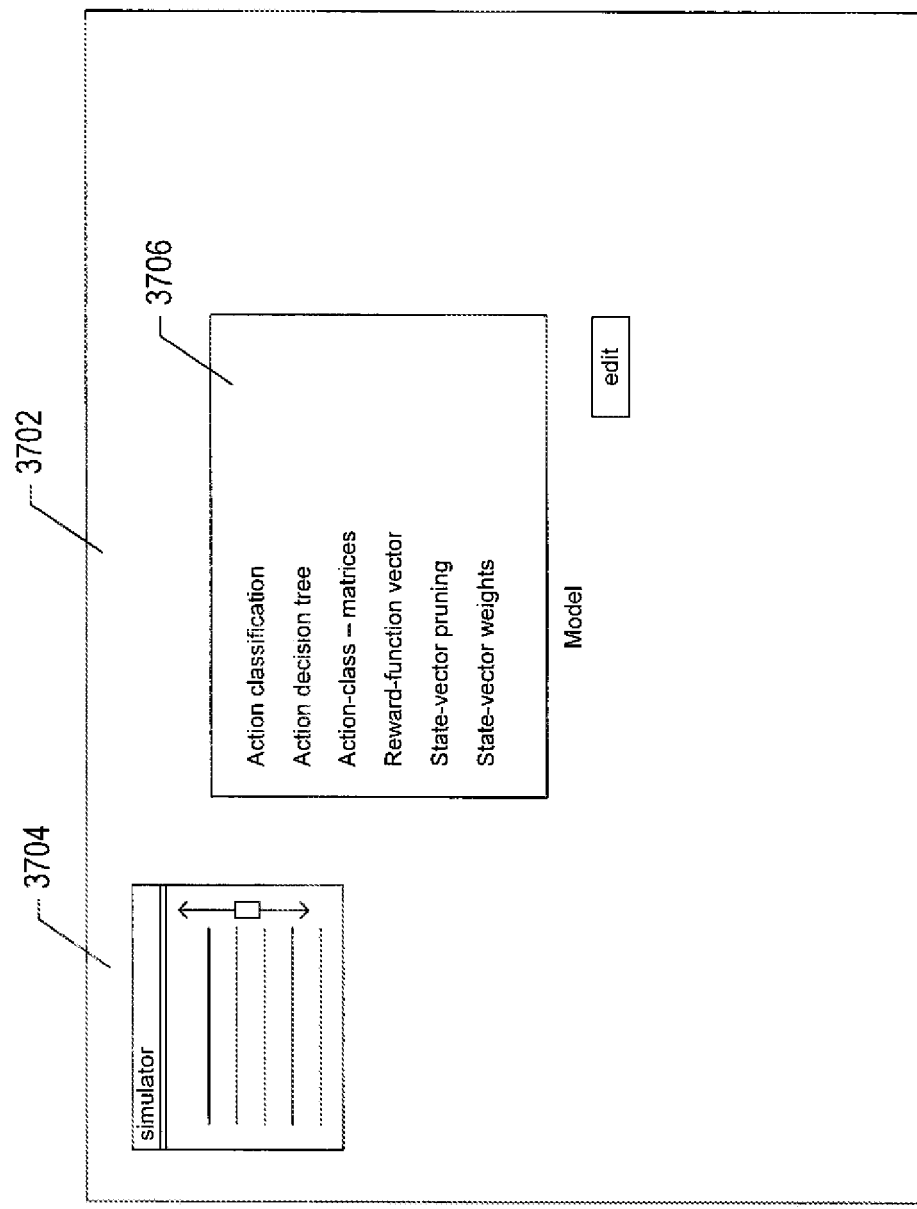
FIGS. 37A-E illustrate user input to simulator generation and configuration facilitated by the simulation manger according to the currently disclosed systems and methods.
Figure 37B:
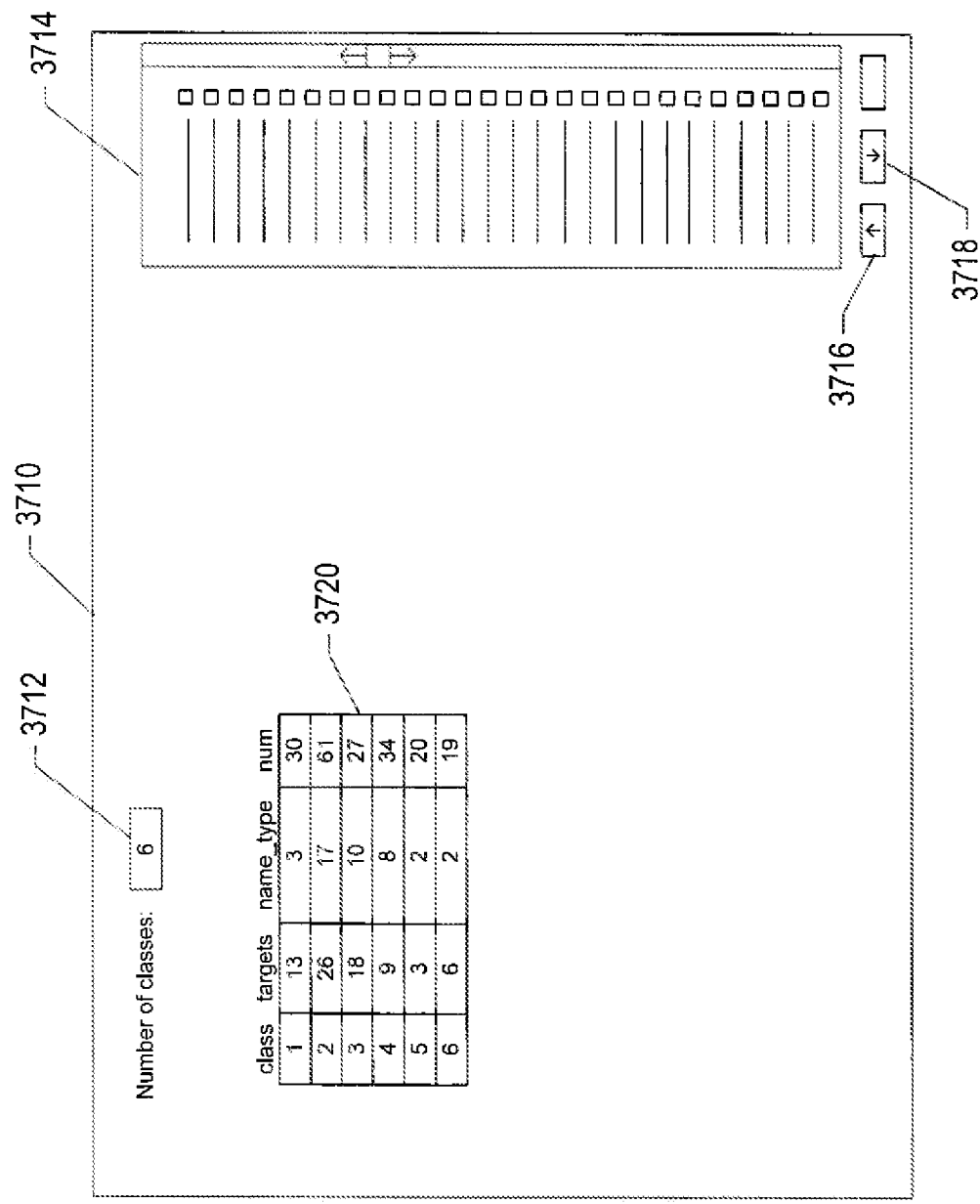

FIG. 37A shows an initial simulator-configuration-input page. The initial page 3702 allows a user to select a simulator from a list of simulators 3704 and to select a particular model feature from a list of model features 3706 for configuration or tuning. As an example of a simulator-configuration-input page to which a user may navigate from the initial page, the simulator-configuration-input page 3710 shown in FIG. 37B allows a human domain expert to place particular actions into action subsets in accordance with the action-classification model discussed above with reference to FIG. 32. A user can choose the number of action subsets 3712 and assign actions in a scrollable list of actions 3714 to specific action subsets by selecting the action and incrementing or decrementing a numerical indication of the action subset to which the action belongs using input features 3716 and 3718. The simulator-configuration-input page displays information about the numbers and types of actions in each of the classes 3720. The simulator-configuration-input page can be used to initially assigned only a small portion of the actions to classes, and the remaining assignments may be learned during training of the simulator. However, even when only a small portion of initial assignments are made by a human domain expert, the initial selections may vastly decrease the learning time needed by the simulator to classify the remaining actions and discover additional model parameters.

Figure 37C:
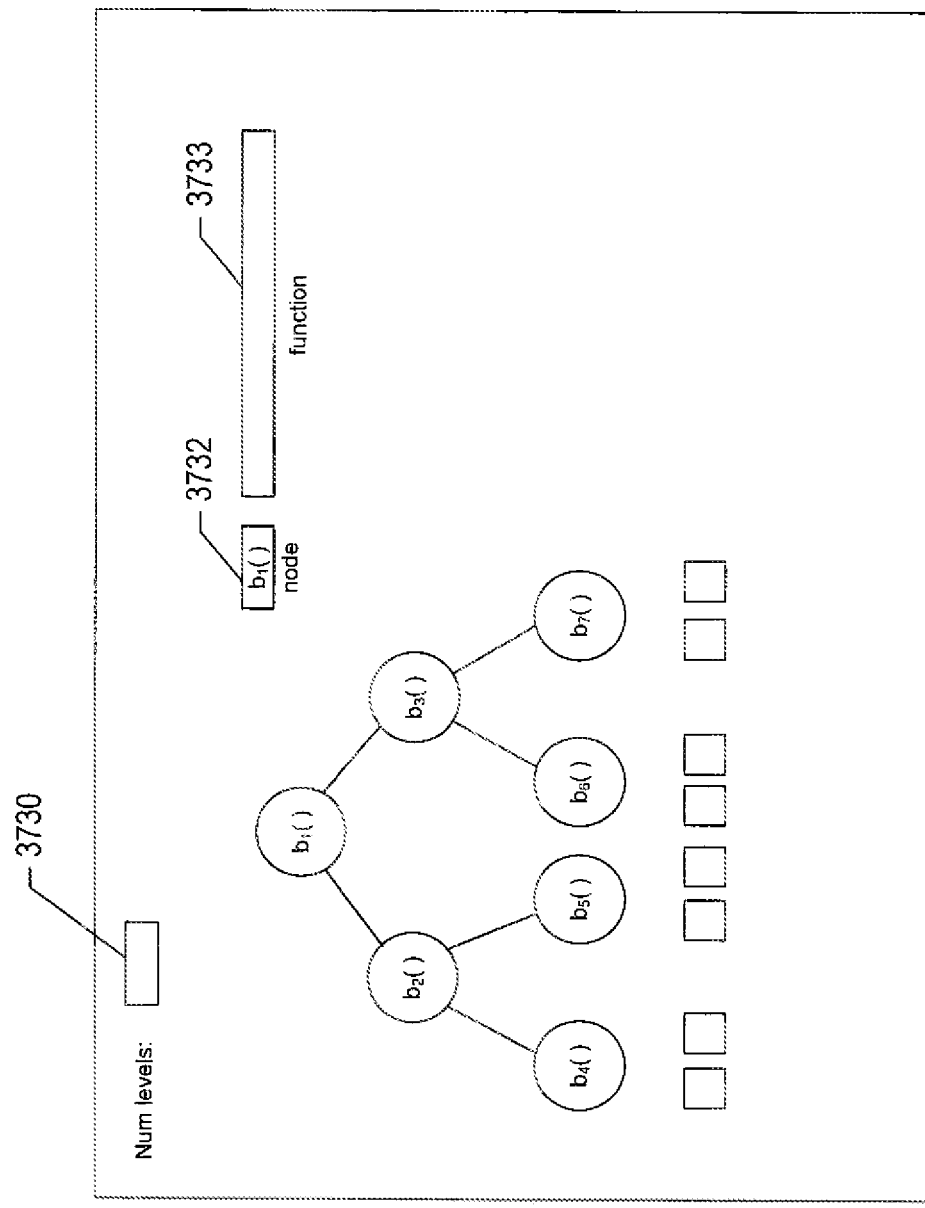
Figure 37D:
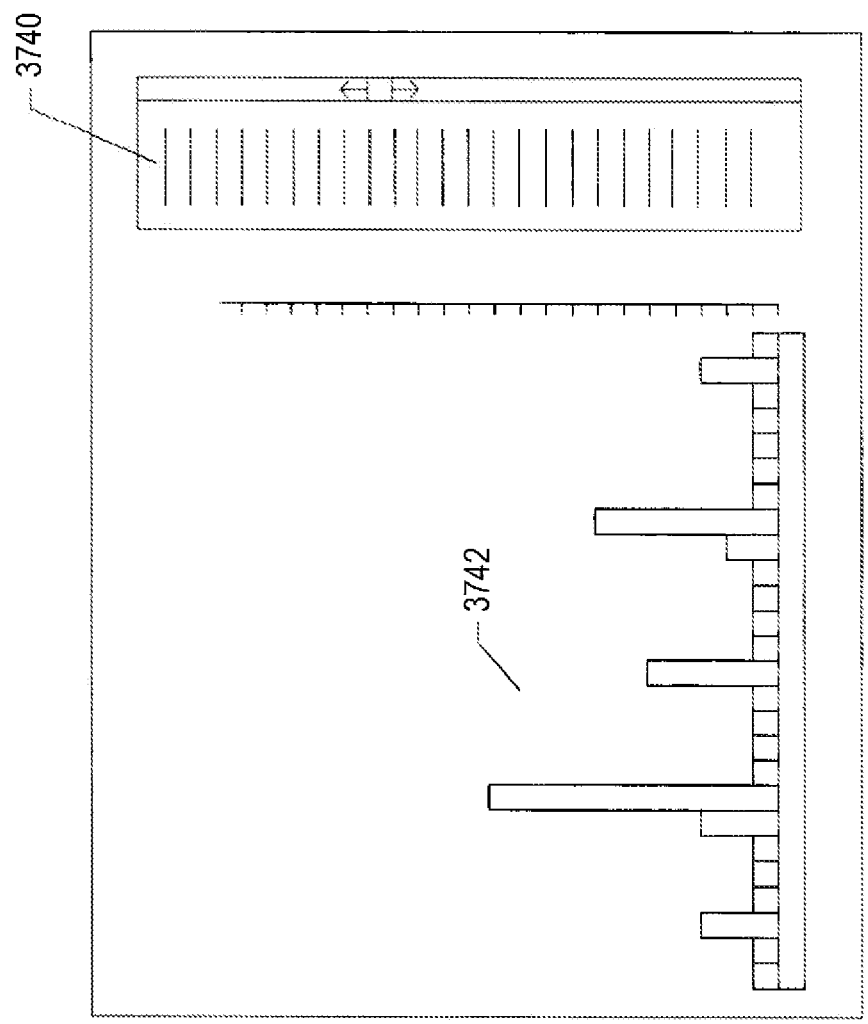
Figure 37E:
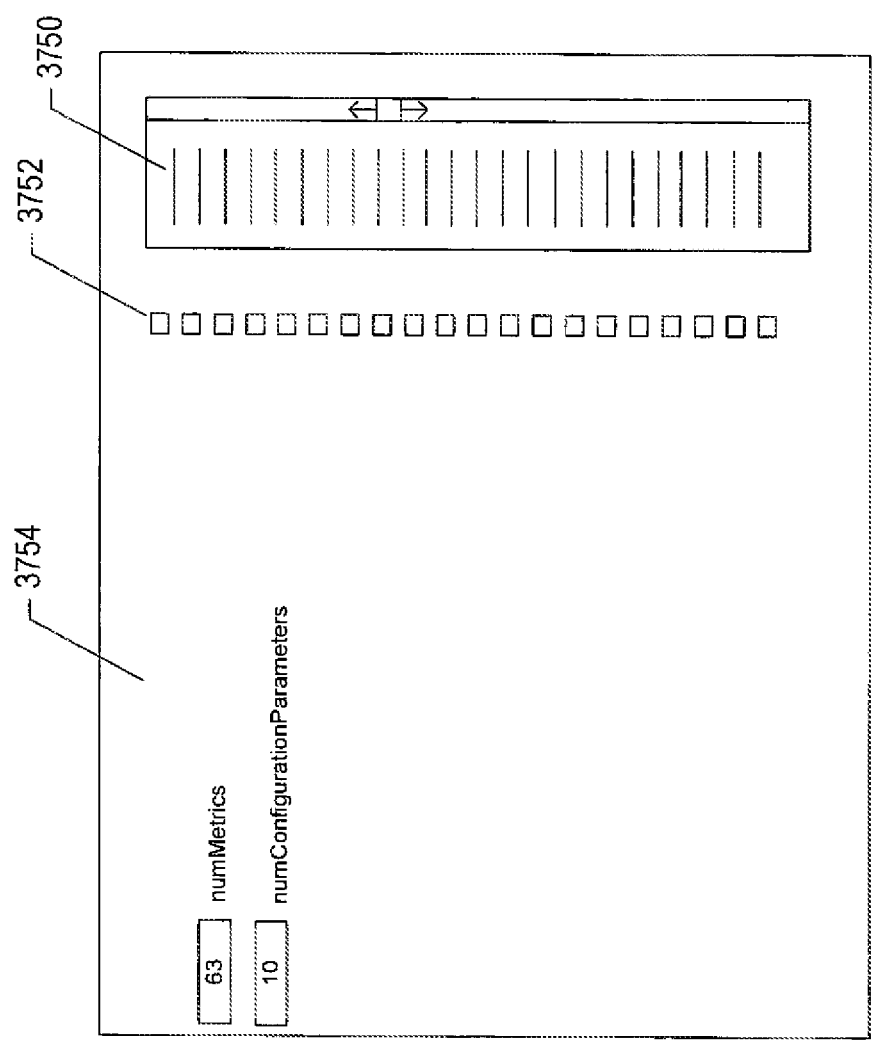

As another example of simulator-configuration-input pages, FIG. 37C shows a simulator-configuration-input page that allows a human domain expert to configure the decision tree (3210 in FIG. 32) used for action classification. The human domain expert can select the number of levels in the decision tree 3730 and can even specify one or more of the Boolean functions associated with one or more of the decision-tree nodes 3732-3733. Again, the user is not required to specify all of the Boolean functions, but even specifying one or two the Boolean functions for the highest-level nodes may vastly simplify decision-tree construction by learning during simulator training. As yet another example of simulator-configuration-input pages, FIG. 37D shows a simulator-configuration-input page that allows a human domain expert to provide indications of the relative magnitudes of the elements in the reward-function vector R, discussed above with reference to FIG. 33. The user can scroll through the elements of the state vector 3740. The current relative magnitudes of the reward-function vector elements corresponding to the displayed state-vector elements are displayed in histogram fashion 3742, and can by altered by user input. The human domain expert can thus initialize all or a portion of the elements of the reward-function vector R, which can significantly decrease the computational overhead during training of the simulator. As a final example of simulator-configuration-input pages, FIG. 37E shows a simulator-configuration-input page that allows a human domain expert to prune the state vector in order to decrease the dimensionality of the simulator and correspondingly decrease the computational complexity involved in training the simulator. The simulator-configuration-input page provides a scrollable list of state-vector elements 3750 which the user can select for removal by toggling associated tags 3752. The simulator-configuration-input page displays a continuously updated indication of the number of metrics and the number of configuration parameters currently included in the state vector 3754. The example simulator-configuration-input pages shown in FIGS. 37B-E are provided to indicate the potential range of human domain-expert inputs that can be provided by human domain experts through the management interface provided by the simulation manager according to the currently disclosed systems and methods. By allowing human domain experts to provide a partial initial machine-learning-model configuration for the simulator, the human domain experts can initially position the simulator at a favorable position in a learning trajectory in order to steer simulator training towards a desirable outcome.

Although the present invention has been described in terms of particular embodiments, it is not intended that the invention be limited to these embodiments. Modification within the spirit of the invention will be apparent to those skilled in the art. For example, any of a variety of different implementations of the currently disclosed reinforcement-learning-based application manager that uses local agents can be obtained by varying any of many different design and implementation parameters, including modular organization, programming language, underlying operating system, control structures, data structures, and other such design and implementation parameters. As discussed above, many different implementations and variations in addition to the implementations discussed above are possible both for adversarial training of automated reinforcement-learning-based application managers.

It is appreciated that the previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A simulation manager that generates and trains simulators that are used to train automated reinforcement-learning-based application managers, the simulation manager comprising:
one or more computer systems, each having one or more processors, one or more memories, one or more data-storage devices, and one or more communications subsystems; and
processor instructions, stored in one or more of the one or more memories and one or more data-storage devices that, when executed by one or more of the processors, control the one or more computer systems to
generate simulators that train automated reinforcement-learning-based application managers;
train the generated simulators to simulate a computing environment controlled by an automated reinforcement-learning-based application manager; and
provide a management interface to human domain experts for providing simulator-configuration input.

2. The simulation manager of claim 1 wherein the simulator repeatedly receives a next action a and returns, in response, a next state s' and a reward r.

3. The simulation manager of claim 2 wherein the simulator implements a first parametrized function that receives a current state s and a next action a and returns the next state s' and a second parametrized function that receives a state s and returns a reward r.

4. The simulation manager of claim 3 wherein the simulation manager generates a simulator by:
choosing one or more machine-learning models to implement the first parametrized function and the second parameterized function; and
initializes the machine-learning models.

5. The simulation manager of claim 3 wherein the simulation manager trains the generated simulators to simulate a computing environment controlled by an automated reinforcement-learning-based application manager by:
receiving data collected from a computing environment controlled by an automated reinforcement-learning-based application manager, the data including action/current-state/next-state triples; and
iteratively selecting a next action/current-state/next-state triple,
inputting the action to the simulator,
receiving an estimated next state and estimated reward from the simulator,
computing a difference metric from the current state and next state,
feeding the difference metric, action, and current state to the simulator,
which adjusts one or more parameters of the first parametrized function to improve estimation of the next state.

6. The simulation manager of claim 5
wherein the current state and the next state are vectors containing metric and configuration elements; and
wherein the distance metric is computed as the sum of terms, each term i comprising the product of a weight $w_i$ and the squared difference of the $i^{th}$ elements of the current state and next state.

7. The simulation manager of claim 6 wherein the weight $w_i$, is the absolute value of the $i^{th}$ element of a reward-function vector, where the second parameterized function uses a dot product of the reward-function vector and a state vector to estimate the reward r corresponding to the state.

8. The simulation manager of claim 5 wherein the simulator learns the parameter values for the second parameterized function during training by optimizing the second parameterized function to produce rewards that would produce the action/current-state/next-state triples of the data collected from the computing environment controlled by the automated reinforcement-learning-based application manager.

9. The simulation manager of claim 5
wherein the data collected from the computing environment controlled by the automated reinforcement-learning-based application manager includes rewards corresponding to the action/current-state/next-state triples; and
wherein the simulator adjusts one or more parameters of the second parameterized function in response to computed differences between the data rewards and corresponding estimated rewards.

10. The simulation manager of claim 4 wherein the management interface provides, for one or more of the machine-learning models used to implement the first and second parameterized functions, simulator-configuration-input features through which machine-learning model parameters can be specified.

11. The simulation manager of claim 10 wherein model parameters may include;
the number of layers in a neural network or decision tree;
functions or logic associated with decision-tree nodes;
initial weights of neural-network nodes;
initial values of weights that multiple terms of linear combinations of terms;
the size and contents of state vectors; and
the number and contents of classifications.

12. The simulation manager of claim 4 wherein the management interface provides a visualization feature that displays the reward surface for two selected elements of the state vector.

13. A method for training an automated reinforcement-learning-based application manager, the method comprising:
generating a simulator;
training the generated simulator to simulate a computing environment controlled by an automated reinforcement-learning-based application manager; and
connecting the automated reinforcement-learning-based application manager to the simulator.

14. The method of claim 13 wherein the simulator repeatedly receives a next action a from the automated reinforcement-learning-based application manager and returns, in response, a next state s' and a reward r to the automated reinforcement-learning-based application manager.

15. The method of claim 14 wherein the simulator implements a first parametrized function that receives a current state s and a next action a and returns the next state s' and a second parametrized function that receives a states and returns a reward r, both the first and second parametrized functions implemented by more machine-learning models.

16. The method of claim 14 wherein training the generated simulator to simulate a computing environment controlled by an automated reinforcement-learning-based application manager further comprises:

receiving data collected from a computing environment controlled by an automated reinforcement-learning-based application manager, the data including action/current-state/next-state triples; and iteratively selecting a next action/current-state/next-state triple, inputting the action to the simulator, receiving an estimated next state and estimated reward from the simulator, computing a difference metric from the current state and next state, feeding the difference metric, action, and current state to the simulator, which adjusts one or more parameters of the first parametrized function to improve estimation of the next state.

17. The method of claim 16 wherein the current state and the next state are vectors containing metric and configuration elements; and wherein the distance metric is computed as the sum of terms, each term i comprising the product of a weight $w_i$ and the squared difference of the $i^{th}$ elements of the current state and next state.

18. The method of claim 17 wherein the weight $w_i$ is the absolute value of the $i^{th}$ element of a reward-function vector, where the second parameterized function uses a dot product of the reward-function vector and a state vector to estimate the reward r corresponding to the state.

19. The method of claim 16 wherein the simulator learns the parameter values for the second parameterized function during training by optimizing the second parameterized function to produce rewards that would produce the action/current-state/next-state triples of the data collected from the computing environment controlled by the automated reinforcement-learning-based application manager.

20. A physical data-storage device encoded with computer instructions that, when executed by one or more processors of a computer system that implements a simulation manager having one or more processors, one or more memories, one or more data-storage devices, and one or more communications subsystems, controls the simulation manager to:

generate simulators for training train automated reinforcement-learning-based application managers;

train the generated simulators to simulate a computing environment controlled by an automated reinforcement-learning-based application manager; and provide a management interface to human domain experts for providing simulator-configuration input.

* * * * *